United States Patent
Shin et al.

(10) Patent No.: US 8,575,680 B2
(45) Date of Patent: Nov. 5, 2013

(54) SEMICONDUCTOR DEVICE HAVING AIR GAP AND METHOD OF FABRICATING THE SAME

(75) Inventors: Yoo-Cheol Shin, Hwaseong-si (KR); Joon-Hee Lee, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/564,117

(22) Filed: Aug. 1, 2012

(65) Prior Publication Data

US 2013/0032871 A1 Feb. 7, 2013

(30) Foreign Application Priority Data

Aug. 2, 2011 (KR) .................. 10-2011-0077018

(51) Int. Cl.
*H01L 29/788* (2006.01)

(52) U.S. Cl.
USPC ........ 257/316; 257/315; 257/321; 257/E29.3; 257/E29.304

(58) Field of Classification Search
USPC .............. 257/315, 316, 321, E29.3, E29.304
See application file for complete search history.

(56) References Cited

U.S. PATENT DOCUMENTS

| | | | |
|---|---|---|---|
| 7,682,904 B2 | 3/2010 | Kim et al. | |
| 7,811,896 B2 | 10/2010 | Gogoi | |
| 8,022,464 B2 | 9/2011 | Sato et al. | |
| 8,158,479 B2 | 4/2012 | Sato et al. | |
| 2008/0283898 A1* | 11/2008 | Kuniya | 257/316 |
| 2011/0309430 A1* | 12/2011 | Purayath et al. | 257/321 |
| 2012/0007165 A1* | 1/2012 | Lee et al. | 257/316 |
| 2012/0037975 A1* | 2/2012 | Cho et al. | 257/321 |
| 2012/0052676 A1* | 3/2012 | Lee et al. | 438/594 |
| 2012/0280300 A1* | 11/2012 | Kim et al. | 257/315 |

FOREIGN PATENT DOCUMENTS

| | | |
|---|---|---|
| JP | 11-243142 | 9/1999 |
| JP | 2009-267208 | 11/2009 |
| JP | 2010-027922 | 2/2010 |
| KR | 10-2004-0049885 A | 6/2004 |
| KR | 10-2006-0130297 A | 12/2006 |
| KR | 10-2009-0008582 A | 1/2009 |
| KR | 10-2009-0095392 A | 9/2009 |
| KR | 10-2009-0130682 A | 12/2009 |

* cited by examiner

*Primary Examiner* — Victor A Mandala
(74) *Attorney, Agent, or Firm* — Lee & Morse, P.C.

(57) ABSTRACT

A semiconductor device includes tunneling insulating layers on active regions of a substrate, floating gate electrodes on the tunneling insulating layers, an isolation trench within the substrate and the isolation trench defines the active region, spaces the tunneling insulating layers, and isolates the floating gate electrodes. A bottom of the isolation trench is directly in contact with the substrate. The semiconductor device further includes a lower insulating layer on the floating gate electrodes, and a middle insulating layer, an upper insulating layer, and a control gate electrode stacked on the lower insulating layer. The lower insulating layer is configured to hermetically seal a top portion of the isolation trench to define and directly abut an air gap within the isolation trench.

20 Claims, 49 Drawing Sheets

SEMICONDUCTOR DEVICE HAVING AIR GAP AND METHOD OF FABRICATING THE SAME

CROSS-REFERENCE TO RELATED APPLICATION

Korean Patent Application No. 10-2011-0077018 filed on Aug. 2, 2011, in the Korean Intellectual Property Office, and entitled: "Semiconductor Device Having Air Gap and Method of Fabricating the Same," is incorporated by reference in its entirety.

BACKGROUND

The demand for techniques associated with mobile devices, e.g., semiconductor techniques capable of reducing power consumption, has gradually increased. To reduce power consumption, semiconductor techniques for increasing an operating speed at a low voltage and/or improving a data retention characteristic have been considered.

SUMMARY

Embodiments may be realized by providing a semiconductor device that includes tunneling insulating layers on active regions of a substrate, floating gate electrodes on the tunneling insulating layers, an isolation trench within the substrate. The isolation trench defines the active regions, spaces the tunneling insulating layers, and isolates the floating gate electrodes. The semiconductor device further includes a lower insulating layer on the floating gate electrodes and the lower insulating layer is configured to hermetically seal a top portion of the isolation trench to define an air gap within the isolation trench, and a middle insulating layer, an upper insulating layer, and a control gate electrode stacked on the lower insulating layer.

The lower insulating layer may include a silicon oxide, the middle insulating layer may include a silicon nitride, and the upper insulating layer may include a metal oxide. A dielectric constant of the middle insulating layer may be greater than a dielectric constant of the lower insulating layer. An energy bandgap of the upper insulating layer may be greater than an energy bandgap of the middle insulating layer.

The lower insulating layer may have a first top surface at a first level in a position vertically aligned with the active region and a second top surface at a second level in a position vertically aligned with the isolation trench. The first level may be higher than the second level. The first top surface of the lower insulating layer may be rounded. Top surfaces of the middle insulating layer and the upper insulating layer are rounded in accordance with the top surface of the lower insulating layer. The second top surface of the lower insulating layer may include a dent. The lower insulating layer may have a shape symmetrical to the second top surface in the position vertically aligned with the isolation trench. The lower insulating layer may be on a lateral surface of the active region.

The semiconductor device may include a bottom insulating material on the bottom of the isolation trench, and the bottom insulating material may have a protruding shape. The semiconductor device may include a lining insulating layer on sidewalls of the active regions in the isolation trench. Vertical thickness of the bottom insulating material is thicker than horizontal thickness of the lining insulating layer.

A lateral surface of the tunneling insulating layer and a lower portion of a lateral surface of the floating gate electrode may abut the air gap. The lower insulating layer may be partially formed on an upper portion of the lateral surface of the floating gate electrode.

Embodiments may also be realized by providing a semiconductor device that includes tunneling insulating layers on active regions of a substrate, floating gate electrodes on the tunneling insulating layers, an isolation trench formed within the substrate to define the active regions, space the tunneling insulating layers, and isolate the floating gate electrodes, the isolation trench has an air gap disposed therein, a first insulating layer on lateral surfaces of the floating gate electrodes and the first insulating layer hermetically seals a top portion of the isolation trench to define the air gap, and a second insulating layer, a third insulating layer, and a control gate electrode stacked on the floating gate electrodes and the first insulating layer.

The first insulating layer may have a first thickness in a position adjacent to a sidewall of the isolation trench and may have a second thickness in a position vertically aligned with a center of the isolation trench. The first thickness may be greater than the second thickness.

Embodiments may also be realized by providing a semiconductor device that includes tunneling insulating layers on active regions of a substrate, floating gate electrodes on the tunneling insulating layers, an isolation trench within the substrate and the isolation trench defines the active region, a lower insulating layer on the floating gate electrodes, and a middle insulating layer, an upper insulating layer, a control gate electrode, and a gate capping layer stacked on the lower insulating layer. At least a portion of the lower insulating layer is within the isolation trench and the portion of the lower insulating layer has varying thicknesses within the isolation trench, and the lower insulating layer is configured to hermetically seal the isolation trench to define an air gap under the lower insulating layer within the isolation trench.

A first thickness of the portion of the lower insulating layer adjacent to sidewalls of the isolation trench may be greater than a second thickness of the portion of the lower insulating layer near a center of the isolation trench. The lower insulating layer may be adjacent to opposing lateral sides of the floating gate electrodes.

The semiconductor device may include a bottom insulating material on the bottom of the isolation trench. The air gap may be directly between the bottom insulating material and the lower insulating layer. The semiconductor device may include a tunnel insulating layer between the floating gate electrode and the active region. The air gap may be adjacent to the tunnel insulating layer, and the lower insulating layer and the bottom insulating material may be spaced apart from the tunnel insulating layer.

Embodiments may also be realized by providing a semiconductor device that includes an isolation trench formed within a substrate to define an active region, a tunneling insulating layer stacked on the active region, a floating gate electrode disposed on the tunneling insulating layer, a lower insulating layer disposed on the floating gate electrode and configured to hermetically seal a top portion of the isolation trench and define an air gap within the isolation trench, and a control gate electrode stacked on the lower insulating layer.

The isolation trench may define the tunneling insulating layer and the floating gate electrode. A lateral surface of the tunneling insulating layer and a portion of the floating gate electrode may be exposed to the air gap. The semiconductor device may further include a lining insulating layer formed on an inner wall of the isolation trench.

The semiconductor device may further include a middle insulating layer disposed between the lower insulating layer and the control gate electrode. The middle insulating layer may have a higher dielectric constant than the lower insulating layer. The semiconductor device may further include an upper insulating layer disposed between the middle insulating layer and the control gate electrode.

The upper insulating layer may have a higher energy bandgap than the middle insulating layer. The lower insulating layer may have a first top surface disposed at a relatively high level in a position vertically aligned with the floating gate electrode and a second top surface disposed at a relatively low level in a position vertically aligned with the isolation trench. The first top surface of the lower insulating layer may be rounded. The second top surface of the lower insulating layer may have dents.

The lower insulating layer may have a shape symmetrical to the second top surface in the position vertically aligned with the isolation trench. The semiconductor device may further include a bottom insulating material having a protruding shape formed on bottom of the isolation trench. The lower insulating layer may be further formed on a lateral surface of the floating gate electrode.

Embodiments may also be realized by providing a semiconductor device that includes an isolation trench formed within a substrate to define an active region, the isolation trench having an air gap therein, a tunneling insulating layer stacked on the active region, a floating gate electrode disposed on the tunneling insulating layer, a leading insulating layer disposed on a lateral surface of the floating gate electrode and configured to hermetically seal a top portion of the isolation trench and define the air gap, and a control gate electrode stacked on the leading insulating layer.

Embodiments may also be realized by providing, a semiconductor device that includes an isolation trench formed within a substrate to define an active region, a lower insulating layer disposed on the active region and hermetically seal a top portion of the isolation trench and define an air gap within the isolation trench, and a middle insulating layer, an upper insulating layer, and a gate electrode stacked on the lower insulating layer.

A lateral surface of the active region may be exposed to the air gap. The semiconductor device may further include a lining insulating layer disposed on an inner wall of the isolation trench. The lower insulating layer may include a silicon oxide, the middle insulating layer may include a silicon nitride, and the upper insulating layer may include a metal oxide.

The middle insulating layer may have a higher dielectric constant than the lower insulating layer, and the upper insulating layer may have a higher energy bandgap than the middle insulating layer. The lower insulating layer may have a first top surface disposed at a relatively high level in a position vertically aligned with the active region and a second top surface disposed at a relatively low level in a position vertically aligned with the isolation trench.

The first top surface of the lower insulating layer may be rounded. The second top surface of the lower insulating layer may have dents. The lower insulating layer may have a shape symmetrical to the second top surface in the position vertically aligned with the isolation trench. The semiconductor device may further include a bottom insulating material having a protruding shape on bottom of the isolation trench. The lower insulating layer may be further formed on a lateral surface of the active region.

Embodiments may also be realized by providing a semiconductor device that includes an isolation trench formed within a substrate to define an active region, the isolation trench having an air gap therein, a lower insulating layer disposed on a lateral surface of the active region and configured to hermetically seal a top surface of the isolation trench and define the air gap, and a middle insulating layer, an upper insulating layer, and a gate electrode stacked on the lower insulating layer.

Detailed particulars of other embodiments are included in detailed descriptions and drawings.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
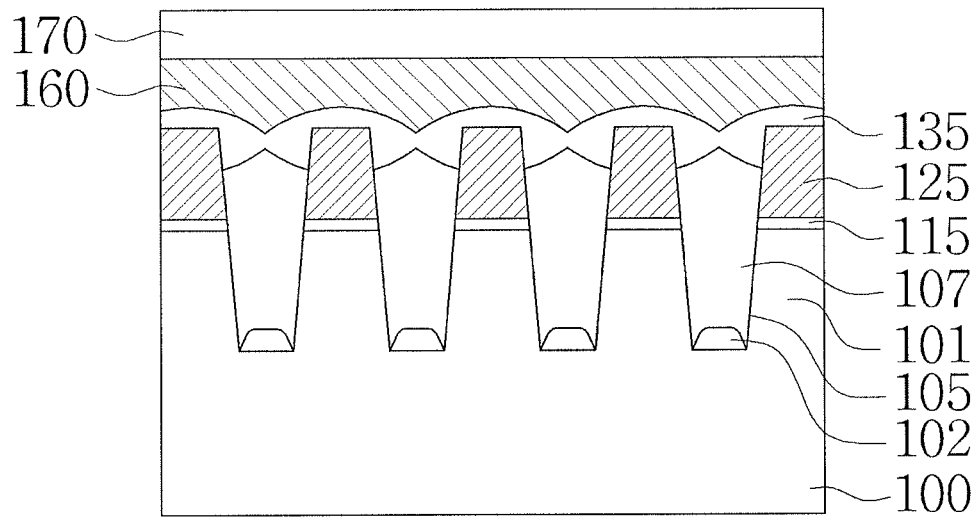
FIGS. 1A to 1R illustrate longitudinal sectional views of semiconductor devices having floating gate electrodes according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, the singular forms "a", "an" and "the" are intended to include the plural forms as well, unless the context clearly indicates otherwise. Furthermore, not only the terms "comprises" and/or "comprising", but also other forms, for example, terms "having", "being formed of", and "being configured/constructed with", are not intended to limit the scope of the embodiments.

Exemplary embodiments are described herein with reference to drawing figures. In the drawing figures, the dimensions of layers and regions may be exaggerated for clarity of illustration. Variations from the shapes of the illustrations in the drawing figures as a result, e.g., of manufacturing techniques and/or tolerances, may be expected. Thus, embodiments should not be construed as limited to the particular shapes of regions illustrated herein but are to include deviations in shapes that result, e.g., from manufacturing. For example, an etched region illustrated as a rectangle may have rounded or curved features. Thus, the regions illustrated in the figures are schematic in nature and their shapes are not intended to limit the scope of the embodiments.

Like numbers refer to like elements throughout. The same or similar numbers may be described with reference to other drawings even if they are neither mentioned nor described in the corresponding drawing. Also, even elements that are not denoted by reference numbers in each drawing figure corresponding to exemplary embodiments may be described with reference to other drawing figures, e.g., in drawing figures of one or more other exemplary embodiments.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present.

It will be understood that when an element or layer is referred to as being "connected to" or "coupled to" another element or layer, it can be directly connected to or coupled to the other element or layer or intervening elements or layers may be present. When an element is referred to as being "directly connected to" or "directly coupled to" another element or layer, there are no intervening elements or layers present. As used herein, the term "and/or" includes any and all combinations of one or more of the associated listed items.

Figure 1B:
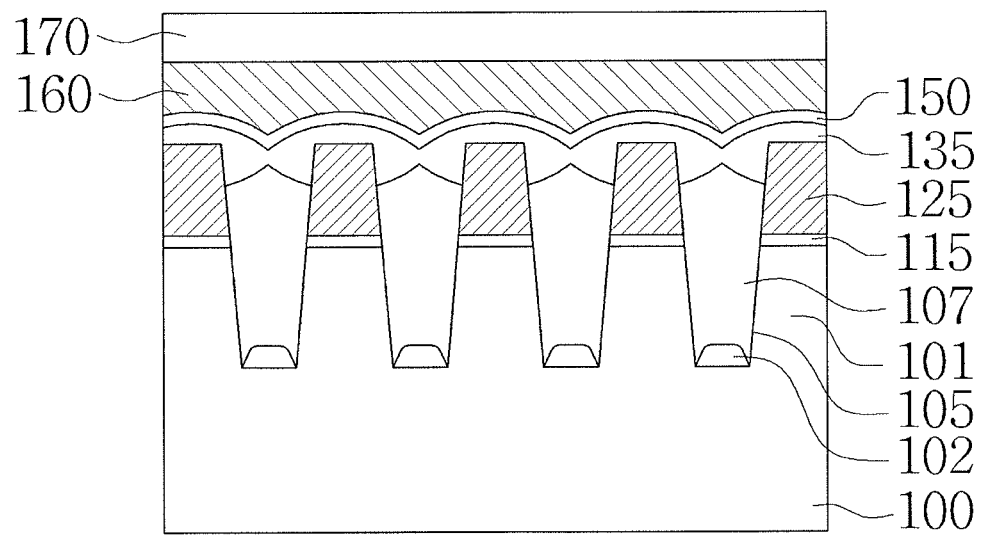
Figure 1C:
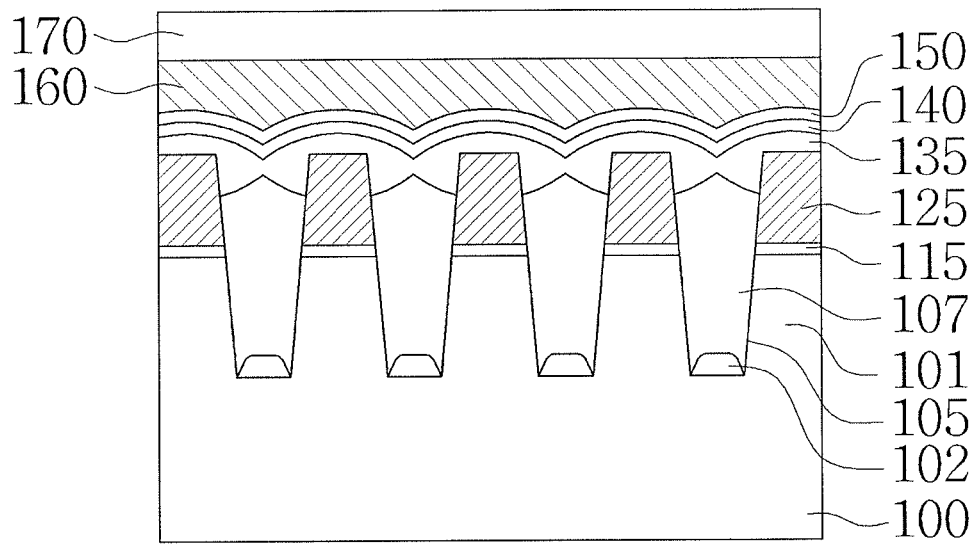
Figure 1D:
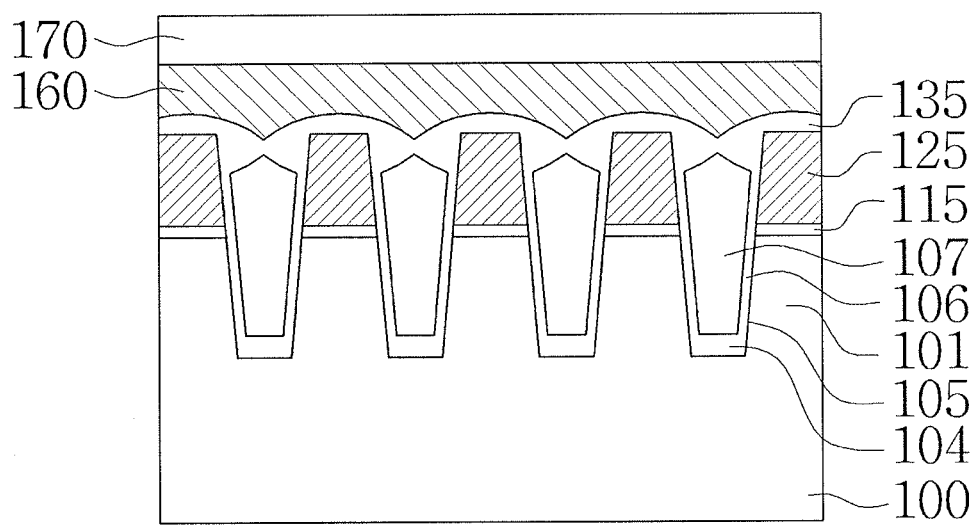
Figure 1E:
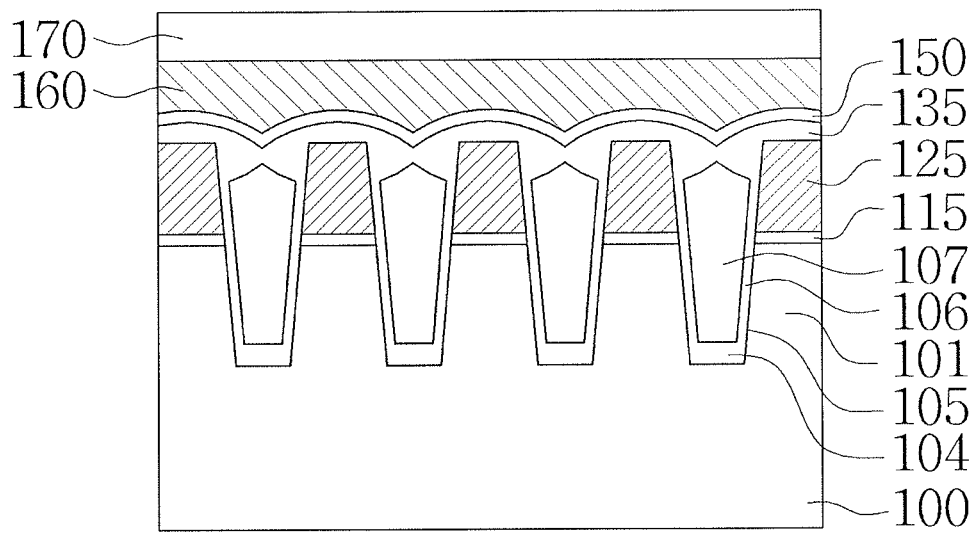
Figure 1F:
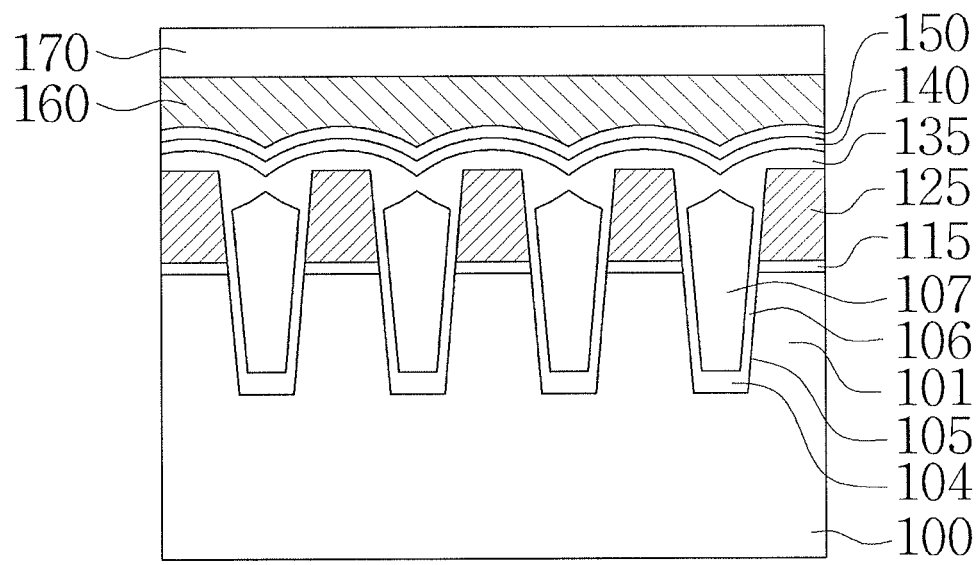
Figure 1G:
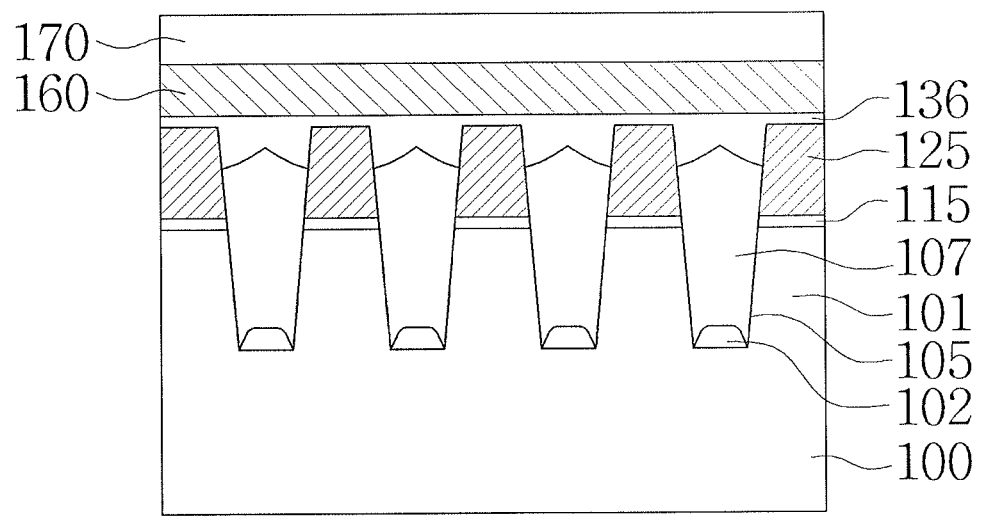
Figure 1H:
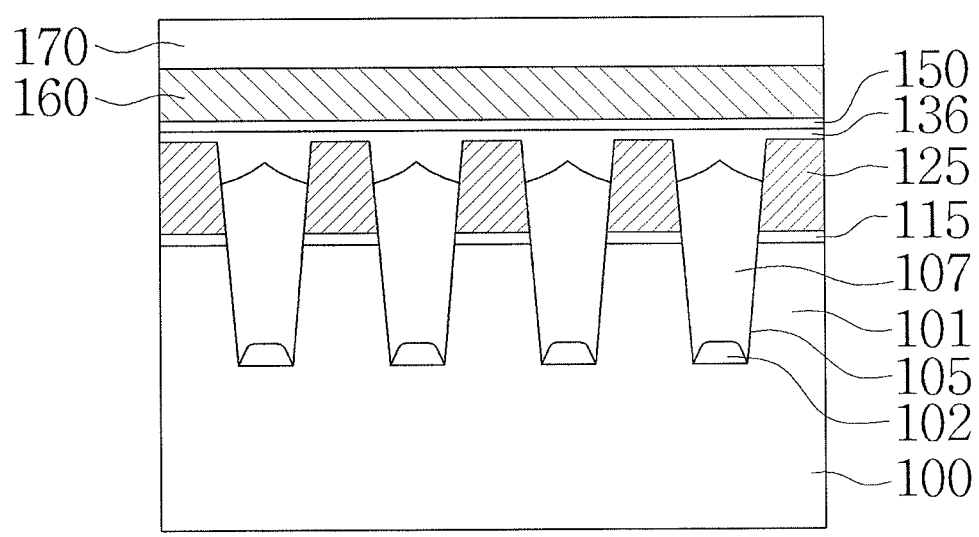
Figure 1I:
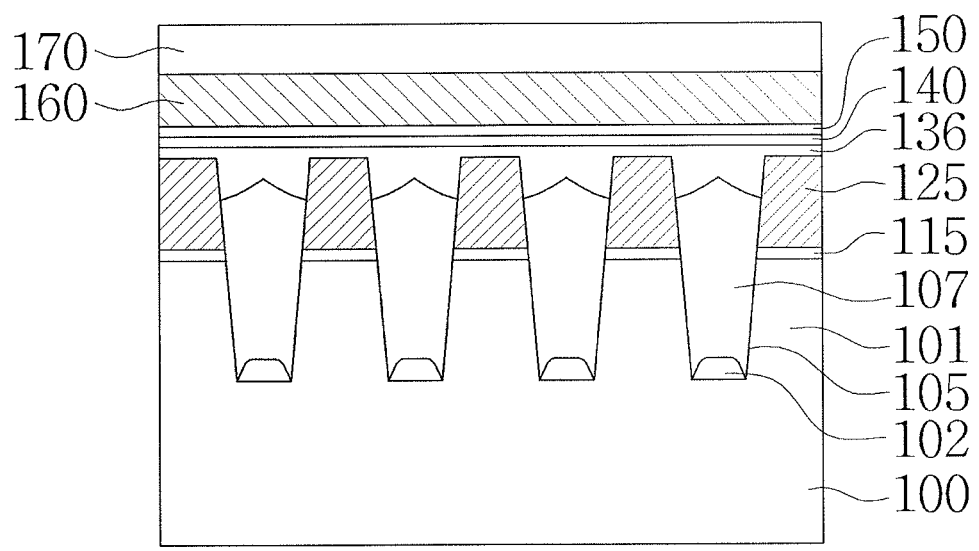
Figure 1J:
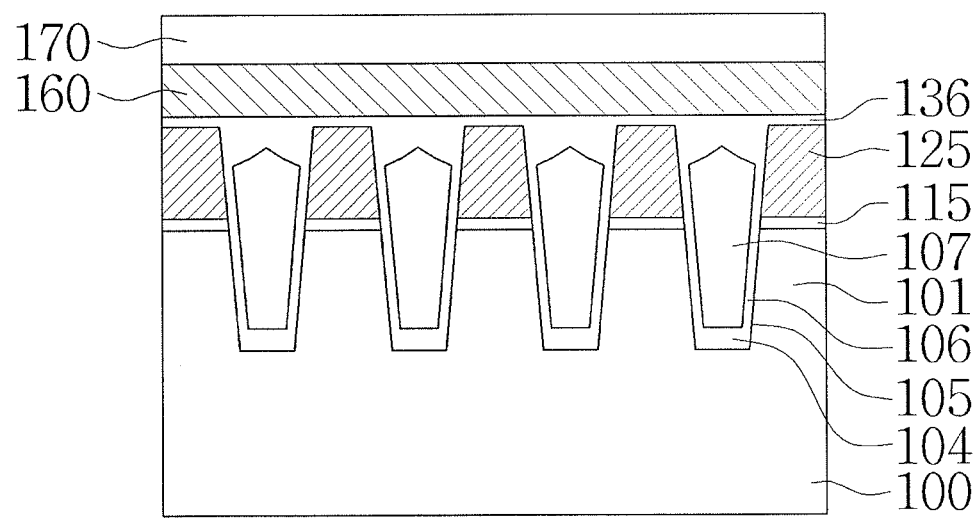
Figure 1K:
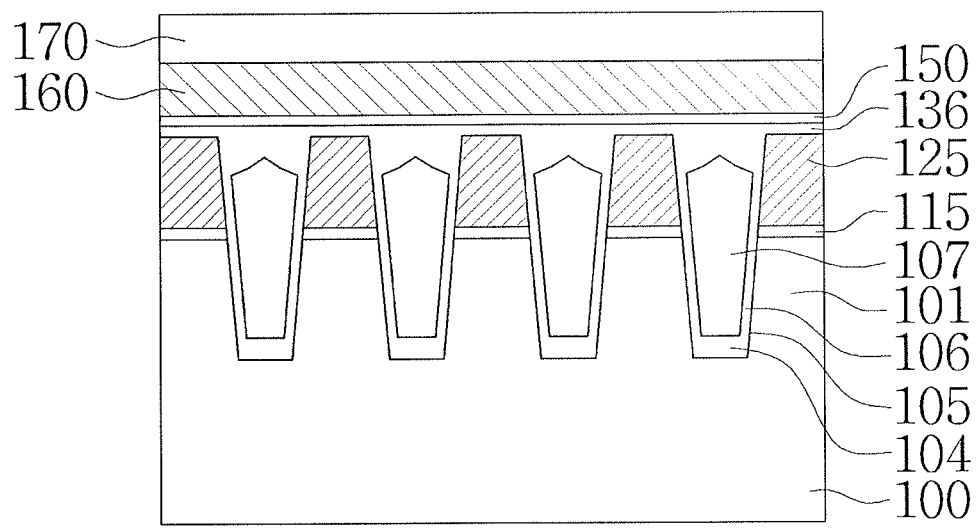
Figure 1L:
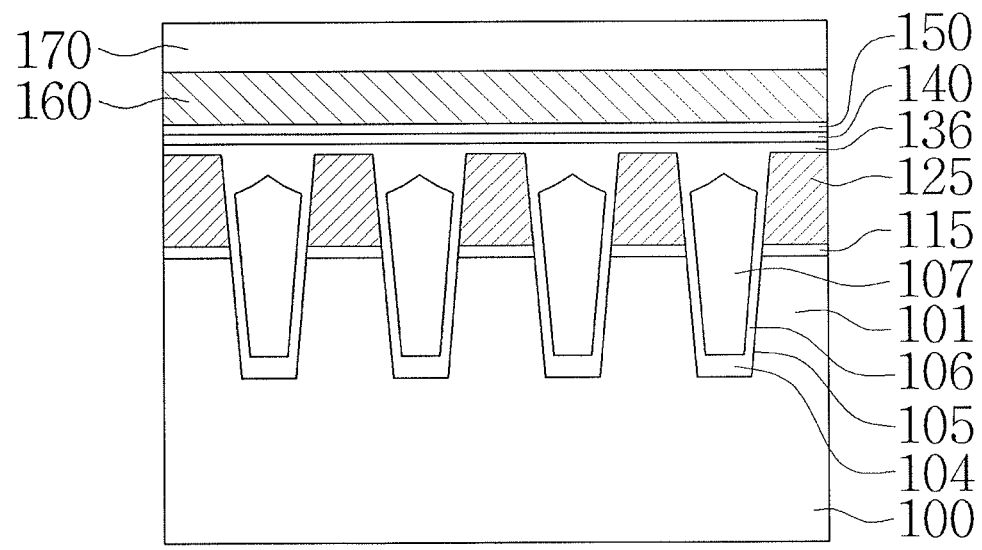
Figure 1M:
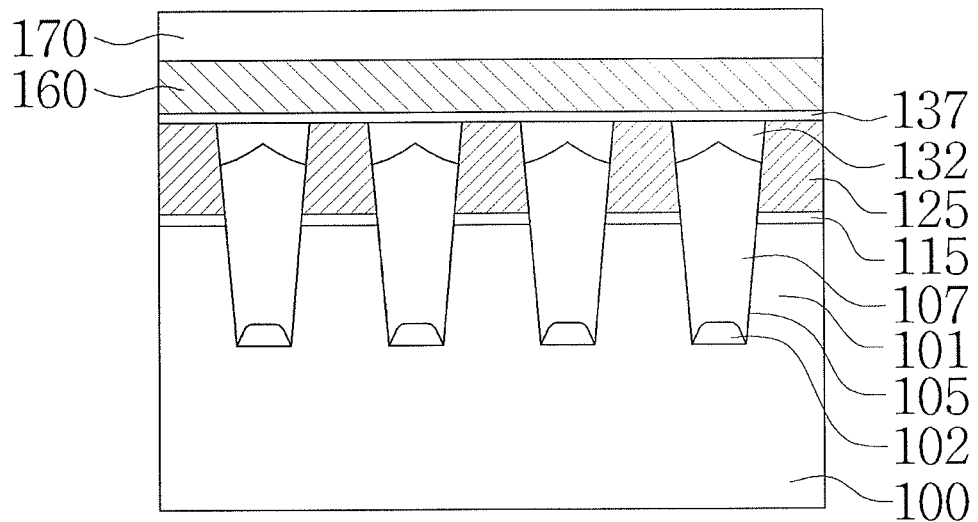
Figure 1N:
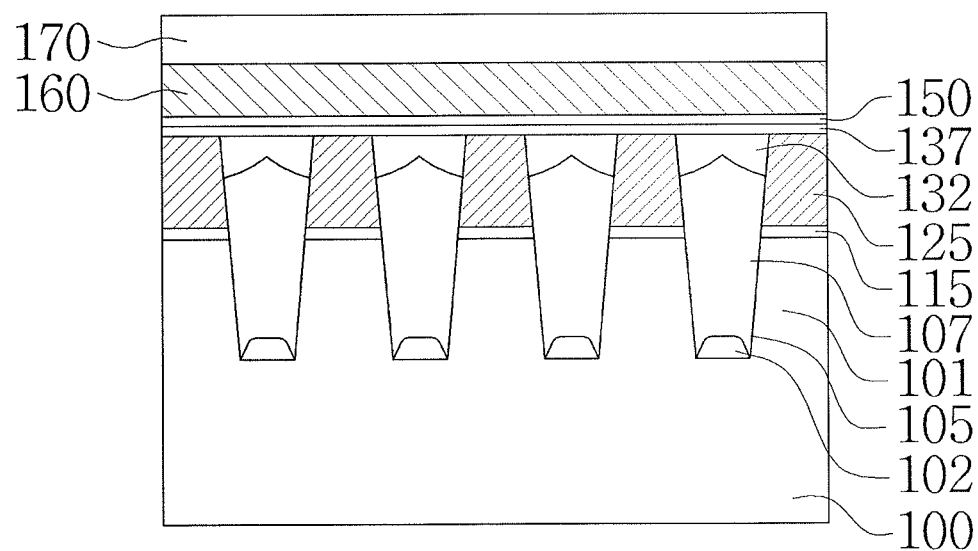
Figure 1O:
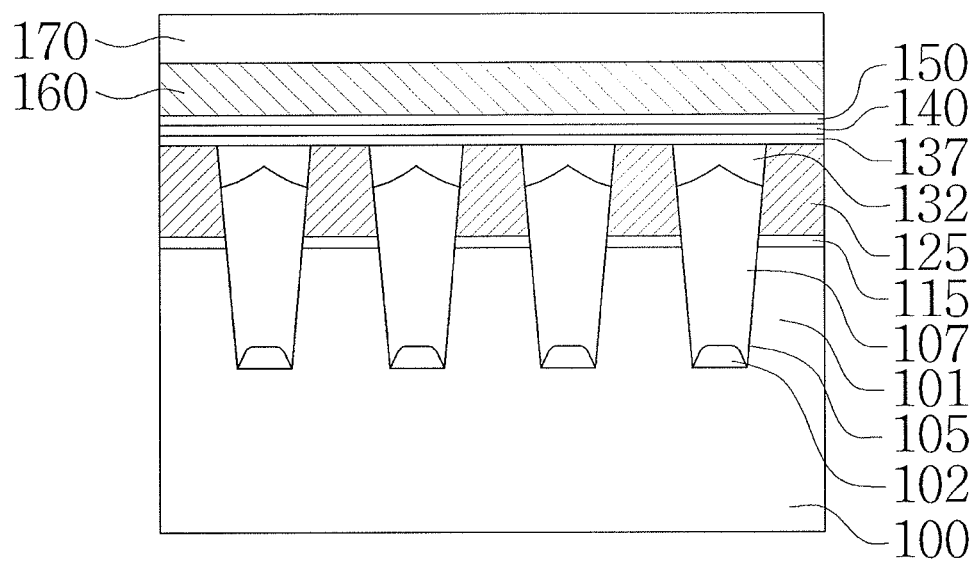
Figure 1P:
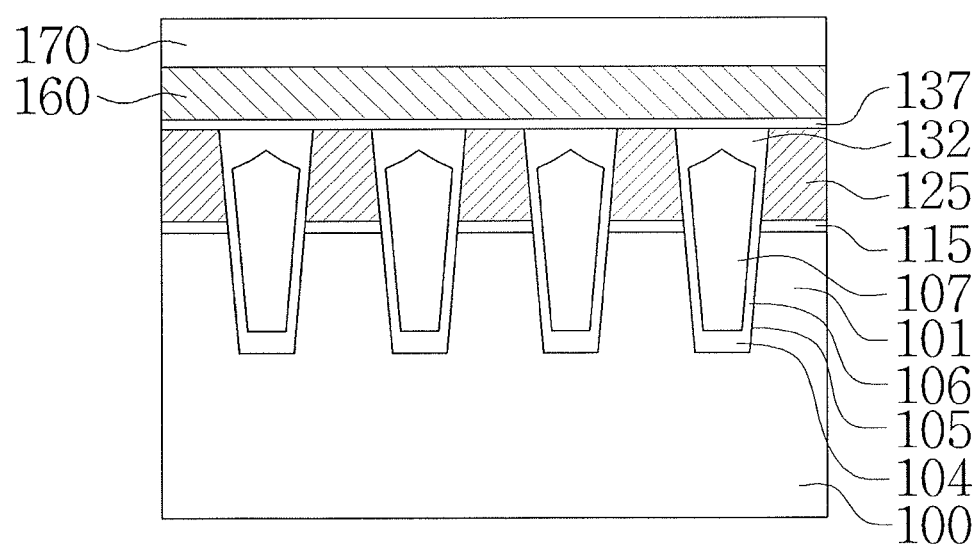
Figure 1Q:
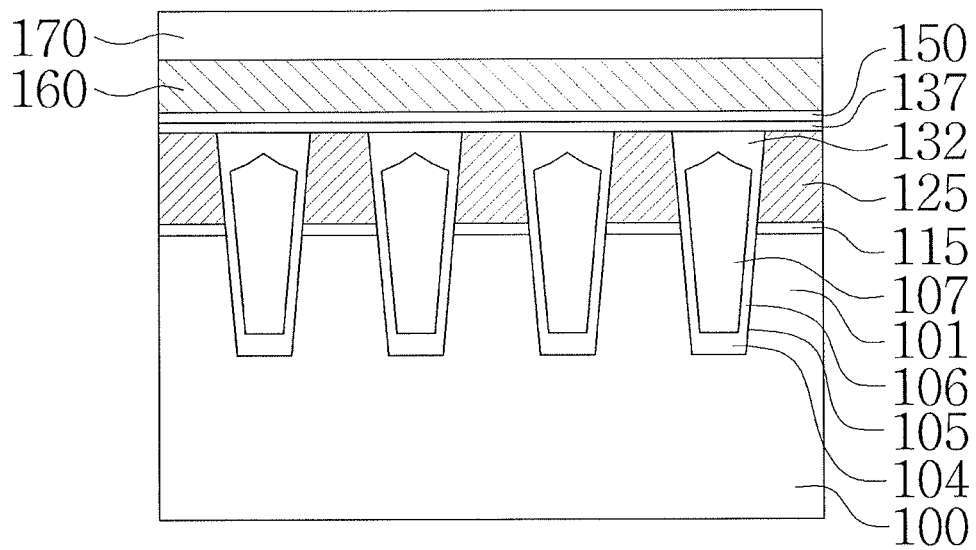
Figure 1R:
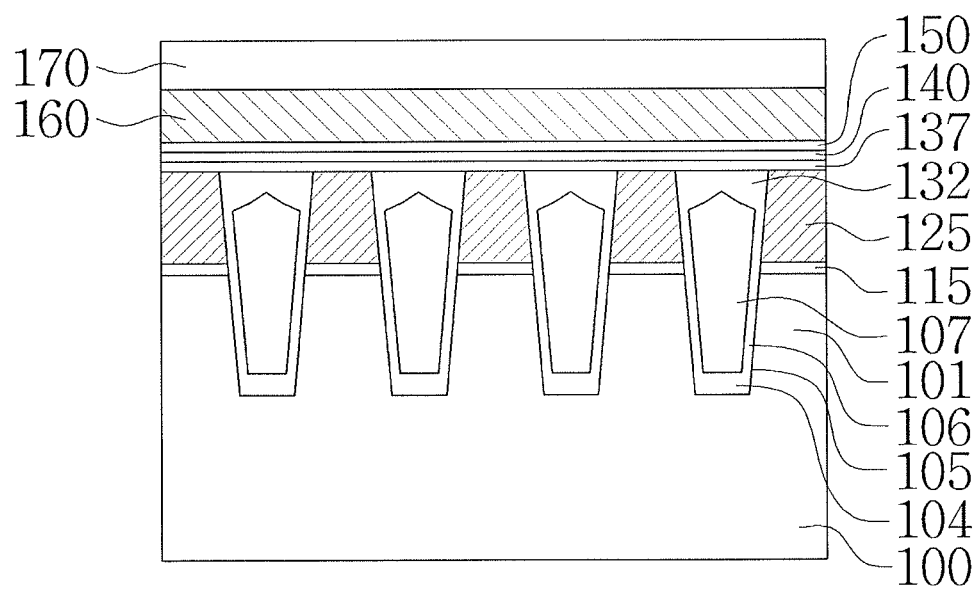

FIGS. 1A through 1R illustrate longitudinal sectional views of semiconductor devices having floating gate electrodes according to various exemplary embodiments. Features described with respect to one exemplary embodiment may be incorporated into other embodiments (including other exemplary embodiments). A first exemplary embodiment is described and thereafter differences between other various exemplary embodiments are mainly described below.

Referring to FIG. 1A, a semiconductor device according to a first exemplary embodiment may include active regions 101 formed on a substrate 100. In the semiconductor device, tunneling insulating layers 115, floating gate electrodes 125, a lower insulating layer 135, a control gate electrode 160, and a gate capping layer 170 may be stacked on the active regions 101, e.g., sequentially stacked thereon.

Isolation trenches 105 may be formed between adjacent ones of active regions 101. The isolation trenches 105 may include therein air gaps 107. The isolation trenches 105 may space and isolate the active regions 101, the tunneling insulating layers 115, and the floating gate electrodes 125 from one another. The isolation trenches 105 may define the active regions 101. Adjacent ones of the tunneling insulating layers 115 and adjacent ones of the floating gate electrodes 125 may be spaced apart from each other by ones of the isolation trenches 105. Lateral surfaces of the tunneling insulating layer 115 and portions of the floating gate electrodes 125 may be exposed to the air gaps 107. For example, entire sidewalls of the tunneling insulating layers 115 may be exposed to adjacent air gaps 107. At least a portion of sidewalls of the floating gate electrodes 125 may be exposed to the adjacent air gaps 107, e.g., lower portions of the floating gate electrodes 125 may be exposed to the adjacent air gaps 107 and upper portions of the floating gate electrodes 125 may be surrounded by the lower insulating layer 135. The lower insulating layer 135 may be adjacent to both opposing lateral sides of the floating gate electrodes 125.

Bottom insulating materials 102, e.g., having protrusions, may be formed on bottom surfaces of the isolation trenches 105. For example, the bottom insulating materials 102 may cover the bottom surfaces, e.g., the entire bottom surface, of the isolation trenches 105 and may protrude upward toward centers of the isolation trenches 105. The air gaps 107 may surround at least portions of sidewalls of the bottom insulating materials 102. The bottom insulating materials 102 may include the same material as the lower insulating layer 135.

The substrate 100 may be, e.g., one of a bulk silicon (Si) substrate, a silicon-on-insulator (SOI) substrate, a silicon-germanium (Si—Ge) substrate, or an epitaxial thin layer obtained using a selective epitaxial growth (SEG) process.

The tunneling insulating layers 115 may include, e.g., a silicon oxide. The floating gate electrodes 125 may include a conductor. For example, the floating gate electrodes 125 may include polysilicon (poly-Si), a silicide, a metal, or a metal compound.

The lower insulating layer 135 may include a silicon oxide (SiO), a silicon nitride (SiN), a silicon oxynitride (SiON), or a metal oxide, such as aluminum oxide, hafnium oxide, zirconium oxide, or lanthanum oxide. The lower insulating layer 135 may hermetically seal top portions of the isolation trenches 105. For example, the lower insulating layer 135 may cover, e.g., completely cover, upper portions of the isolation trenches 105. The lower insulating layer 135 may define the air gaps 107, e.g., upper portions of the air gaps 107 may be defined by a lower surface of the lower insulating layer 135.

The lower insulating layer 135 may have at least one curved and/or rounded surface, e.g., a curved and/or rounded upper surface and a curved or rounded lower surface. For example, the lower insulating layer 135 may thicken and/or curve upward toward centers of the floating gate electrodes 125 and may thin and/or curve downward toward centers of the isolation trenches 105. Thinnest portions of the lower insulating layer 135 may overlap centers, e.g., be vertically aligned with centers, of the isolation trenches 105.

The lower insulating layer 135 may have varying thicknesses at least within the isolation trenches 105. The lower insulating layer 135 may have a first top surface disposed at a relatively high level in a position vertically aligned with the floating gate electrodes 125, e.g., vertically aligned with centers of the floating gate electrodes 125. The lower insulating layer 135 may have a second top surface disposed at a relatively low level in a position vertically aligned with the isolation trenches 105, e.g., vertically aligned with centers of the isolation trenches 105. For example, the lower insulating layer 135 may have a spherical or oval shape whose center is located in the floating gate electrodes 125, the active regions 101, or the substrate 100. The first top surface of the lower insulating layer 135 may be rounded, while the second top surface thereof may have dents and/or recesses. The lower insulating layer 135 may have a shape symmetrical to the second top surface in the position vertically aligned with the isolation trench 105. The lower insulating layer 135 may cover upper lateral surfaces of the floating gate electrodes 125 and expose lower lateral surfaces thereof. At least a part of a first bottom surface of the lower insulating layer 135 may be symmetrical with respect to the first top surface. The second bottom surface of the lower insulating layer 135 may be symmetrical with respect to the second top surface.

By way of the lower insulating layer 135, the lateral surfaces of the tunneling insulating layers 115 and the lower lateral surfaces of the floating gate electrodes 125 may be exposed to the air gaps 107.

A lower surface of the control gate electrode 160 may include a plurality of curved portions that correspond to the curved upper surface of the lower insulating layer 135. The control gate electrode 160 may include a conductor. For example, the control gate electrode 160 may include poly-Si, a silicide, a metal, or a metal compound. Alternatively, the control gate electrode 160 may include at least one selected from a nitride containing a metal element, an oxynitride containing a metal element, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). The nitride containing the metal element may include, e.g., TiN, TaN, WN, MoN, NbN, TiSiN, TiAlN, TiBN, ZrSiN, WSiN, WBN, ZrAlN, MoSiN, MoAlN, TaSiN, or TaAlN, and the oxynitride containing the metal element may include, e.g., TiON, TiAlON, WON, or TaON.

The gate capping layer 170 may include an insulating material. For example, the gate capping layer 170 may include an insulating material, such as at least one of SiO2, SiN, SiON, and SiCN. Alternatively, the gate capping layer 170 may include a barrier material, such as at least one of titanium/titanium nitride (Ti/TiN), tantalum oxide (TaO), and tantalum nitride (TaN). When the gate capping layer 170 includes a barrier material, the gate capping layer 170 may be thinner than in FIG. 1A, e.g., may be thinner than when the gate capping layer 170 includes an insulating material.

Differences between the various exemplary embodiments, e.g., in comparison with the first exemplary embodiment, are mainly described below. Features described with respect to one exemplary embodiment may be incorporated into other embodiments (including other exemplary embodiments).

Referring to FIG. 1B, a semiconductor device according to a second exemplary embodiment may include active regions 101 formed on a substrate 100 and tunneling insulating layers 115, floating gate electrodes 125, a lower insulating layer 135, an upper insulating layer 150, a control gate electrode 160, and a gate capping layer 170 stacked on the active regions 101. The upper insulating layer 150 may have a higher energy bandgap than the lower insulating layer 135. The shape of the upper insulating layer 150 may correspond to a shape of the upper surface of the lower insulating layer 135. For example, the upper insulating layer 150 may be formed of a plurality of curved portions.

The upper insulating layer 150 may be formed of a material having a higher dielectric constant than the lower insulating layer 135. Top and/or bottom surfaces of the upper insulating layer are rounded in accordance with the top surface of the lower insulating layer. For example, the upper insulating layer 150 may include a high-k dielectric material, such as Al2O3, HfO2, ZrO2, La2O3, Ta2O3, TiO2, SrTiO3(STO), or a barium strontium titanate such as (Ba,Sr)TiO3(BST), or a compound layer stacked by a combination thereof. If the upper insulating layer 150 has a higher energy bandgap than the lower insulating layer 135, migration of charges from the control gate electrode 160 to the upper insulating layer 150 may be prevented or reduced.

Referring to FIG. 1C, a semiconductor device according to a third exemplary embodiment may include active regions 101 formed on a substrate 100 and tunneling insulating layers 115, floating gate electrodes 125, a lower insulating layer 135, a middle insulating layer 140, an upper insulating layer 150, a control gate electrode 160, and a gate capping layer 170 stacked on the active regions 101. Top and/or bottom surfaces of the middle insulating layer are rounded in accordance with the top surface of the lower insulating layer. The middle insulating layer 140 may include at least one of silicon nitride, silicon oxynitride, Si-rich nitride, nanocrystalline silicon, and a laminated trap layer. The middle layer 140 may have a higher dielectric constant than the lower insulating layer 135. The middle insulating layer 140 may have a lower energy bandgap than the upper insulating layer 150. The middle layer 140 may be between the upper insulating layer 150 and the lower insulating layer 135 and may have a shape corresponding to an upper surface of the lower insulating layer 135. Both the middle layer 140 and the upper insulating layer 150 may be formed of a plurality of curved portions.

Referring to FIG. 1D, a semiconductor device according to a fourth exemplary embodiment may include active regions 101 formed on a substrate 100, tunneling insulating layers 115, floating gate electrodes 125, a lower insulating layer 135, a control gate electrode 160, and a gate capping layer 170 stacked on the active regions 101, and a lining insulating layer 106 formed on sidewalls of the active regions 101 in the isolation trenches 105 (e.g., inner walls of the isolation trenches 105). The lining insulating layer 106 may be conformally formed to cover the inner walls of the isolation trenches 105, lateral surfaces of the tunneling insulating layers 115, and portions of lateral surfaces of the floating gate electrodes 125. Vertical thickness of the bottom insulating material may be thicker than horizontal thickness of the lining insulating layer. The lining insulating layer 106 may include silicon oxide, silicon nitride, or silicon oxynitride. The lining insulating layer 106 may be formed of a same material as the lower insulating layer 135.

Bottom insulating materials 104 may be formed on bottoms of the isolation trenches 105 to a greater thickness than the lining insulating layer 106 formed on the inner walls of the isolation trenches 105. The bottom insulating materials 104 may include a same material as the lower insulating layer 135. Air gaps 107 may be defined by the lower insulating layer 135, the lining insulating layer 106, and the bottom insulating materials 104.

Referring to FIG. 1E, a semiconductor device according to a fifth exemplary embodiment may include active regions 101 formed on a substrate 100 and tunneling insulating layers 115, floating gate electrodes 125, a lower insulating layer 135, an upper insulating layer 150, a control gate electrode 160, a gate capping layer 170, a lining insulating layer 106, and bottom insulating materials 104 formed therein.

Referring to FIG. 1F, a semiconductor device according to a sixth exemplary embodiment may include active regions 101 formed on a substrate 100 and tunneling insulating layers 115, floating gate electrodes 125, a lower insulating layer 135, a middle insulating layer 140, an upper insulating layer 150, a control gate electrode 160, a gate capping layer 170, a lining insulating layer 106, and bottom insulating materials 104 formed therein.

Referring to FIG. 1G, a semiconductor device according to a seventh exemplary embodiment may include active regions 101 formed on a substrate 100 and tunneling insulating layers 115, floating gate electrodes 125, a lower insulating layer 136, a control gate electrode 160, and a gate capping layer 170 stacked on the active regions 101. The lower insulating layer 136 may have a planar top surface, e.g., a substantially flat uppermost surface. A bottom surface of the lower insulating layer 136 may be curved and/or rounded, e.g., similar to the bottom surface of the lower insulating layer 135. A lower surface of the control gate electrode 160 may also be substantially flat. The semiconductor device may include bottom insulating materials 102 on the bottom surfaces of the trenches 105. Further, air gaps 107 may be defined by the bottom insulating materials 102 and the lower insulating layer 136.

Referring to FIG. 1H, a semiconductor device according to an eighth exemplary embodiment may include active regions 101 formed on a substrate 100 and tunneling insulating layers 115, floating gate electrodes 125, a lower insulating layer 136 having a planar top surface, an upper insulating layer 150, a control gate electrode 160, and a gate capping layer 170 stacked on the active regions 101. The upper insulating layer 150 may be substantially flat similar to the top surface of the lower insulating layer 136.

Referring to FIG. 1I, a semiconductor device according to a ninth exemplary embodiment may include active regions 101 formed on a substrate 100 and tunneling insulating layers 115, floating gate electrodes 125, a lower insulating layer 136 having a planar top surface, a middle insulating layer 140, an upper insulating layer 150, a control gate electrode 160, and a gate capping layer 170 stacked on the active regions 101. The middle insulating layer 140 and the upper insulating layer 150 may be substantially flat similar to the top surface of the lower insulating layer 136.

Referring to FIG. 1J, a semiconductor device according to a tenth exemplary embodiment may include active regions 101 formed on a substrate 100 and tunneling insulating layers 115, floating gate electrodes 125, a lower insulating layer 136 having a planar top surface, a control gate electrode 160, a gate capping layer 170, a lining insulating layer 106, and bottom insulating materials 104 on the substrate 100. Air gaps 107 may be defined by the lower insulating layer 136, the bottom insulating materials 104, and the lining insulating layer 106. Portions of the lower insulating layer 136 may have upper and lower surfaces that are substantially flat. Further, other portions, e.g., portions that overlap the air gaps 107, of the lower insulating layer 136 may have a lower surface that is jagged in an area overlapping and surrounding the air gaps 107.

Referring to FIG. 1K, a semiconductor device according to an eleventh exemplary embodiment may include active regions 101 formed on a substrate 100 and tunneling insulating layers 115, floating gate electrodes 125, a lower insulating layer 136 having a planar top surface, an upper insulating layer 150, a control gate electrode 160, a gate capping layer 170, a lining insulating layer 106 on sidewalls of the active regions 101 in the isolation trenches 105, and bottom insulating materials 104 on the substrate 100. A bottom surface of the lower insulating layer 136, the lining insulating layer 106, and the bottom insulating materials 104 may define the air gaps 107.

Referring to FIG. 1L, a semiconductor device according to a twelfth exemplary embodiment may include active regions 101 formed on a substrate 100 and tunneling insulating layers 115, floating gate electrodes 125, a lower insulating layer 136 having a planar top surface, a middle insulating layer 140 on the planar top surface, an upper insulating layer 150, a control gate electrode 160, a gate capping layer 170, a lining insulating layer 106 in the trenches 105, and bottom insulating materials 104 on the substrate 100.

Referring to FIG. 1M, a semiconductor device according to a thirteenth exemplary embodiment may include active regions 101 formed on a substrate 100 and tunneling insulating layers 115, floating gate electrodes 125, a lower insulating layer 137, a control gate electrode 160, a gate capping layer 170, and a leading insulating layer 132 stacked on the substrate 100.

The lower insulating layer 137 may have planar top and bottom surfaces, e.g., the lower insulating layer 137 may extend above and across the floating gate electrodes 125. The leading insulating layer 132 may be formed in upper portions of the isolation trenches 105 and under the lower insulating layer 137. The lower insulating layer 137 may be substantially flat while the leading insulating layer 132 may have a jagged lower surface. An air gap 107 may be defined in each isolation trench 105 by the leading insulating layer 132, a bottom insulating layer 102, and sidewalls of the isolation trench 105. The lower insulating layer 137 may be disposed within the isolation trench 105 and the lower insulating layer 137 may be above the isolation trench 105, e.g., may cover a plurality of isolation trenches 105. The leading insulating layer 132 may be completely within the isolation trenches 105 so as to define an upper portion of air gaps 107.

Referring to FIG. 1N, a semiconductor device according to a fourteenth exemplary embodiment may include active regions 101 formed on a substrate 100 and tunneling insulating layers 115, floating gate electrodes 125, a lower insulating layer 137 having planar top and bottom surfaces, an upper insulating layer 150, a control gate electrode 160, a gate capping layer 170, a bottom insulating layer 102, and a leading insulating layer 132 stacked on the substrate 100. The upper insulating layer 150 may cover the lower insulating layer 137.

Referring to FIG. 1O, a semiconductor device according to a fifteenth exemplary embodiment may include active regions 101 formed on a substrate 100 and tunneling insulating layers 115, floating gate electrodes 125, a lower insulating layer 137 having planar top and bottom surfaces, a middle insulating layer 140, an upper insulating layer 150, a control gate electrode 160, a gate capping layer 170, a bottom insulating material 102, and a leading insulating layer 132 stacked on the substrate 100.

Referring to FIG. 1P, a semiconductor device according to a sixteenth exemplary embodiment may include active regions 101 formed on a substrate 100 and tunneling insulating layers 115, floating gate electrodes 125, a lower insulating layer 137 having planar top and bottom surfaces, a control gate electrode 160, a gate capping layer 170, a lining insulating layer 106, a bottom insulating material 104, and a leading insulating layer 132 stacked on the substrate 100. In each isolation trench 105, the lining insulating layer 106, the bottom insulating material 104, and the learning insulating layer 132 define an air gap 107.

Referring to FIG. 1Q, a semiconductor device according to a seventeenth exemplary embodiment may include active regions 101 formed on a substrate 100 and tunneling insulating layers 115, floating gate electrodes 125, a lower insulating layer 137 having planar top and bottom surfaces, an upper insulating layer 150, a control gate electrode 160, a gate capping layer 170, a lining insulating layer 106, and a leading insulating layer 132 stacked on the substrate 100.

Referring to FIG. 1R, a semiconductor device according to an eighteenth exemplary embodiment may include active regions 101 formed on a substrate 100 and tunneling insulating layers 115, floating gate electrodes 125, a lower insulating layer 137 having planar top and bottom surfaces, a middle insulating layer 140, an upper insulating layer 150, a control gate electrode 160, a gate capping layer 170, a lining insulating layer 106, and a leading insulating layer 132 stacked on the substrate 100.

In the semiconductor devices having floating gate electrodes 125 according to various exemplary embodiments, adjacent ones of the floating gate electrodes 125 or the active regions 101 may be disposed apart from each other with the air gap 107 therebetween. Accordingly, electrical interference, such as a parasitic capacitance, leakage of charges, and/or coupling, between the floating gate electrodes 125 and/or the active regions 101 may be reduced.

FIGS. 2A through 2F, 3A through 3F, and 4A through 4H illustrate longitudinal sectional views of semiconductor devices including charge trap layers according to various exemplary embodiments. Features described with respect to one exemplary embodiment may be incorporated into other embodiments (including other exemplary embodiments). Differences between the various exemplary embodiments are mainly described below.

Figure 2A:
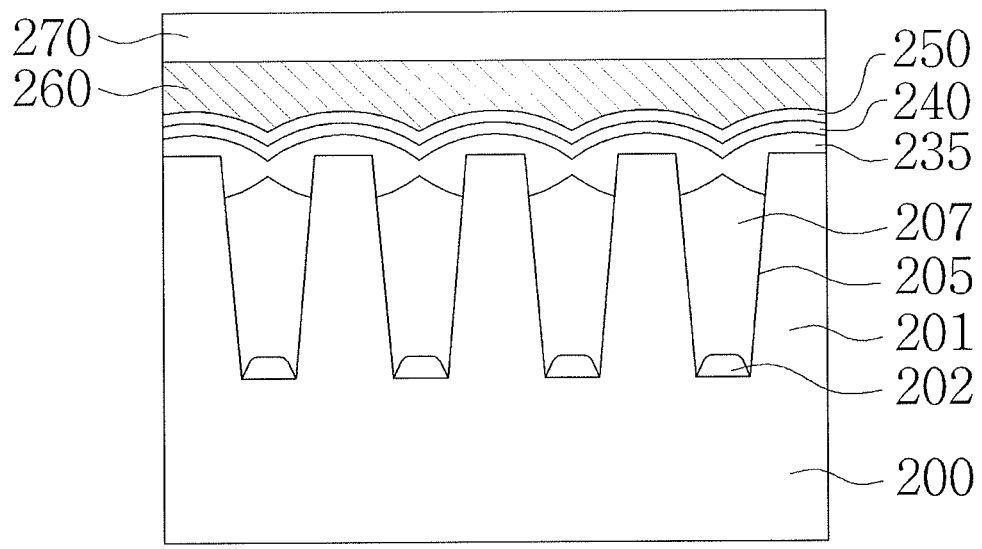
FIGS. 2A to 2F, 3A to 3F, and 4A to 4H illustrate longitudinal sectional views of semiconductor devices including charge trap layers according to one or more exemplary embodiments.

Referring to FIG. 2A, a semiconductor device according to a nineteenth exemplary embodiment may include active regions 201 formed on a substrate 200 and a tunneling insulating layer 235, a trap insulating layer 240, a blocking insulating layer 250, a gate electrode 260, and a gate capping layer 270 stacked on the active regions 201. Isolation trenches 205 may be formed between the active regions 201 and include air gaps 207. Bottom insulating materials 202 having protrusions may be formed on bottom of the isolation trenches 205. The bottom insulating material 202 may include the same material as the tunneling insulating layer 235.

The tunneling insulating layer 235 may include, e.g., a silicon oxide. The tunneling insulating layer 235 may hermetically seal the isolation trenches 205 and define upper surfaces of the air gaps 207. The tunneling insulating layer 235 may have curved or rounded surfaces. The tunneling insulating layer 235 may have a shape similar to a shape of the lower insulating layer 135 illustrated in FIG. 1A. The tunneling insulating layer 235 may thicken toward centers of the active regions 201 and thin toward centers of the isolation trenches 205. For example, the tunneling insulating layer 235 may have a first top surface disposed at a relatively high level in a position vertically aligned with the active regions 201 and a second top surface disposed at a relatively low level in a position vertically aligned with the isolation trenches 205. The first top surface may be rounded, while the second top surface may have dents. For instance, the tunneling insulating layer 235 may have a spherical shape whose center is located in the active regions 201. The tunneling insulating layer 235 may have a shape symmetrical to the second top surface in the position vertically aligned with the isolation trench 205. The tunneling insulating layer 235 may cover upper lateral surfaces of the active regions 201. Lateral surfaces of the active regions 201 may be exposed to the air gaps 207.

The trap insulating layer 240 may include a material having a greater dielectric constant than the tunneling insulating layer 235. For example, the trap insulating layer 240 may include a silicon nitride, a silicon oxynitride, or a metal nitride. According to exemplary embodiments, the trap insulating layer 240 may include a silicon nitride.

The blocking insulating layer 250 may have a greater energy bandgap than the tunneling insulating layer 235 or the trap insulating layer 240. For example, the blocking insulating layer 250 may include a metal oxide, such as aluminum oxide, hafnium oxide, zirconium oxide, or lanthanum oxide.

The gate electrode 260 may include a conductive material. For example, the gate electrode 260 may include poly-Si, a silicide, a metal, or a metal compound.

The gate capping layer 270 may include an insulating material. For example, the gate capping layer 270 may include an insulating material, such as a silicon oxide, a silicon nitride, a silicon oxynitride, or a silicon carbonitride. Alternatively, the gate capping layer 270 may include a barrier material, such as Ti/TiN, TaO, or TaN. When the gate capping layer 270 includes a barrier material, the gate capping layer 270 may be thinner than shown in FIG. 2A.

Figure 2B:
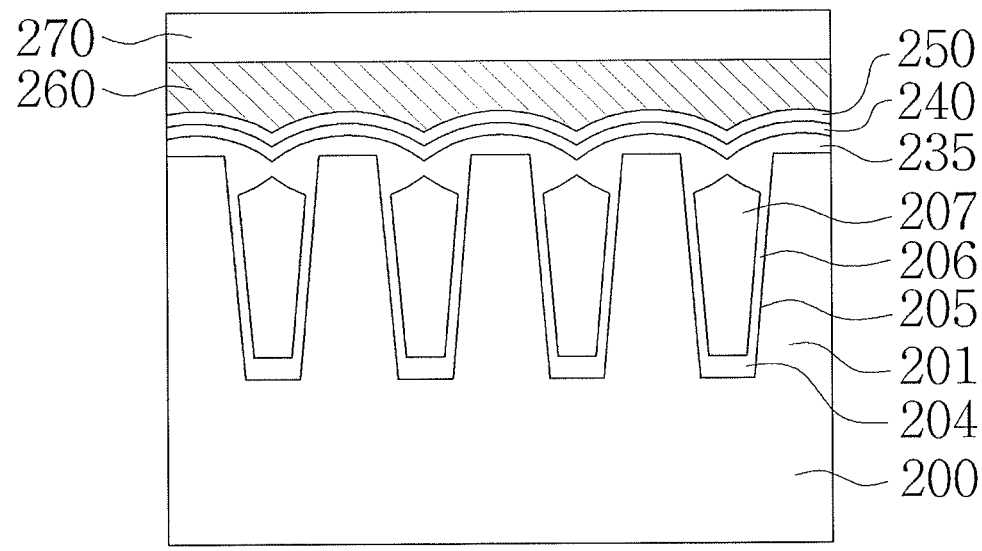

Referring to FIG. 2B, a semiconductor device according to a twentieth exemplary embodiment may include active regions 201 formed on a substrate 200, a tunneling insulating layer 235, a trap insulating layer 240, a blocking insulating layer 250, a gate electrode 260, and a gate capping layer 270 stacked on the active regions 201, and a lining insulating layer 206 formed on inner walls of the isolation trenches 205. The lining insulating layer 206 may be similar to the lining insulating layer 106. Bottom insulating materials 204 may be formed on bottom of the isolation trenches 205 to a greater thickness than the lining insulating layer 206 formed on the inner walls of the isolation trenches 205. The bottom insulating materials 204 may include the same material as the tunneling insulating layer 235.

Figure 2C:
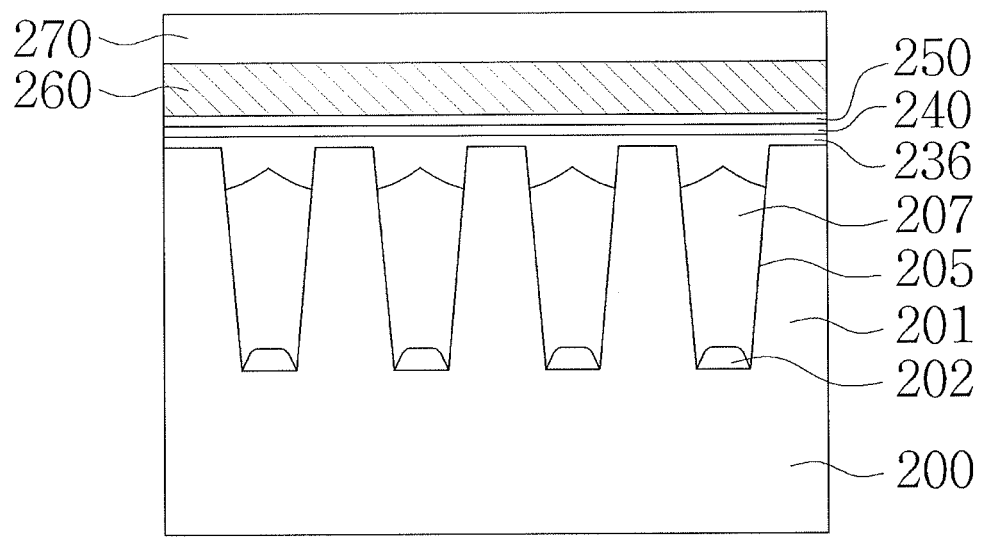

Referring to FIG. 2C, a semiconductor device according to a twenty-first exemplary embodiment may include active regions 201 formed on a substrate 200 and a lower insulating layer 236, a trap insulating layer 240, a blocking insulating layer 250, a gate electrode 260, and a gate capping layer 270 stacked on the active regions 201. The lower insulating layer 236 may have a planar top surface. The lower insulating layer 236 may be similar to the lower insulating layer 136. The lower insulating layer 236 may have a planar top surface that is above the isolation trenches 205. A bottom surface of the lower insulating layer 236, which may be within the isolation trenches 205, may be jagged.

Figure 2D:
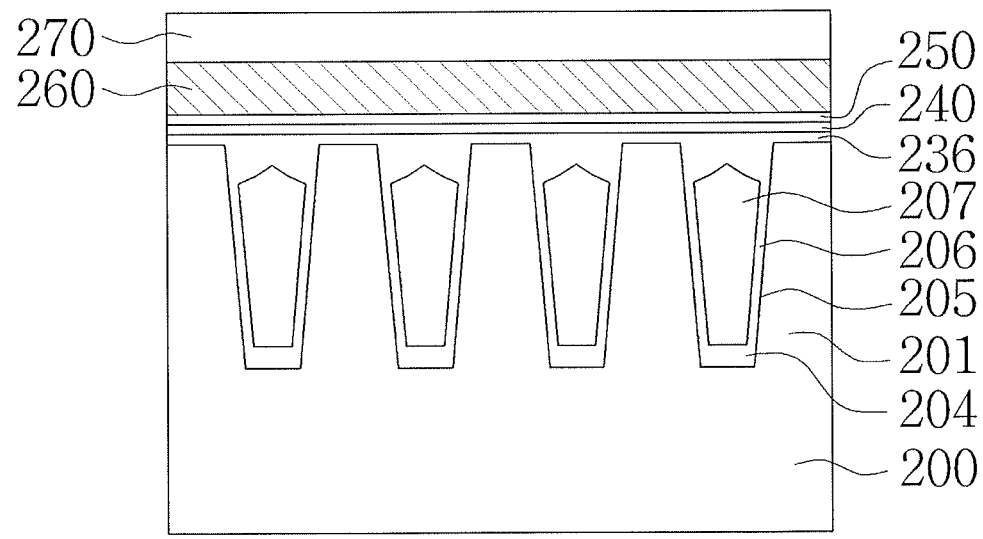

Referring to FIG. 2D, a semiconductor device according to a twenty-second exemplary embodiment may include active regions 201 formed on a substrate 200 and a lower insulating layer 236 having a planar top surface, a trap insulating layer 240, a blocking insulating layer 250, a gate electrode 260, a gate capping layer 270, and a lining insulating layer 206 stacked on the active regions 201.

Figure 2E:
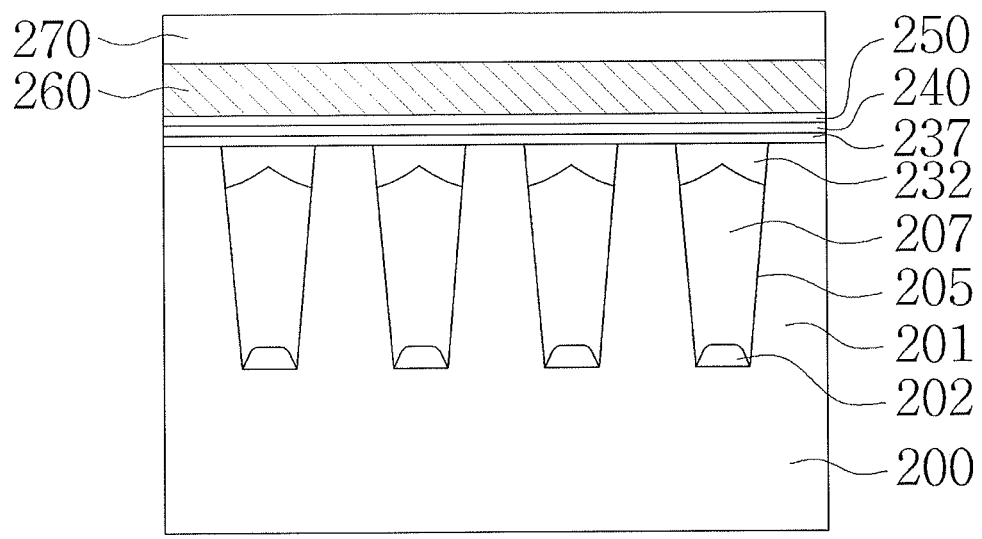

Referring to FIG. 2E, a semiconductor device according to a twenty-third exemplary embodiment may include active regions 201 formed on a substrate 200 and a lower insulating layer 237 having planar top and bottom surfaces, a trap insulating layer 240, a blocking insulating layer 250, a gate electrode 260, and a gate capping layer 270 stacked on the active regions 201, and a leading insulating layer 232 formed under the planar bottom surface of the lower insulating layer 237. The lower insulating layer 237 may have planar top and bottom surfaces. The lower insulating layer 237 may be similar to the lower insulating layer 137.

Figure 2F:
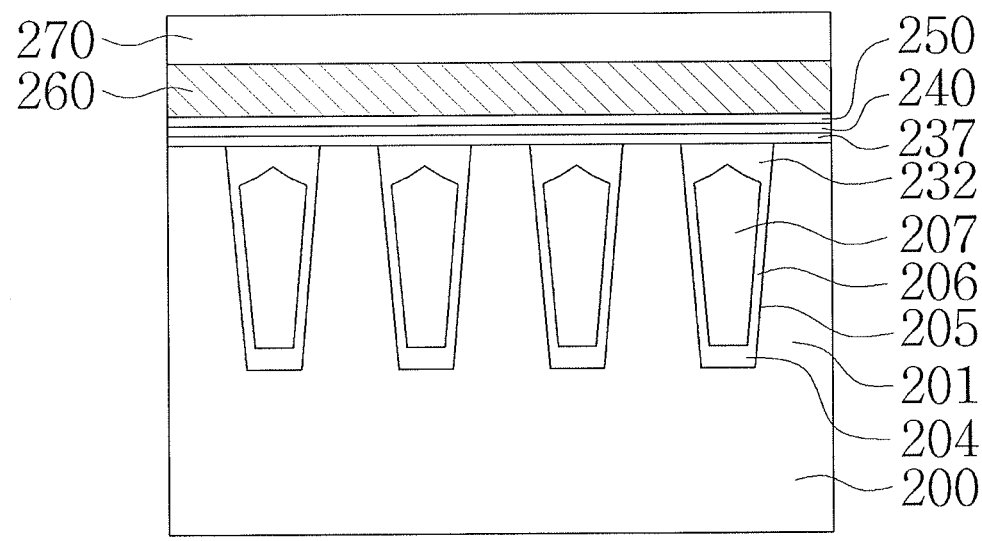

Referring to FIG. 2F, a semiconductor device according to a twenty-fourth exemplary embodiment may include active regions 201 formed on a substrate 200 and a lower insulating layer 237 having planar top and bottom surfaces, a trap insulating layer 240, a blocking insulating layer 250, a gate electrode 260, a gate capping layer 270, a lining insulating layer 206, and a leading insulating layer 232 stacked on the substrate 200.

In the semiconductor devices having the charge trap layers according to various exemplary embodiments, electrical interference, such as a parasitic capacitance, leakage of charges, and/or coupling, between adjacent ones of the trap insulating layers 240 and/or the active regions 201 may be reduced.

Features described with respect to one exemplary embodiment may be incorporated into other embodiments (including other exemplary embodiments).

Figure 3A:
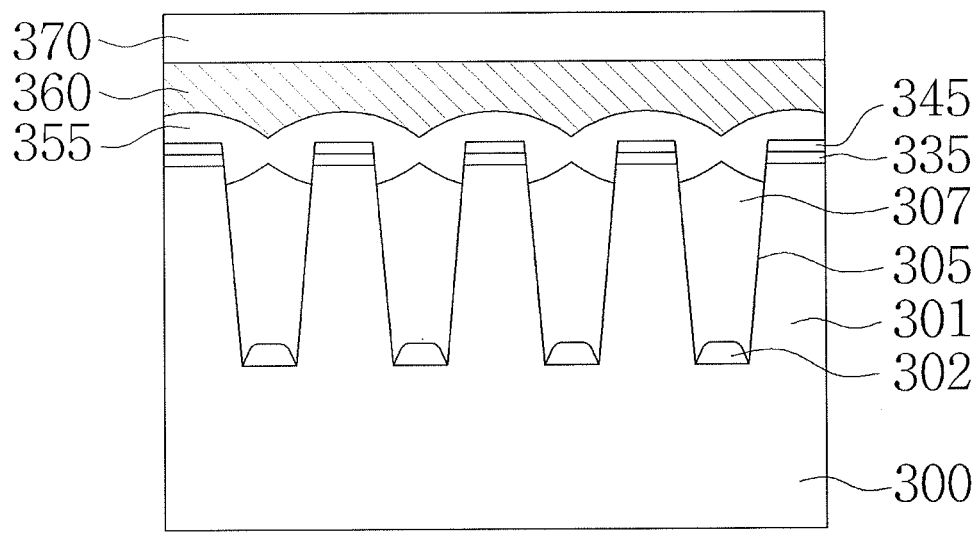

Referring to FIG. 3A, a semiconductor device according to a twenty-fifth exemplary embodiment may include active regions 301 formed on a substrate 300 and tunneling insulating layers 335, trap insulating layers 345, a blocking insulating layer 355, a gate electrode 360, and a gate capping layer 370 stacked on the active regions 301. Isolation trenches 305 may be formed between the active regions 301, the tunneling insulating layers 335, and the trap insulating layers 345 (that may be sequentially formed) and may include air gaps 307. The isolation trenches 305 may include bottom insulating materials 302. Upper portions of the air gaps 307 may be defined by the blocking insulating layer 355. The blocking insulating layer 355 may be similar to the lower insulating layer 135.

The tunneling insulating layers 335 may include a silicon oxide. The trap insulating layers 345 may include a material having a higher dielectric constant than the tunneling insulating layers 335. For example, the trap insulating layers 345 may include a silicon nitride, a silicon oxynitride, or a metal nitride. The tunnel insulating layers 335 may be formed only on the active regions 301 and the trap insulating layers 345 may be formed only on the tunnel insulating layers 335.

The blocking insulating layer 355 may have a higher energy bandgap than the tunneling insulating layers 335 or the trap insulating layers 345. For example, the blocking insulating layer 355 may include a metal oxide, such as aluminum oxide, hafnium oxide, zirconium oxide, or lanthanum oxide. The blocking insulating layer 355 may hermetically seal top portions of the isolation trenches 305 and define the air gaps 307. The blocking insulating layer 355 may have a curved or rounded surface. The blocking insulating layer 355 may thicken toward centers of the active regions 301 and thin toward centers of the isolation trenches 305. For example, the blocking insulating layer 355 may have a first top surface disposed at a relatively high level in a position vertically aligned with the active regions 301 and a second top surface disposed at a relatively low level in a position vertically aligned with the isolation trenches 307. The first top surface may be rounded, while the second top surface may have dents. The blocking insulating layer 355 may have a spherical shape whose center is located in the active regions 301. The blocking insulating layer 355 may have a shape symmetric to the second top surface in the position vertically aligned with the isolation trench 305. The blocking insulating layer 355 may cover lateral surfaces of the tunneling insulating layers 335 and the trap insulating layers 345 and upper lateral surfaces of the active regions 301.

The gate electrode 360 may include a conductive material. For example, the gate electrode 360 may include poly-Si, a silicide, a metal, or a metal compound.

The gate capping layer 370 may include an insulating material. For instance, the gate capping layer 370 may include an insulating material, such as a silicon oxide, a silicon nitride, a silicon oxynitride, or a silicon carbonitride. Alternatively, the gate capping layer 370 may include a barrier material, such as Ti/TiN, TaO, or TaN. When the gate capping layer 370 includes a barrier material, the gate capping layer 370 may be comparatively thinner.

Figure 3B:
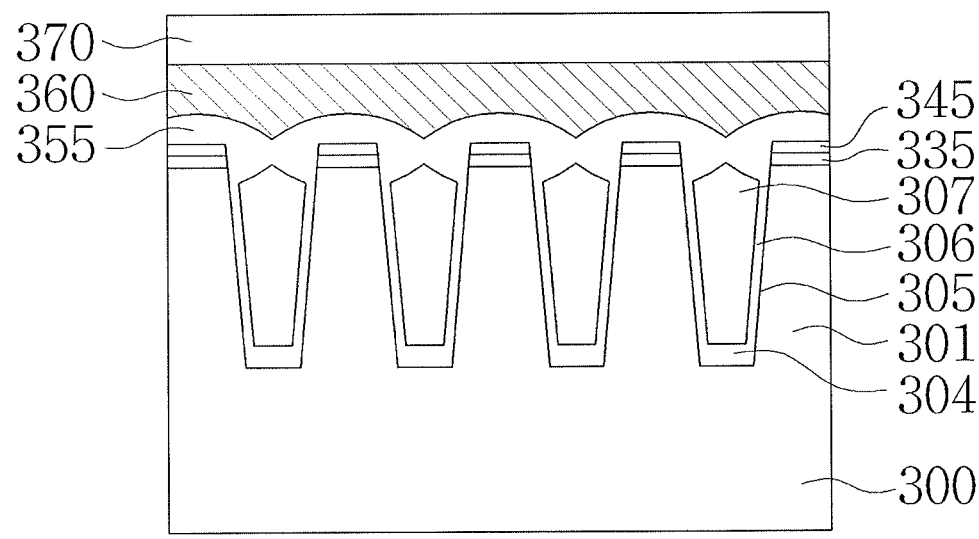

Referring to FIG. 3B, a semiconductor device according to a twenty-sixth exemplary embodiment may include active regions 301 formed on a substrate 300, tunneling insulating layers 335, trap insulating layers 345, a blocking insulating layer 355, a gate electrode 360, and a gate capping layer 370 stacked on the active regions 301. A lining insulating layer 306 may be formed on inner walls of the isolation trenches 305. The lining insulating layer 306 may be similar to the lining insulating layer 106. The lining insulating layer 306 may be conformally formed to cover the inner walls of the isolation trenches 305, lateral surfaces of the tunneling insulating layers 335, and portions of lateral surfaces of the trap insulating layers 345. The lining insulating layer 306 may include a silicon oxide, a silicon nitride, or a silicon oxynitride. Bottom insulating materials 304 may be formed on bottom of the isolation trenches 305 to a greater thickness than the lining insulating layer 306 formed on the inner walls of the isolation trenches 305. Air gaps 307 may be defined by the blocking insulating layer 355 and the lining insulating layer 306.

Figure 3C:
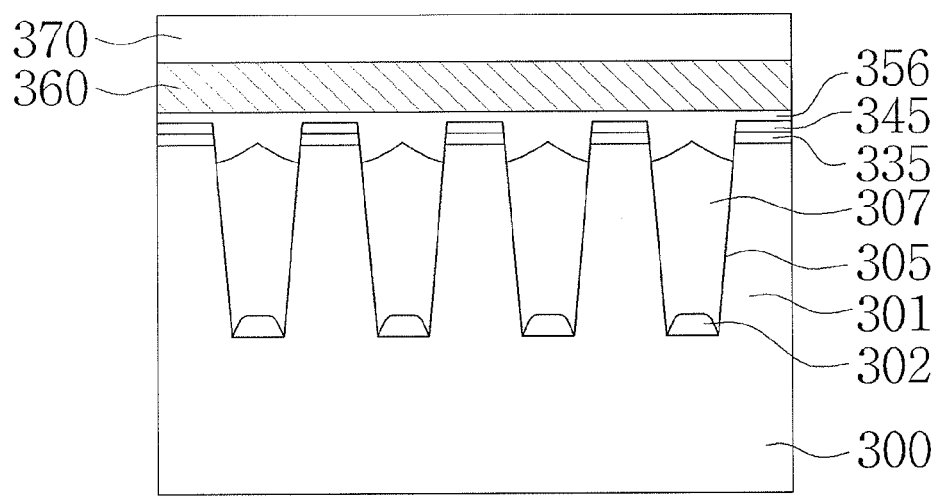

Referring to FIG. 3C, a semiconductor device according to a twenty-seventh exemplary embodiment may include active regions 301 formed on a substrate 300 and tunneling insulating layers 335, trap insulating layers 345, a blocking insulating layer 356, a gate electrode 360, and a gate capping layer 370 stacked on the active regions 301. The blocking insulating layer 356 may have a planar top surface. The blocking insulating layer 356 may be similar to the lower insulating layer 136.

Figure 3D:
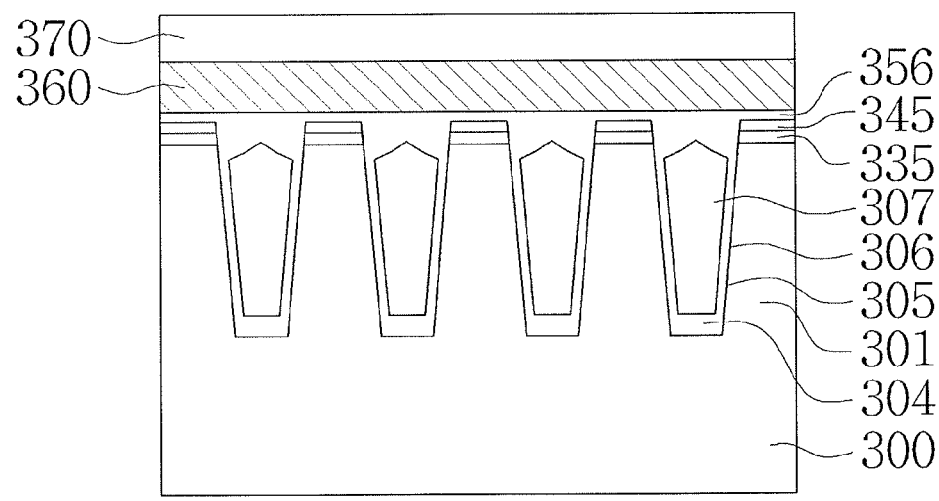

Referring to FIG. 3D, a semiconductor device according to a twenty-eighth exemplary embodiment may include active regions 301 formed on a substrate 300, tunneling insulating layers 335, trap insulating layers 345, a blocking insulating layer 356 having a planar top surface, a gate electrode 360, and a gate capping layer 370 stacked on the active regions 301. A lining insulating layer 306 and bottom insulating materials 304 may be formed on inner walls of the isolation trenches 305 to define the air gaps 307 thereunder.

Figure 3E:
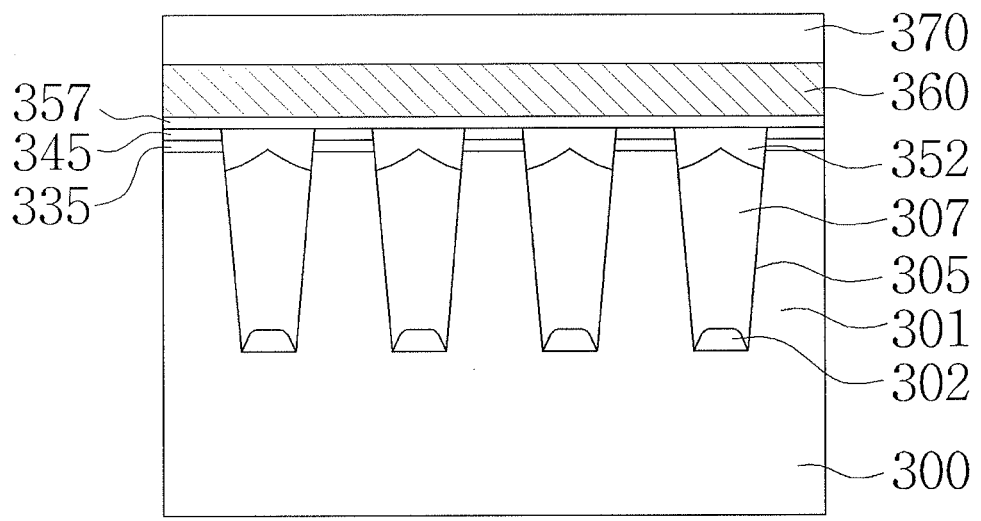

Referring to FIG. 3E, a semiconductor device according to a twenty-ninth exemplary embodiment may include active regions 301 formed on a substrate 300 and tunneling insulating layers 335, trap insulating layers 345, a blocking insulating layer 357, a gate electrode 360, a gate capping layer 370, and a lining insulating layer 352 stacked on the active regions 301. The blocking insulating layer 357 may have planar top and bottom surfaces. The leading insulating layer 352 may be formed in upper portions of the isolation trenches 305 under the blocking insulating layer 357.

Figure 3F:
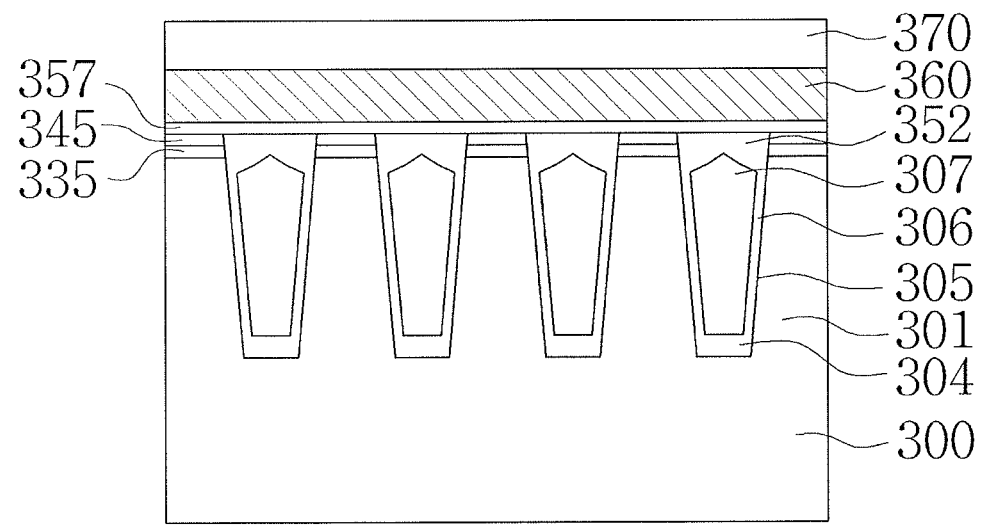

Referring to FIG. 3F, a semiconductor device according to a thirtieth exemplary embodiment may include active regions 301 formed on a substrate 300 and tunneling insulating layers 335, trap insulating layers 345, a blocking insulating layer 357 having planar top and bottom surfaces, a gate electrode 360, a gate capping layer 370, a lining insulating layer 306, a bottom insulating material 304, and a leading insulating layer 352 stacked on the substrate 300.

In the semiconductor devices including charge trap layers according to various exemplary embodiments, electrical interference, such as a parasitic capacitance, leakage of charges, and/or coupling, between adjacent ones of the trap insulating layers 345 and/or the active regions 301, may be reduced.

Features described with respect to one exemplary embodiment may be incorporated into other embodiments (including other exemplary embodiments).

Figure 4A:
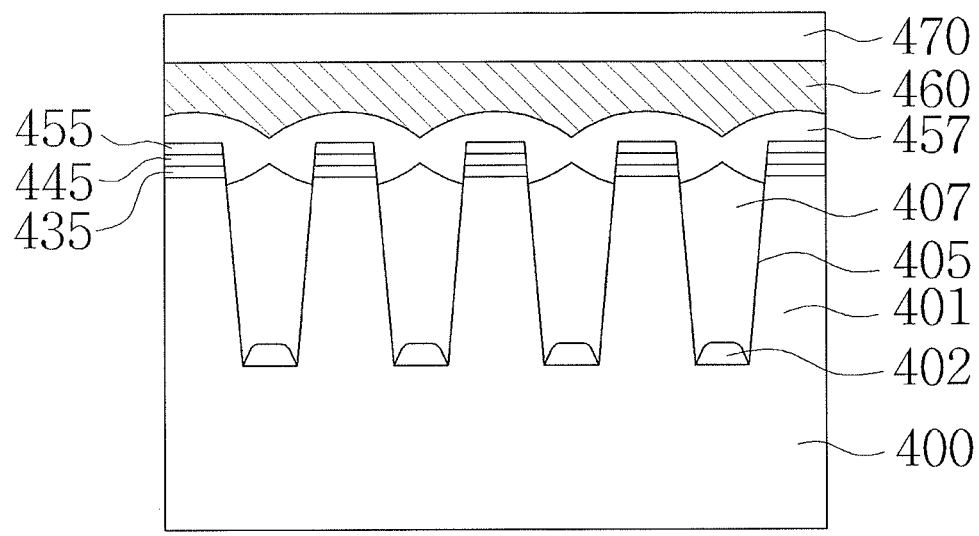

Referring to FIG. 4A, a semiconductor device according to a thirty-first exemplary embodiment may include active regions 401 formed on a substrate 400 and tunneling insulating layers 435, trap insulating layers 445, blocking insulating layers 455, a buffer insulating layer 457, a gate electrode 460, and a gate capping layer 470 stacked on the active regions 401. Isolation trenches 405 may be formed between the active regions 401 and include air gaps 407. Upper portions of the air gaps 407 may be defined by the buffer insulating layer 457. The buffer insulating layer 457 may be similar to the lower insulating layer 135.

The tunneling insulating layers 435 may include a silicon oxide. The trap insulating layers 445 may include a material having a higher dielectric constant than the tunneling insulating layers 435. For example, the trap insulating layers 445 may include a silicon nitride, a silicon oxynitride, or a metal nitride.

The blocking insulating layers 455 may have a higher energy bandgap than the tunneling insulating layers 435 or the trap insulating layers 445. For example, the blocking insulating layers 455 may include a metal oxide, such as aluminum oxide, hafnium oxide, zirconium oxide, or lanthanum oxide.

The buffer insulating layer 457 may include a silicon oxide, a silicon nitride, a silicon oxynitride, or a metal oxide. The buffer insulating layer 457 may hermetically seal top portions of the isolation trenches 405 and define the air gaps 407. The buffer insulating layer 457 may have a curved or rounded surface. For example, the buffer insulating layer 457 may have a first top surface disposed at a relatively high level in a position vertically aligned with the active regions 401 and a second top surface disposed at a relatively low level in a position vertically aligned with the isolation trenches 405. The first top surface may be rounded, while the second top surface may have dents. For example, the buffer insulating layer 457 may have a spherical shape whose center is located in the active regions 401. The buffer insulating layer 457 may have a shape symmetrical to the second top surface in the position vertically aligned with the isolation trench 405. The buffer insulating layer 457 may cover lateral surfaces of the tunneling insulating layers 435, the trap insulating layers 445, and the blocking insulating layers 455 and upper lateral surfaces of the active regions 401.

The gate electrode 460 may include poly-Si, a silicide, a metal, or a metal compound.

The gate capping layer 470 may include an insulating material. For example, the gate capping layer 470 may include an insulating material, such as a silicon oxide, a silicon nitride, a silicon oxynitride, or silicon carbonitride. Alternatively, the gate capping layer 470 may include a conductive material. For example, the gate capping layer 470 may include a barrier material, such as Ti/TiN, TaO, or TaN. When the gate capping layer 470 includes a barrier material, the gate capping layer 470 may be thinner than shown in FIG. 4A.

Figure 4B:
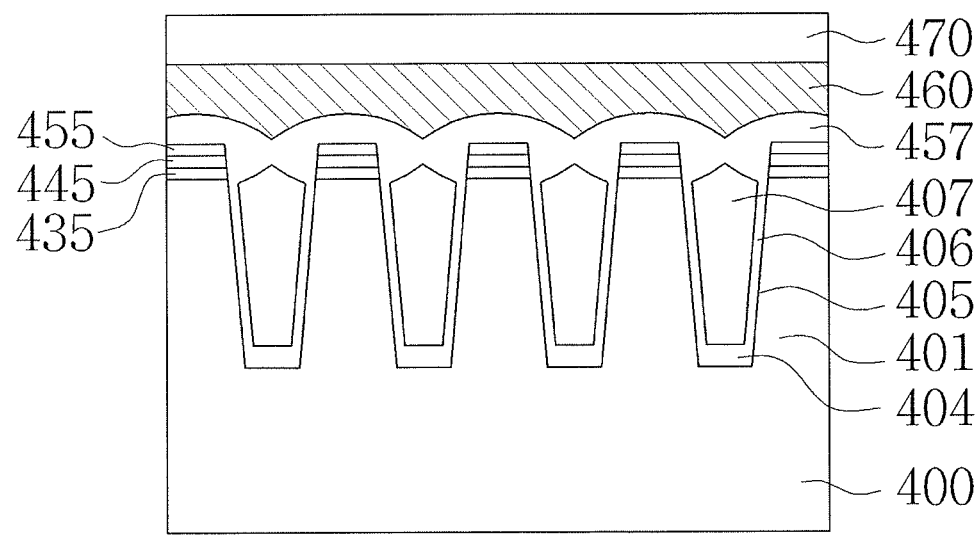

Referring to FIG. 4B, a semiconductor device according to a thirty-second exemplary embodiment may include active regions 401 formed on a substrate 400, tunneling insulating layers 435, trap insulating layers 445, blocking insulating layers 455, a buffer insulating layer 457, a gate electrode 460, and a gate capping layer 470 stacked on the active regions 401, and a lining insulating layer 406 formed on inner walls of the isolation trenches 405. The lining insulating layer 406 may be conformally formed to cover the inner walls of the isolation trenches 405, lateral surfaces of the tunneling insulating layers 435, lateral surfaces of the trap insulating layers 445, and/or portions of lateral surfaces of the blocking insulating layers 455. The lining insulating layer 406 may include a silicon oxide, a silicon nitride, or a silicon oxynitride. Bottom insulating materials 404 may be formed on bottom of the isolation trenches 405 to a greater thickness than the lining insulating layer 406 formed on the inner walls of the isolation trenches 405. The lining insulating layer 406 and the bottom insulating materials 404 may be similar to the lining insulating layer 106 and the bottom insulating materials 104, respectively. Air gaps 407 may be defined by the tunneling insulating layers 435 and the lining insulating layer 406.

Figure 4C:
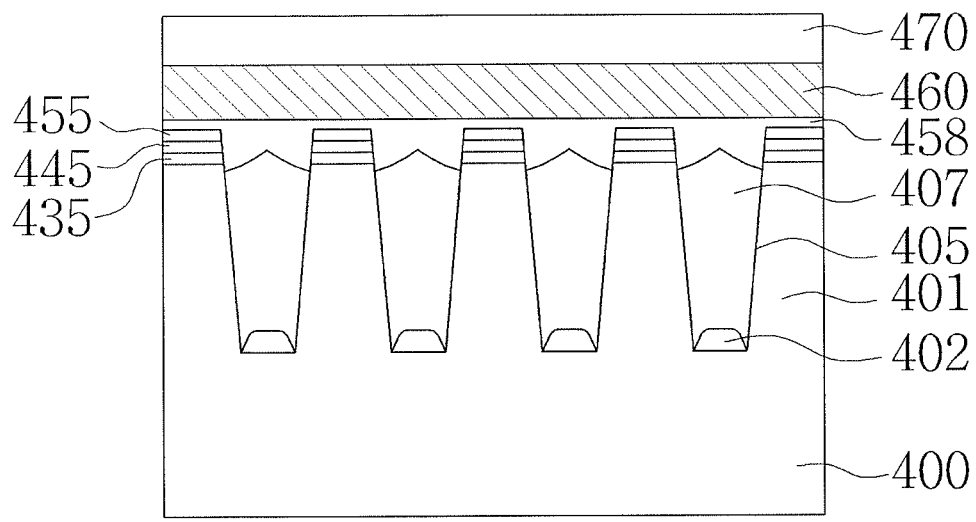

Referring to FIG. 4C, a semiconductor device according to a thirty-third exemplary embodiment may include active regions 401 formed on a substrate 400 and tunneling insulating layers 435, trap insulating layers 445, blocking insulating layers 455, a buffer insulating layer 458, a gate electrode 460, and a gate capping layer 470 stacked on the active regions 401. The buffer insulating layer 458 may have a planar top surface. The buffer insulating layer 458 may be similar to the lower insulating layer 136.

Figure 4D:
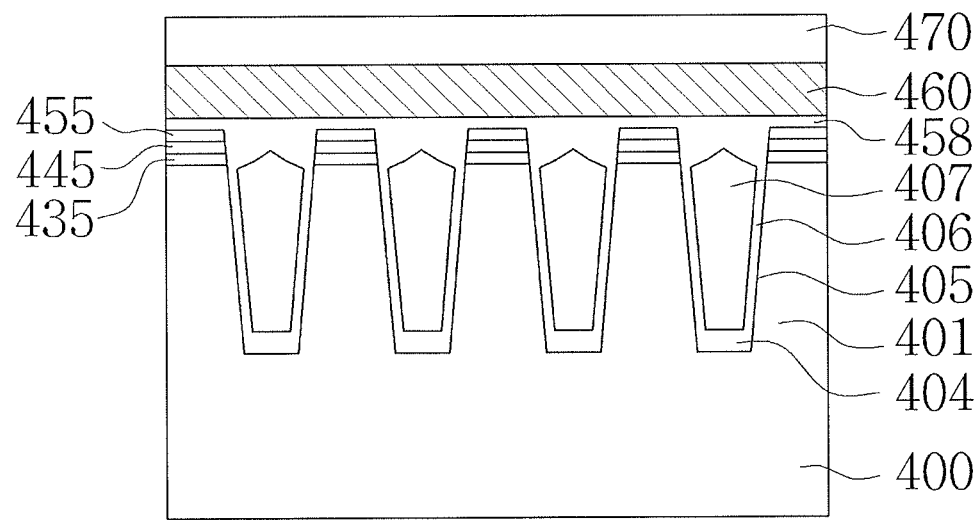

Referring to FIG. 4D, a semiconductor device according to a thirty-fourth exemplary embodiment may include active regions 401 formed on a substrate 400 and tunneling insulating layers 435, trap insulating layers 445, blocking insulating layers 455, a buffer insulating layer 458 having a planar top surface, a gate electrode 460, a gate capping layer 470, and a lining insulating layer 406 stacked on the active regions 401.

Figure 4E:
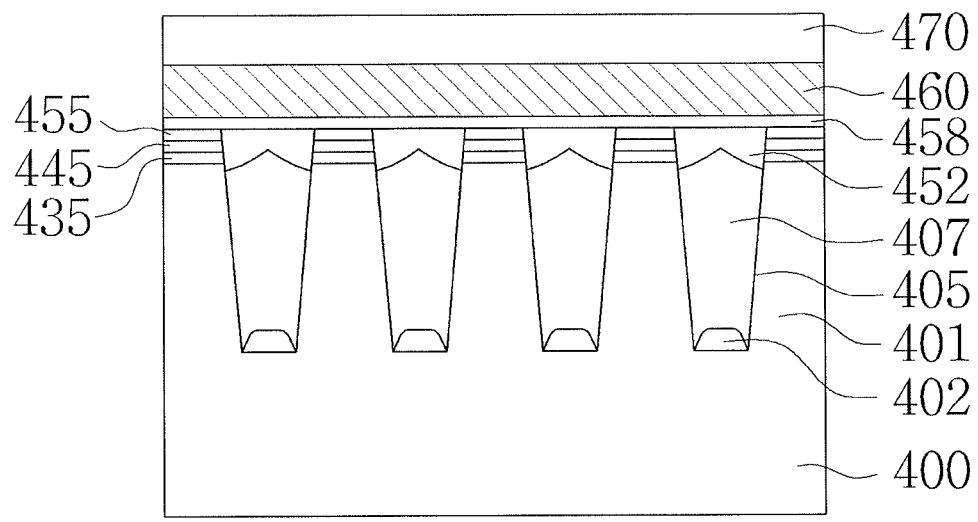

Referring to FIG. 4E, a semiconductor device according to a thirty-fifth exemplary embodiment may include active regions 401 formed on a substrate 400 and tunneling insulating layers 435, trap insulating layers 445, blocking insulating layers 455, a buffer insulating layer 459, a gate electrode 460, a gate capping layer 470, a lining insulating layer 406, a bottom insulating material 402, and a leading insulating layer 452 stacked on the substrate 400. The buffer insulating layer 459 may have planar top and bottom surfaces. The leading insulating layer 452 may be similar to the leading insulating layer 132.

Figure 4F:
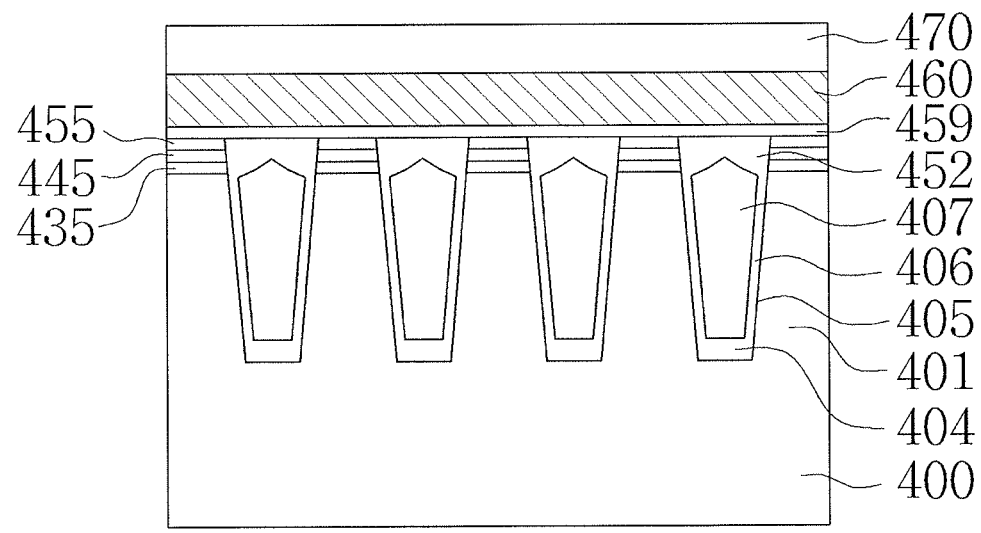

Referring to FIG. 4F, a semiconductor device according to a thirty-sixth exemplary embodiment may include active regions 401 formed on a substrate 400 and tunneling insulating layers 435, trap insulating layers 445, blocking insulating layers 455, a buffer insulating layer 458 having planar top and bottom surfaces, a gate electrode 460, a gate capping layer 470, a lining insulating layer 406, a bottom insulating material 404, and a leading insulating layer 452 stacked on the substrate 400.

Figure 4G:
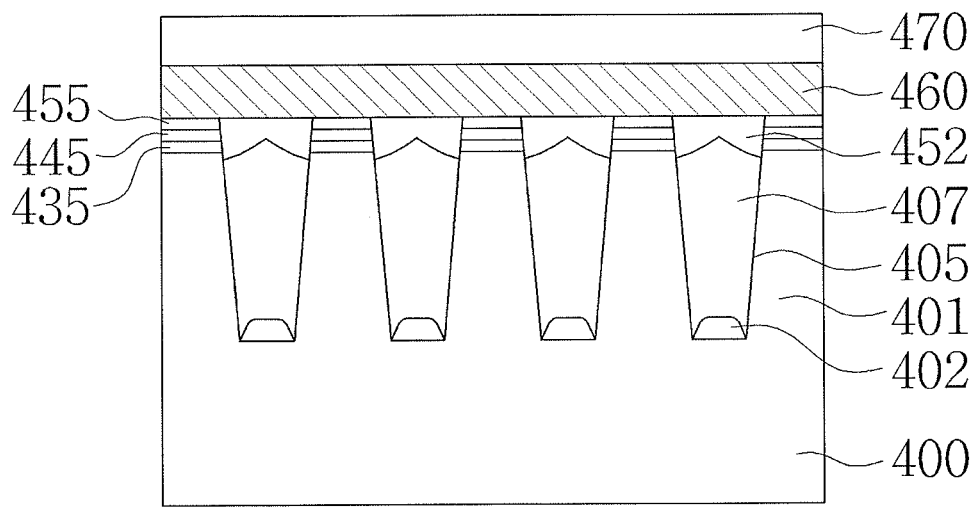

Referring to FIG. 4G, a semiconductor device according to a thirty-seventh exemplary embodiment may include active regions 401 formed on a substrate 400 and tunneling insulating layers 435, trap insulating layers 445, blocking insulating layers 455, a gate electrode 460, a gate capping layer 470, and leading insulating layers 452 stacked on the active regions 401. The leading insulating layers 452 may be formed in upper portions of the isolation trenches 405 under the blocking insulating layers 455 to hermetically seal the top portions of the isolation trenches 405. The leading insulating layer 452 may cover lateral surfaces of the tunneling insulating layers 435, the trap insulating layers 445, and the blocking insulating layers 455. The gate electrode 460 may be formed directly on the blocking insulating layers 455 and/or the leading insulating layers 452.

Figure 4H:
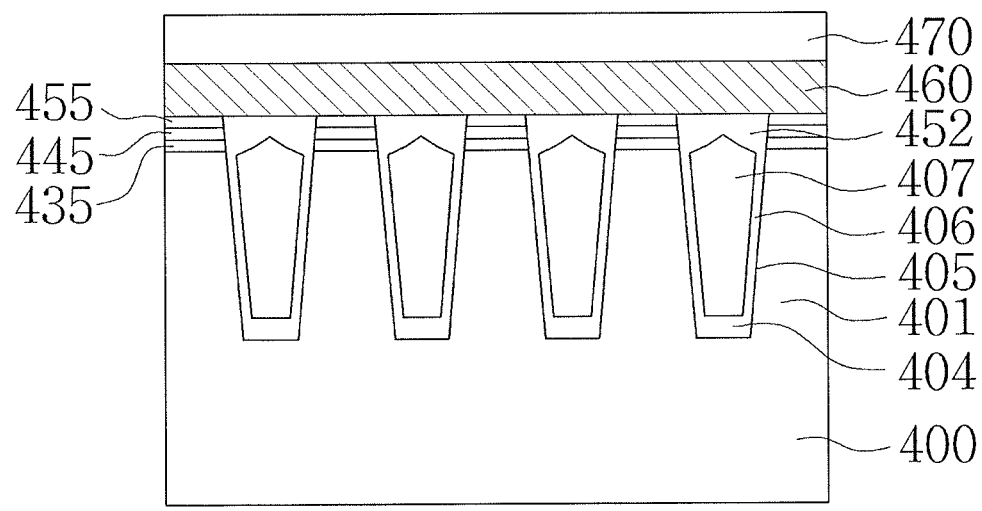

Referring to FIG. 4H, a semiconductor device according to a thirty-eighth exemplary embodiment may include active regions 401 formed on a substrate 400 and tunneling insulating layers 435, trap insulating layers 445, blocking insulating layers 455, a gate electrode 460, a gate capping layer 470, leading insulating layers 452, and a lining insulating layer 406 stacked on the active regions 401.

In the semiconductor devices including charge trap layers according to various exemplary embodiments, electrical interference, such as a parasitic capacitance, leakage of charges, and/or coupling, between adjacent ones of the trap insulating layers 445 and/or the active regions 401, may be reduced.

FIGS. 5A through 30 illustrate longitudinal sectional views depicting stages in methods of fabricating semiconductor devices according to various exemplary embodiments. Features described with respect to one exemplary embodiment may be incorporated into other embodiments (including other exemplary embodiments). Differences between the various exemplary embodiments are mainly described below.

Figure 5A:
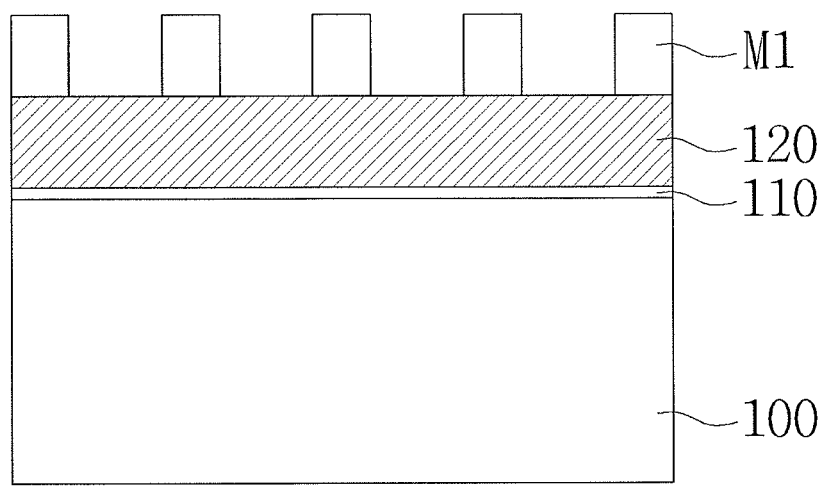
FIGS. 5A to 5F, 6A to 6D, 7A to 7C, 8A to 8C, 9A to 9D, 10A to 10D, 11A, 11B, 12A, 12B, 13, 14, 15A, 15B, 16A, 16B, 17A to 17C, 18A, 18B, 19, 20, 21A, 21B, 22A, 22B, 23A to 23C, 24A, 24B, and 25 to 30 illustrate longitudinal sectional views depicting stages in methods of fabricating semiconductor devices according to one or more exemplary embodiments.

Referring to FIG. 5A, a method of fabricating a semiconductor device according to a first exemplary embodiment may include forming a tunneling insulating layer 110 and a floating gate electrode layer 120 on a substrate 100.

For example, the tunneling insulating layer 110 may include a silicon oxide (SiO2) layer formed by thermally oxidizing a surface of the substrate 100. In applied embodiments, the tunneling insulating layer 110 may be formed of a high-k dielectric material, such as Al2O3, HfO2, ZrO2, La2O3, Ta2O3, TiO2, SrTiO3 (STO), or (Ba,Sr)TiO3 (BST), or a compound layer stacked by a combination thereof. For example, the tunneling insulating layer 110 may be formed using a chemical vapor deposition (CVD) process or an atomic layer deposition (ALD) process.

The floating gate electrode layer 120 may be formed by depositing poly-Si or a metal on the tunneling insulating layer 110. In applied embodiments, during the deposition of poly-Si, a dopant, such as phosphorus (P), arsenic (As), or boron (B), may be doped. In applied embodiments, the floating gate electrode layer 120 may be formed of a conductive material (e.g., a metal silicide, a metal nitride, or a metal) having a larger work function than doped poly-Si.

Mask patterns M1 may be formed on the floating gate electrode layer 120. Each of the mask patterns M1 may have a line shape from the plan view. Each of the mask patterns M1 may include a photoresist (PR) pattern or a hard mask having a silicon nitride layer or a stack structure of a silicon oxide layer and a silicon nitride layer.

Figure 5B:
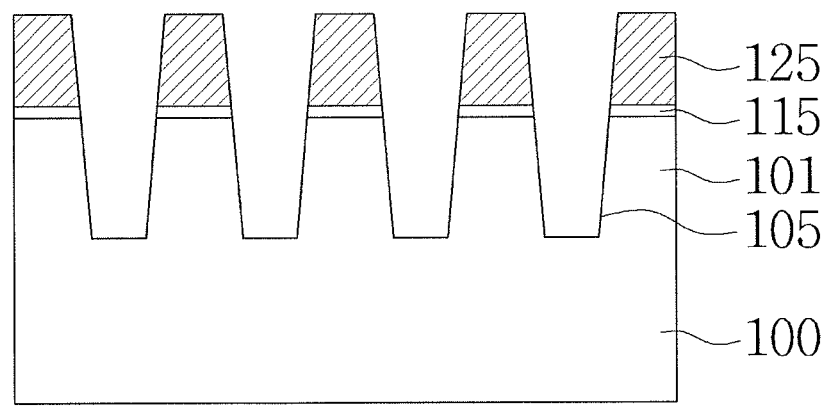

Referring to FIG. 5B, the method of fabricating the semiconductor device according to the first embodiment may include forming isolation trenches 105 defining active regions 101 within the substrate 100 using the mask patterns M1 as an etch mask. During the formation of the isolation trenches 105, patterned tunneling insulating layers 115 and floating gate electrodes 125 may be formed on the active regions 101 of the substrate 100. Subsequently, the mask patterns M1 may be removed.

Figure 5C:
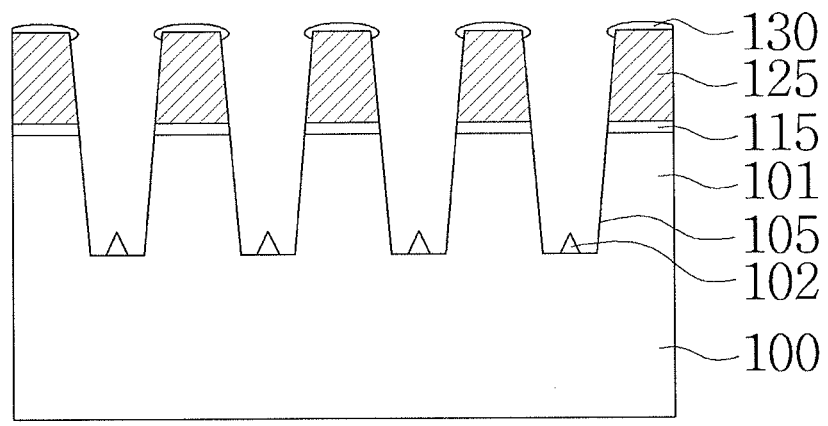

Referring to FIG. 5C, the method according to the first embodiment may include forming a lower insulating layer 130 on the floating gate electrodes 125. The lower insulating layer 130 may laterally extend from top surfaces of the floating gate electrodes 125 into upper portions of the isolation trenches 105. Each portion of the lower insulating layer 130 may cover an entire top surface of one of the floating gate electrodes 125 and may cover a portion of the lateral sides thereof. The lower insulating layer 130 may expose bottoms of the isolation trenches 105. For example, the lower insulating layer 130 may be formed to a relatively great thickness in corners of the floating gate electrodes 125. A bottom insulating layer 102 may be formed on the bottoms of the isolation trenches 105. The bottom insulating materials 102 may be a portion of the lower insulating layer 130, e.g., may be formed in a same process stage using a same material.

Figure 5D:
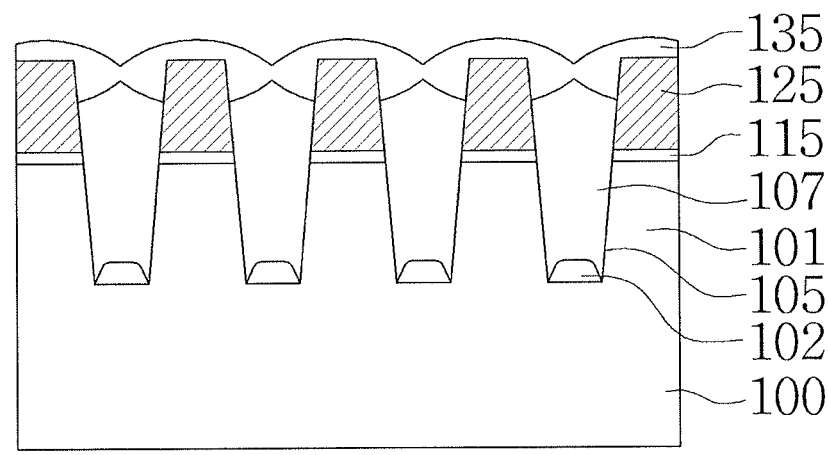

Referring to FIG. 5D, the method according to the first embodiment may include forming a lower insulating layer 135 to stop entrances of the isolation trenches 105. During the formation of the lower insulating layer 135, the lower insulating layer 135 may stop the entrances of the isolation trenches 105, thereby forming air gaps 107 within the isolation trenches 105.

Referring back to FIGS. 5C and 5D, the lower insulating layers 130 and 135 may include, e.g., a silicon oxide layer. In other embodiments, the lower insulating layers 130 and 135 may include a silicon nitride layer, a silicon oxynitride layer, or a metal oxide layer. For example, the lower insulating layers 130 and 135 may include a high-k dielectric material, such as Al2O3, HfO2, ZrO2, La2O3, Ta2O3, TiO2, SrTiO3 (STO), or (Ba,Sr)TiO3 (BST), or a compound layer stacked by a combination thereof.

The lower insulating layers 130 and 135 may be formed using an anisotropic etching process. According to an exemplary embodiment, the lower insulating layer 130 and 135 may be formed by means of a plasma-enhanced CVD (PECVD) process using gas cluster ion beams (CGIBs). The anisotropic etching process using the CGIBs may include a deposition process and an etching process. For example, the lower insulating layer 130 may be formed on top surfaces and corners of the floating gate electrodes 125 during the deposition process. Thereafter, the lower insulating layer 130 formed on the top surfaces of the floating gate electrodes 125 may be partially removed during the etching process. The lower insulating layer 130 formed on the corners of the floating gate electrodes 125 may be removed by a smaller amount than the lower insulating layer 130 formed on the top surfaces of the floating gate electrodes 125, e.g., so that the lower insulating layer 130 may expand more in a direction toward adjacent floating gate electrodes 125 than in an upward direction. The lower insulating layer 130 may be deposited on the corners of the floating gate electrodes 125 at a higher deposition rate than on the top surfaces of the floating gate electrodes 125.

Due to, e.g., repetition of the deposition and etching processes, the lower insulating layer 130 may laterally extend, e.g., in the direction toward adjacent floating gate electrodes 125, and cover the entrances of the isolation trenches 105. Accordingly, the lower insulating layer 135 having the air gaps 107 thereunder may be formed. When the etching process is performed for a shorter duration of time than the deposition process, the lower insulating layer 130 may be thicker than in FIG. 5C in an upward direction, that is, have a spherical shape.

Generation of the GCIBs may involve forming neutral clusters by rapidly expanding a source gas containing a mixture of various gases, forming ion beams by ionizing the neutral clusters, and obtaining monomer ions by filtering the ionized cluster ion beams. As a result, the GCIB may contain combinations of several hundreds of atoms to several thousands of atoms. A gas cluster refers to a nanoscale agglomerate of a material that is in a vapor state under conditions of standard temperature and pressure. The gas cluster may be an agglomerate containing at least several to several thousand molecules, or more loosely combined with one another. The gas cluster may be ionized due to electron bombardment to generate ion beams having a controllable energy. Each of the cluster ions may have a positive charge provided by the product of a charge size and an integer equal to or more than 1, which indicates a charge state of the cluster ion. A larger magnitude of cluster ions may have a relatively low energy per individual molecule and a relatively high energy per cluster ion.

When the lower insulating layer 130 includes a silicon oxide, GCIBs generated using an oxygen (O)-containing gas, for example, at least one of O2, NP, NO2, N2O, CO, and CO2, may be employed. When the lower insulating layer 130 includes a nitride layer, GCIBs generated using a nitrogen (N)-containing gas, for example, at least one of N2, NO, NO2, N2O, and NH3, may be employed. When the lower insulating layer 130 includes oxynitride, GCIBs generated using an O-containing gas and an N-containing gas may be employed.

In exemplary embodiments, the thickness of the lower insulating layer 130 may depend on a direction in which the GCIBs are incident. For example, a rate at which the lower insulating layer 130 is deposited on a surface vertical to the direction in which the GCIBs are incident may be lower than a rate at which the lower insulating layer 130 is deposited on a surface inclined at an angle with respect to the direction in which the GCIBs are incident. Due to, e.g., the collision of the GCIBs with the corners of the floating gate electrodes 125, and the lower insulating layer 130 may be laterally grown to cover the isolation trenches 105. For example, a rate of deposition may be lower on an uppermost surface of the floating gate electrodes 125 than on sidewalls of the floating gate electrodes 125. Since the lower insulating layer 130 is laterally deposited on the corners of the floating gate electrodes 125, overhangs may occur at the entrances of the isolation trenches 105 to cover the entrances of the isolation trenches 105.

The lower insulating layer 135 may have a curved shape. For example, the lower insulating layer 135 formed on the floating gate electrodes 125 may have a different vertical thickness from the lower insulating layer 135 formed on the isolation trenches 105. The thickness of the lower insulating layer 135 formed on the floating gate electrodes 125 may be about ½ the horizontal width of the isolation trenches 105. That is, the drawings are exaggerated for clarity. According to an exemplary embodiment, the lower insulating layer 135 formed on the floating gate electrodes 125 may have a minimum vertical thickness of about 5 to 10 nm. The isolation trenches 105 may have a horizontal width of about 10 to 230 nm.

During the process of forming the lower insulating layer 135, the bottom insulating materials 102 may also be formed. For example, during ones of the total deposition and etching processes used to form the lower insulating layer 135 that covers the isolation trenches 105, the bottom insulating materials 102 may also be laterally and horizontally grown to cover the bottoms of the isolation trenches 105.

Subsequently, referring back to FIG. 1A, the method according to the first embodiment may include forming a control gate electrode 160 and a gate capping layer 170 on the lower insulating layer 135. The control gate electrode 160 may be formed by depositing a poly-Si layer or a metal layer. During the deposition of the poly-Si layer, a dopant, such as P or B, may be doped therein.

The gate capping layer 170 may be formed by depositing an insulating material, such as SiO2, SiN, SiON, or SiCN, using a CVD process or an ALD process. Alternatively, the gate capping layer 170 may be formed by depositing a barrier material, such as Ti/TiN, TaO, or TaN, using a CVD process or an ALD process. When the gate capping layer 170 includes a barrier material, the gate capping layer 160 may be formed to a comparatively smaller thickness.

Figure 5E:
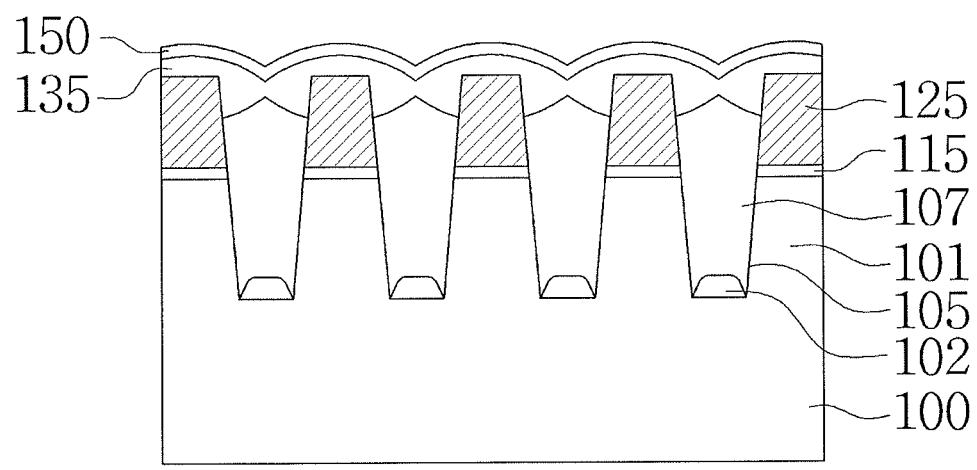

Referring to FIG. 5E, a method of fabricating a semiconductor device according to a second exemplary embodiment may further include forming an upper insulating layer 150 on the lower insulating layer 135, after performing the processes described with reference to FIG. 5D. The upper insulating layer 150 may be conformally formed on a top surface of the lower insulating layer 135. The upper insulating layer 150 may be formed using a deposition technique (e.g., a CVD technique and an ALD technique) having a good step coverage characteristic. The upper insulating layer 150 may be formed of an insulating material having a higher energy bandgap than the lower insulating layer 140.

The upper insulating layer 150 may be formed of a material having a higher dielectric constant than the lower insulating layer 135. For example, the upper insulating layer 150 may be formed of a high-k dielectric material, such as Al2O3, HfO2, ZrO2, La2O3, Ta2O3, TiO2, SrTiO3 (STO), or (Ba,Sr)TiO3 (BST), or a compound layer stacked by a combination thereof. Subsequently, referring back to FIG. 1B, the method according to the second embodiment may further include forming a control gate electrode 160 and a capping layer 170 on the upper insulating layer 150.

Figure 5F:
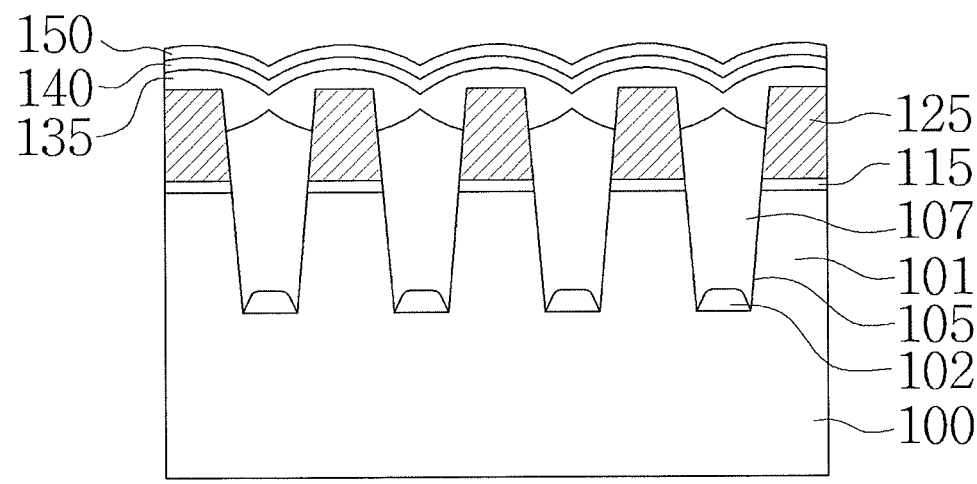

Referring to FIG. 5F, a method of fabricating a semiconductor device according to a third exemplary embodiment may include forming a middle insulating layer 140 and an upper insulating layer 150 on the lower insulating layer 135 after the processes described with reference to FIG. 5D. The middle insulating layer 140 and the upper insulating layer 150 may be conformally formed on a top surface of the lower insulating layer 135. The middle insulating layer 140 may be formed using a deposition technique (e.g., a CVD technique or an ALD technique) having a good step coverage characteristic.

The middle insulating layer 140 may include at least one of a silicon nitride layer, a silicon oxynitride layer, a Si-rich nitride layer, nanocrystalline silicon, and a laminated trap layer. The upper insulating layer 150 may be formed of an insulating material having a higher energy bandgap than the middle insulating layer 140. Subsequently, referring back to FIG. 1C, the method according to the third embodiment may include forming a control gate electrode 160 and a gate capping layer 170 on the upper insulating layer 150. The middle insulating layer 140 may be formed by depositing a silicon nitride, a silicon oxynitride, a Si-rich nitride, nanocrystalline silicon, or a laminated trap layer using a CVD process or an ALD Process.

Figure 6A:
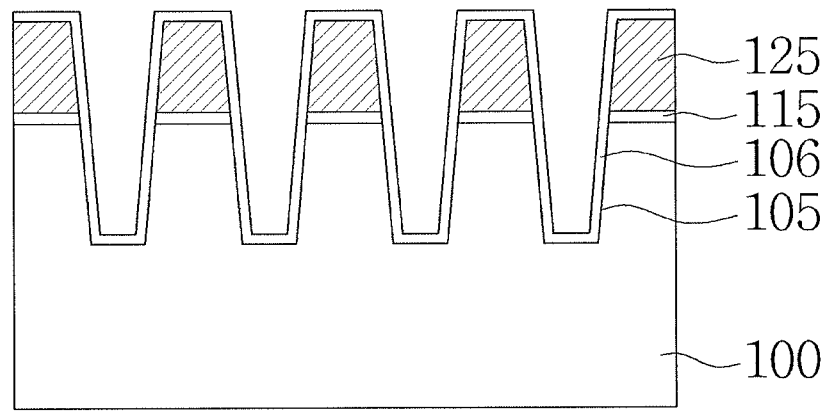

Referring to FIG. 6A, a method of fabricating a semiconductor device according to a fourth exemplary embodiment may further include conformally forming a lining insulating layer 106 on inner walls of isolation trenches 105 after the processes described with reference to FIGS. 5A and 5B. During the formation of the isolation trenches 105, defects, such as silicon dangling bonds, may occur on the inner walls of the isolation trenches 105. An oxidation process may be performed to cure the defects caused to the inner walls of the isolation trenches 105. For example, the lining insulating layer 106 may be a silicon oxide layer obtained using a thermal oxidation process or an oxygen (O2) plasma treatment or a silicon nitride layer. The lining insulating layer 106 may be formed on lateral surfaces of a patterned tunneling insulating layer 115 and top and lateral surfaces of floating gate electrodes 125, e.g., as illustrated in FIG. 6A.

Figure 6B:
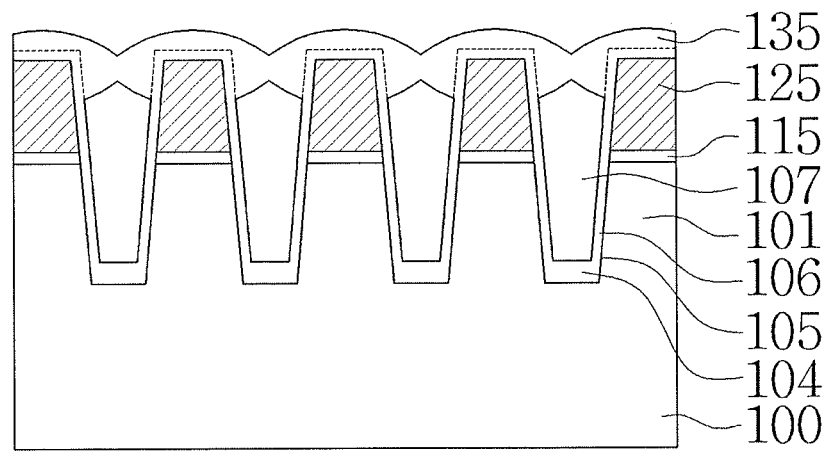

Referring to FIG. 6B, the method according to the fourth embodiment may include forming a lower insulating layer 135, e.g., with reference back to FIGS. 5C and 5D. Air gaps 107 may be defined by the lower insulating layer 135 within the isolation trenches 105. An interface between the lining insulating layer 106 and the lower insulating layer 135 may disappear. That is, there may be an imaginary interface between the lining insulating layer 106 and the lower insulating layer 135. Accordingly, the interface between the lining insulating layer 106 and the lower insulating layer 135 is illustrated with dotted lines.

A bottom insulating material 104 may be formed on bottoms of the isolation trenches 105 to a greater thickness than the lining insulating layer 106 formed on the inner walls of the isolation trenches 105. A boundary between the bottom insulating material 104 and the lining insulating layer 106 may not be apparent, e.g., may disappear similar to the interface between the lining insulating layer 106 and the insulating layer 135. A lower portion of the bottom insulating material 104 may be formed during the forming of the lining insulating layer 106 and an upper portion of the bottom insulating material 104 may be formed during the forming of the lower insulating layer 135. Afterwards, referring to FIG. 1D, the method according may include forming a control gate electrode 160 and a gate capping layer 170 on the lower insulating layer 135.

Figure 6C:
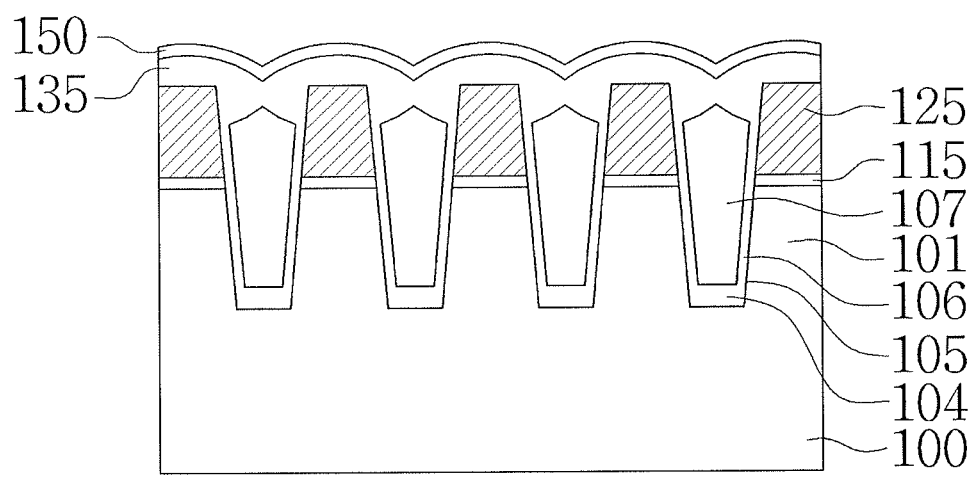

Referring to FIG. 6C, a method of fabricating a semiconductor device according to a fifth exemplary embodiment may include forming an upper insulating layer 150 on a lower insulating layer 135 after the processes described with reference to FIGS. 5A, 5B, 6A, and 6B. Subsequently, referring to FIG. 1E, the method may include forming a control gate electrode 160 and a gate capping layer 170 on the upper insulating layer 150.

Figure 6D:
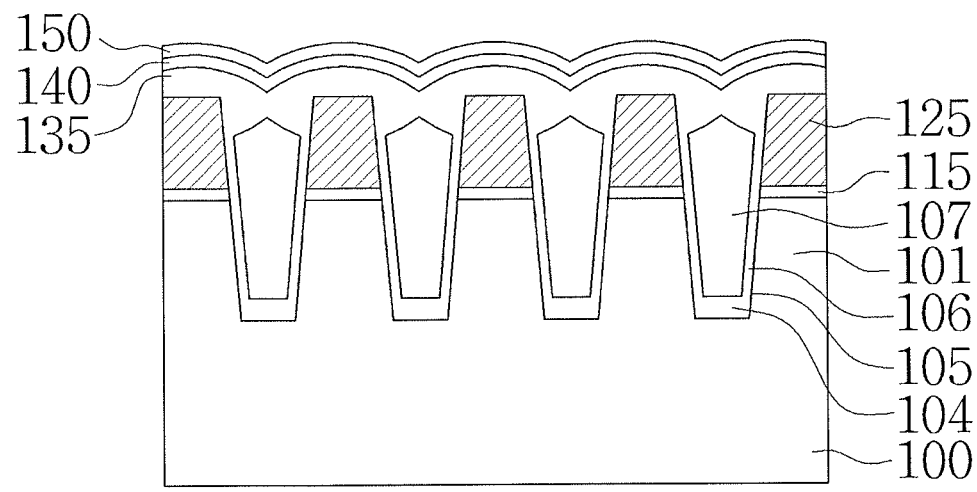

Referring to FIG. 6D, a method of fabricating a semiconductor device according to a sixth exemplary embodiment may include forming a middle insulating layer 140 and an upper insulating layer 150 on a lower insulating layer 135 after the processes described with reference to FIGS. 5A, 5B, 6A, and 6B. Afterwards, referring to FIG. 1F, the method may include forming a control gate electrode 160 and a gate capping layer 170 on an upper insulating layer 150.

Figure 7A:
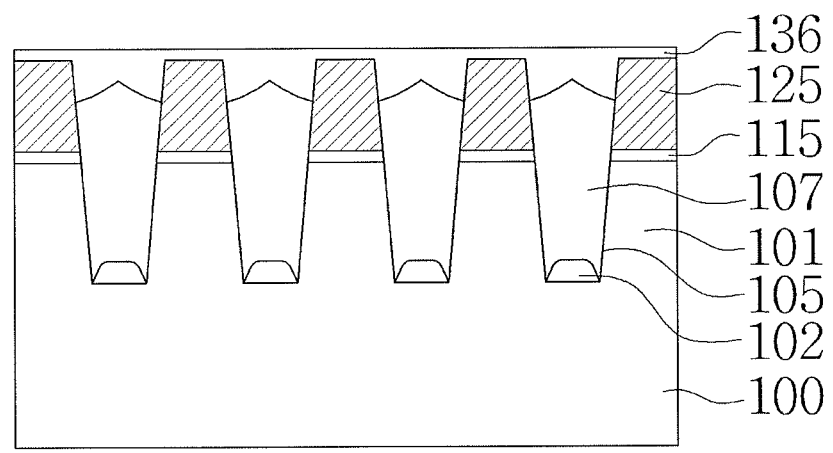

Referring to FIG. 7A, a method of fabricating a semiconductor device according to a seventh exemplary embodiment may include forming a lower insulating layer 135 having a planarized top surface by planarizing a surface of the lower insulating layer 136 so as not to expose air gaps 107, after the processes described with reference to FIGS. 5A through 5D. Afterwards, an annealing process may be performed on the planarized top surface of the lower insulating layer 136. For example, the annealing process may be a thermal process or plasma process performed in the atmosphere of hydrogen or nitrogen gas. Subsequently, referring back to FIG. 1G, the method may include forming a control gate electrode 160 and a gate capping layer 170 on the planarized lower insulating layer 136.

Figure 7B:
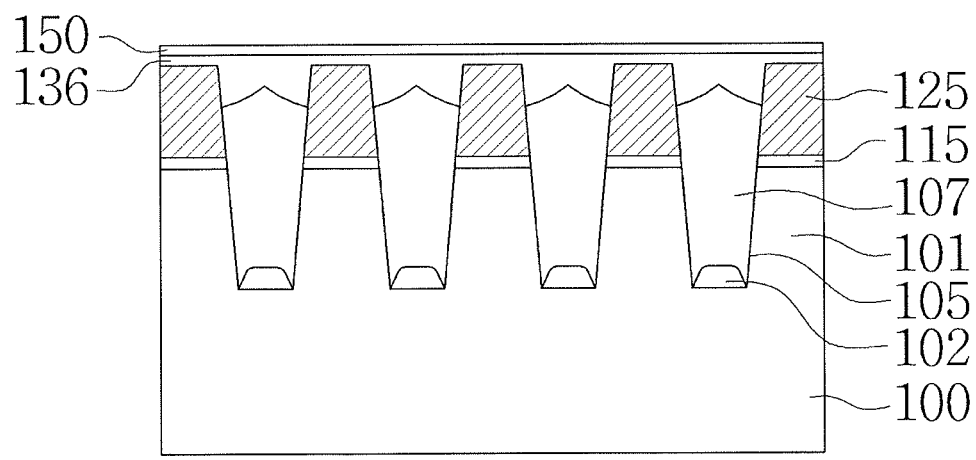

Referring to FIG. 7B, a method of fabricating a semiconductor device according to an eighth exemplary embodiment may include forming an upper insulating layer 150 on a lower insulating layer 136. Afterwards, referring to FIG. 1H, the method according to the eighth embodiment may include forming a control gate electrode 160 and a gate capping layer 170 on the upper insulating layer 150.

Figure 7C:
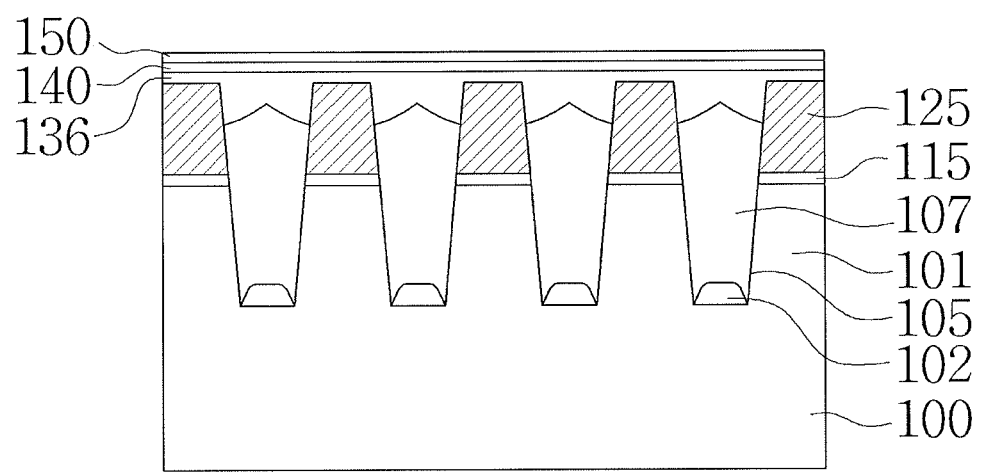

Referring to FIG. 7C, a method of fabricating a semiconductor device according to a ninth exemplary embodiment may include forming a middle insulating layer 140 and an upper insulating layer 150 on a planarized lower insulating layer 136. Afterwards, referring to FIG. 1I, the method may include forming a control gate electrode 160 and a gate capping layer 170 on the upper insulating layer 150.

Figure 8A:
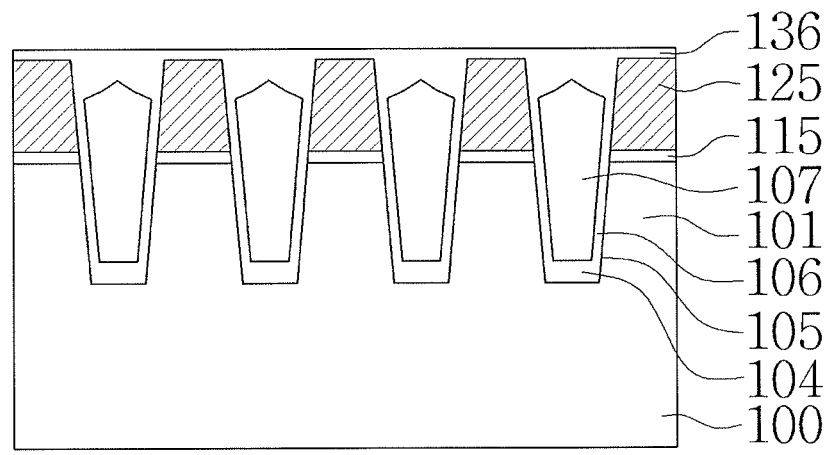

Referring to FIG. 8A, a method of fabricating a semiconductor device according to a tenth exemplary embodiment may include forming a lower insulating layer 136 having a planarized top surface by planarizing a surface of the lower insulating layer 135 not to expose air gaps 107. Afterwards, an annealing process may be performed on the surface of the planarized lower insulating layer 136. Subsequently, referring to FIG. 1J, the method according may include forming a control gate electrode 160 and a gate capping layer 170 on the planarized lower insulating layer 136.

Figure 8B:
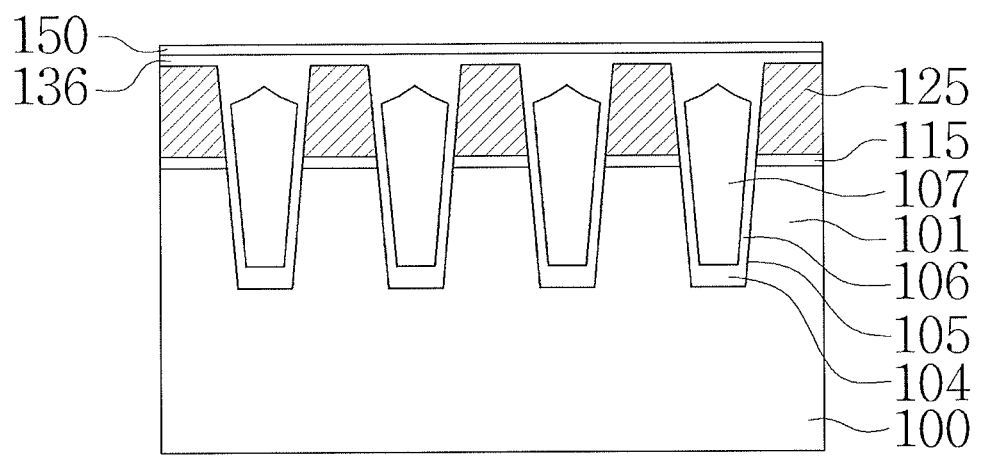

Referring to FIG. 8B, a method of fabricating a semiconductor device according to an eleventh exemplary embodiment may include forming an upper insulating layer 150 on a planarized lower insulating layer 136. Subsequently, referring to FIG. 1K, the method may include forming a control gate electrode 160 and a gate capping layer 170 on the upper insulating layer 150.

Figure 8C:
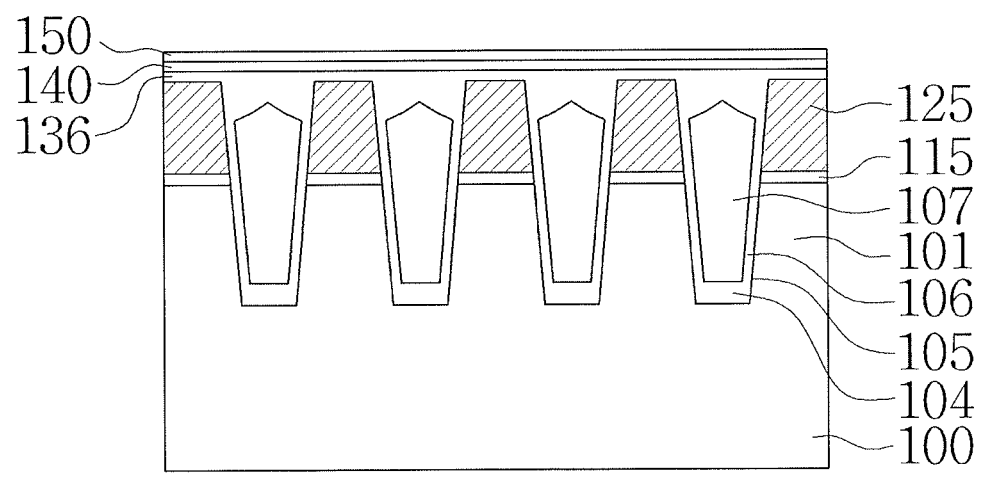

Referring to FIG. 8C, a method of fabricating a semiconductor device according to a twelfth exemplary embodiment may include forming a middle insulating layer 140 and an upper insulating layer 150 on a planarized lower insulating layer 136. Subsequently, referring to FIG. 1I, the method according may include forming a control gate electrode 160 and a gate capping layer 170 on the upper insulating layer 150.

Figure 9A:
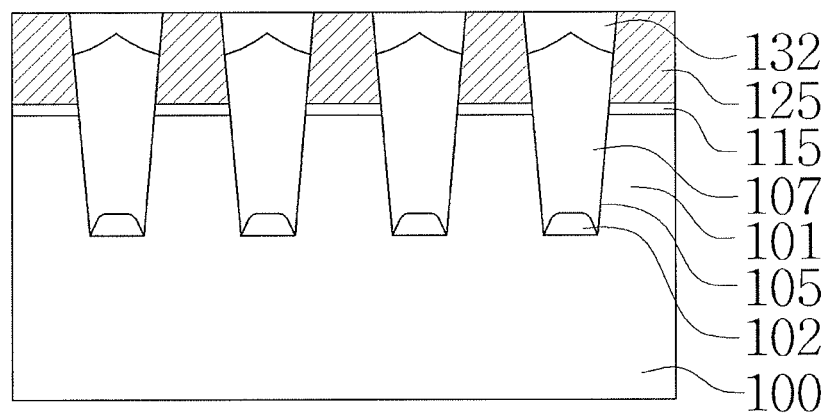

Referring to FIG. 9A, a method of fabricating a thirteenth exemplary embodiment may include forming a leading insulating layer 132 defining air gaps 107 by planarizing a lower insulating layer 135 of FIG. 5D until surfaces of floating gate electrodes 125 are exposed, after the processes described with reference to FIGS. 5A through 5D are performed.

Figure 9B:
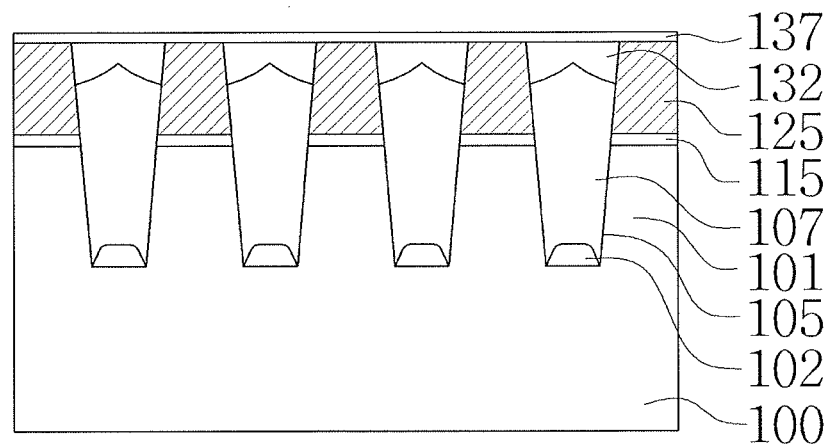

Referring to FIG. 9B, the method of fabricating the thirteenth exemplary embodiment may include forming a lower insulating layer 137 having both planarized top and bottom surfaces on the exposed floating gate electrodes 125 and the leading insulating layer 132. The lower insulating layer 137 may include the same material as the lower insulating layers 135 according to other embodiments. Afterwards, referring back to FIG. 1M, the method according may include forming a control gate electrode 160 and a gate capping layer 170 on the lower insulating layer 137.

Figure 9C:
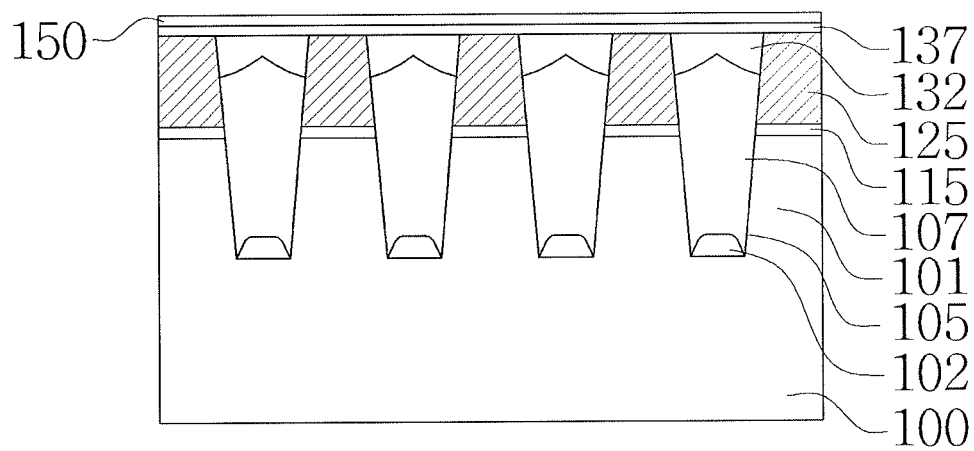

Referring to FIG. 9C, a method of fabricating a semiconductor device according to a fourteenth embodiment may include forming an upper insulating layer 150 on a lower insulating layer 137 after the processes described with reference to FIG. 9B. Afterwards, referring to FIG. 1N, the method according to the fourteenth embodiment may include forming a control gate electrode 160 and a gate capping layer 170 on the upper insulating layer 150.

Figure 9D:
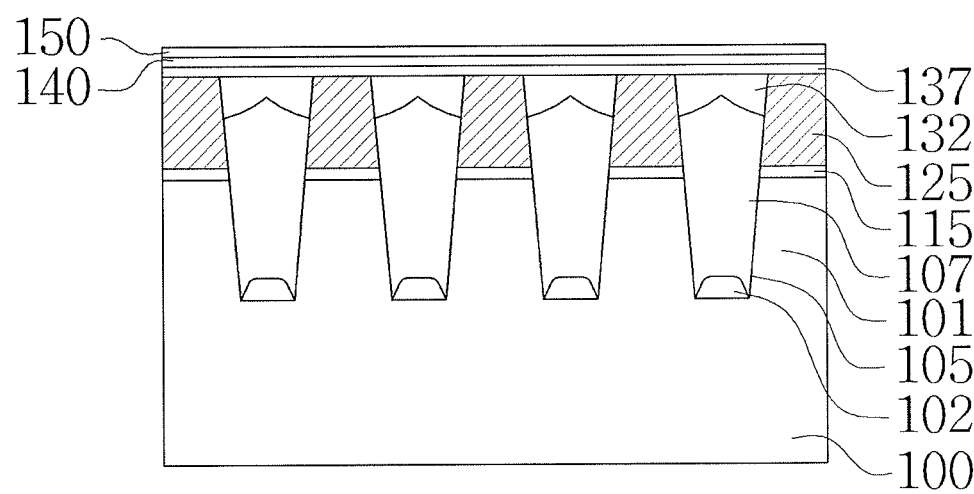

Referring to FIG. 9D, a method of fabricating a fifteenth exemplary embodiment may include forming a middle insulating layer 140 and an upper insulating layer 150 on a lower insulating layer 137 after the processes described with reference to FIG. 9B. Afterwards, referring back to FIG. 1O, the method according to the fifteenth embodiment may include forming a control gate electrode 160 and a gate capping layer 170 on the upper insulating layer 150.

Figure 10A:
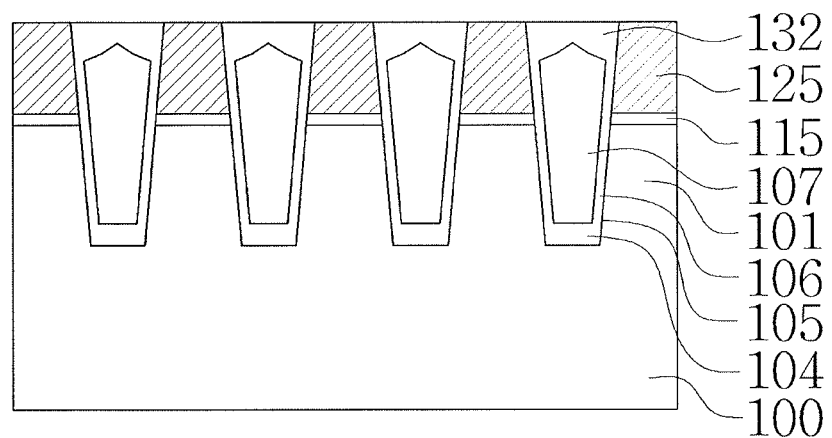

Referring to FIG. 10A, a method of fabricating a sixteenth exemplary embodiment may include forming a leading insulating layer 132 defining air gaps 107 by planarizing a lower insulating layer 135 until surfaces of floating gate electrodes 125 of FIG. 6B are exposed, after the processes described with reference to FIGS. 6A and 6B are performed.

Figure 10B:
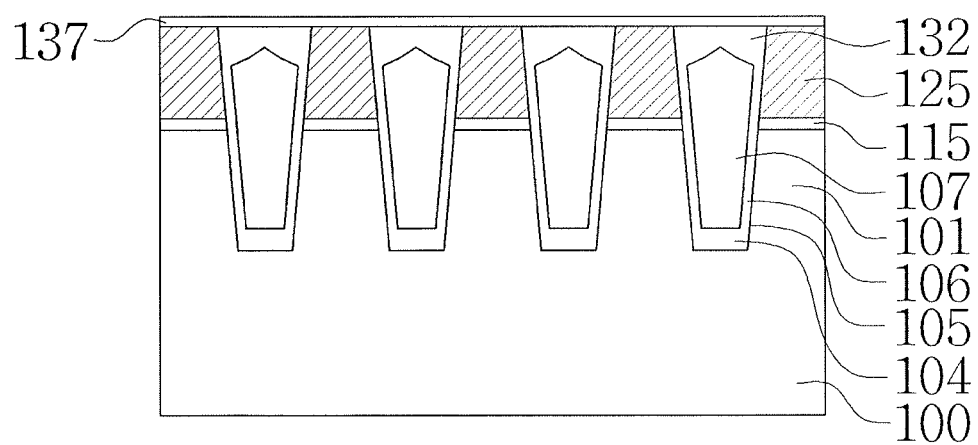

Referring to FIG. 10B, the method of fabricating a semiconductor device according to the sixteenth exemplary embodiment may include forming a lower insulating layer 137 on the exposed floating gate electrodes 125 and the leading insulating layer 132. Afterwards, referring back to FIG. 1P, the method may include forming a control gate electrode 160 and a gate capping layer 170 on the lower insulating layer 137.

Figure 10C:
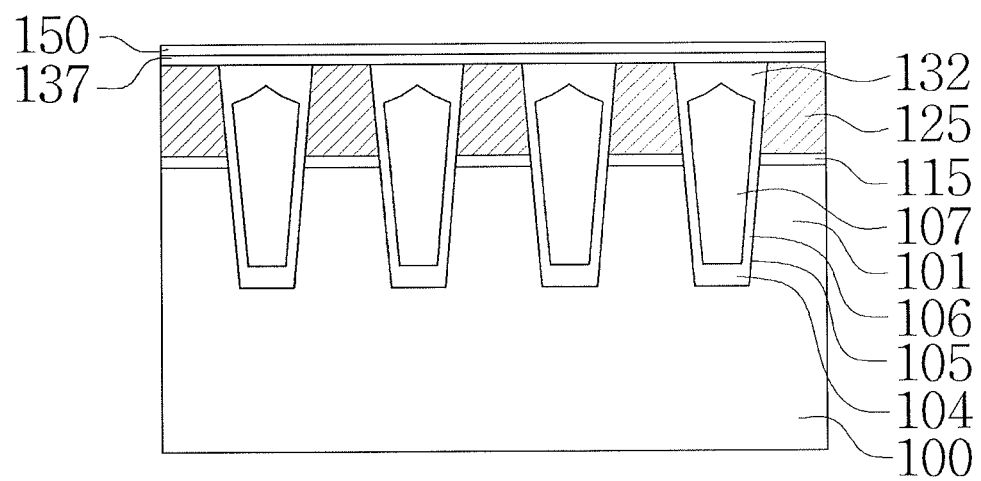

Referring to FIG. 10C, a method of fabricating a seventeenth exemplary embodiment may include forming an upper insulating layer 150 on a lower insulating layer 137 after the processes described with reference to FIG. 10B. Afterwards, referring to FIG. 1Q, the method according to the seventeenth embodiment may include forming a control gate electrode 160 and a gate capping layer 170 on the upper insulating layer 150.

Figure 10D:
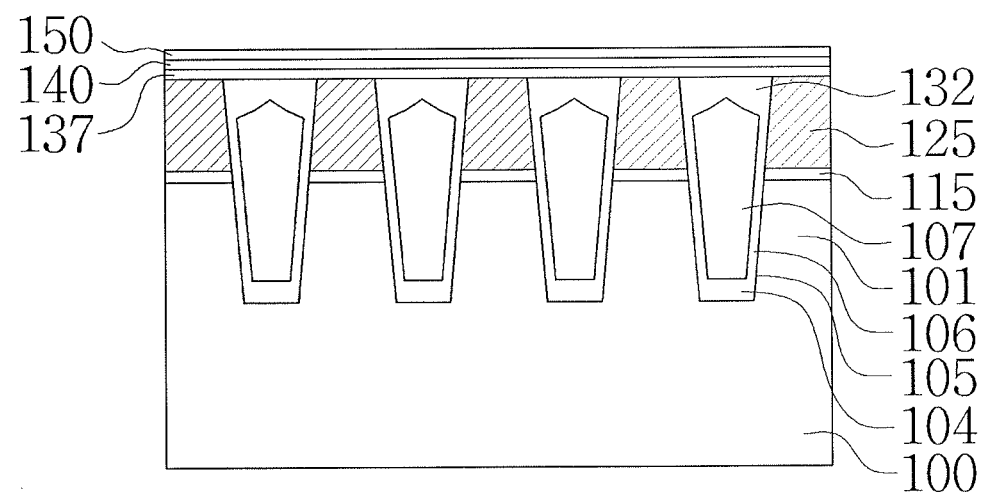

Referring to FIG. 10D, a method of fabricating a semiconductor device according to an eighteenth exemplary embodiment may include forming a middle insulating layer 140 and an upper insulating layer 150 on a lower insulating layer 137 after the processes described with reference to FIG. 10B. Afterwards, referring back to FIG. 1R, the method according to the eighteenth embodiment may include forming a control gate electrode 160 and a gate capping layer 170 on the upper insulating layer 150.

Figure 11A:
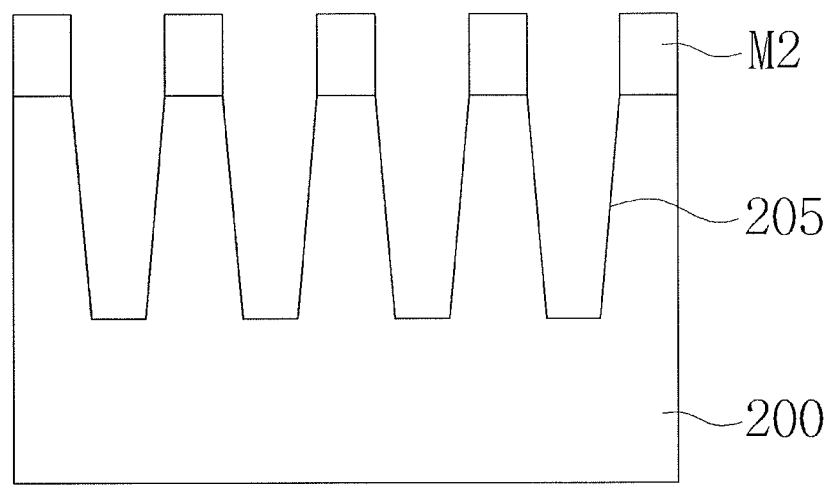

Referring to FIG. 11A, a method of fabricating a semiconductor device according to a nineteenth exemplary embodiment may include forming mask patterns M2 on a substrate 200 for fabricating a semiconductor device and forming isolation trenches 205 defining active regions 201 within the substrate 200. Each of the mask patterns M2 may be multi-layered. A lower layer of each of the mask patterns M2 may include a silicon oxide, while an upper layer thereof may include a silicon nitride. Subsequently, the mask patterns M2 may be removed.

Figure 11B:
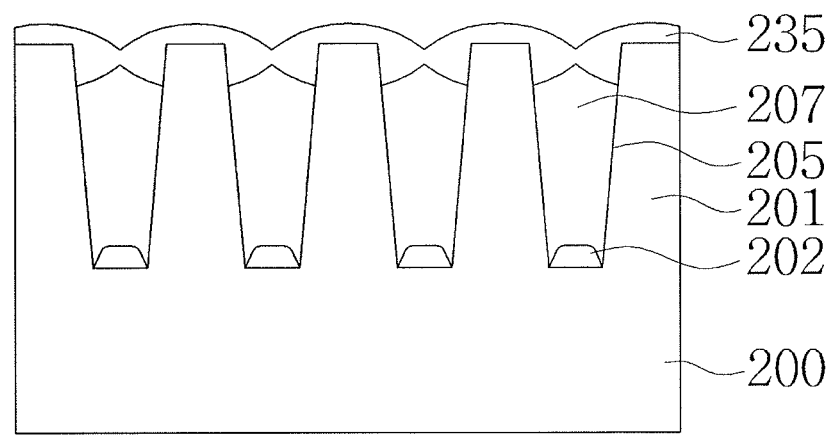

Referring to FIG. 11B, the method of fabricating a semiconductor device according to the nineteenth exemplary embodiment may include forming a tunneling insulating layer 235 on active regions 201 to cover upper portions of the isolation trenches 205 by performing the processes described with reference to FIGS. 5C and 5D. Air gaps 207 may be defined by the tunneling insulating layer 235 within the isolation trenches 205. Bottom insulating materials 202 may be formed on bottom surfaces of the isolation trenches 205. Afterwards, referring to FIG. 2A, the method may include forming a trap insulating layer 240, a blocking insulating layer 250, a gate electrode 260, and a gate capping layer 270 on the tunneling insulating layer 235.

Figure 12A:
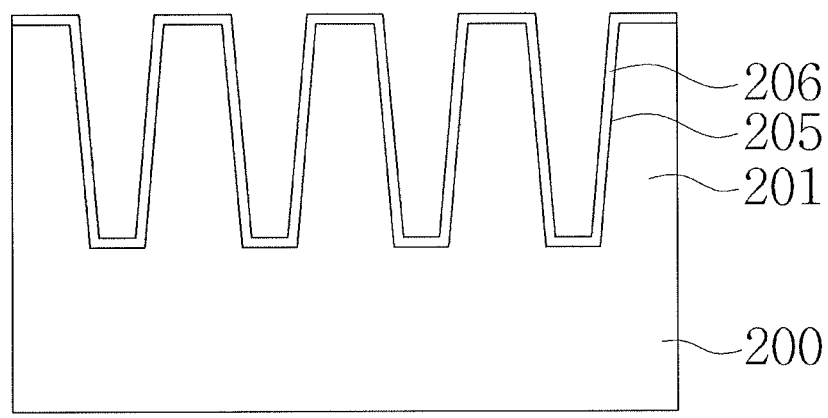

Referring to FIG. 12A, a method of fabricating a semiconductor device according to a twentieth exemplary embodiment may include conformally forming a lining insulating layer 206 on inner walls of isolation trenches 205 after the processes described with reference to FIG. 11A. The formation of the lining insulating layer 206 may be performed when the mask patterns M2 of FIG. 11A are not removed.

Figure 12B:
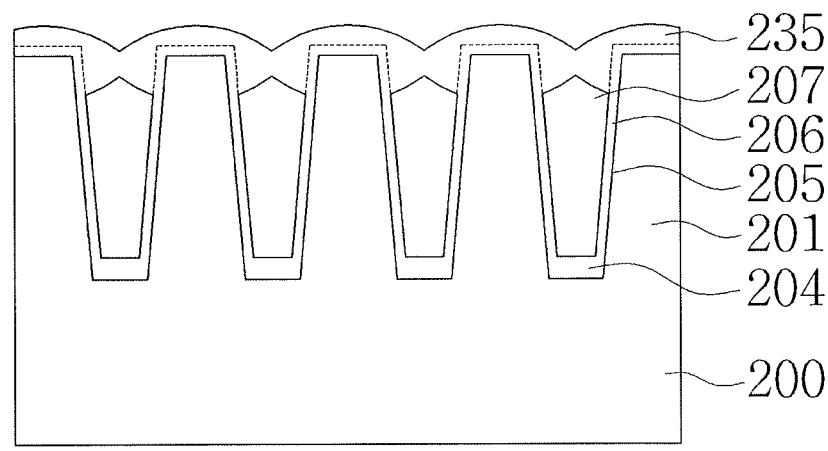

Referring to FIG. 12B, the method of fabricating a semiconductor device according to the twentieth exemplary embodiment may include forming a tunneling insulating layer 235. Air gaps 207 may be defined by the tunneling insulating layer 235 within the isolation trenches 205. An interface between the lining insulating layer 206 and the tunneling insulating layer 235 may disappear. That is, there may be an imaginary interface between the lining insulating layer 206 and the tunneling insulating layer 235. Accordingly, the interface between the lining insulating layer 206 and the tunneling insulating layer 235 is illustrated with dotted lines.

A bottom insulating material 204 may be formed on bottom surfaces of the isolation trenches 205 to a greater thickness than the lining insulating layer 206 formed on the inner walls of the isolation trenches 205. A boundary between the bottom insulating material 204 and the lining insulating layer 206 may disappear. Afterwards, referring to FIG. 2B, the method according may include forming a trap insulating layer 240, a blocking insulating layer 250, a gate electrode 260, and a gate capping layer 270 on the tunneling insulating layer 235.

Figure 13:
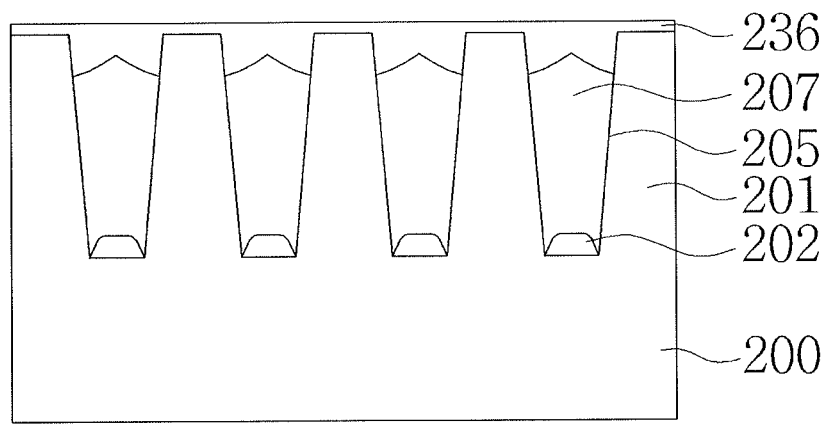

Referring to FIG. 13, a method of fabricating a semiconductor device according to a twenty-first exemplary embodiment may include forming a planarized lower insulating layer 236 using a planarization process after the processes described with reference to FIG. 11B. The method according to the twenty-first embodiment may include annealing the planarized lower insulating layer 236. Afterwards, referring back to FIG. 2C, the method may include forming a trap insulating layer 240, a blocking insulating layer 250, a gate electrode 260, and a gate capping layer 270 on the planarized lower insulating layer 236.

Figure 14:
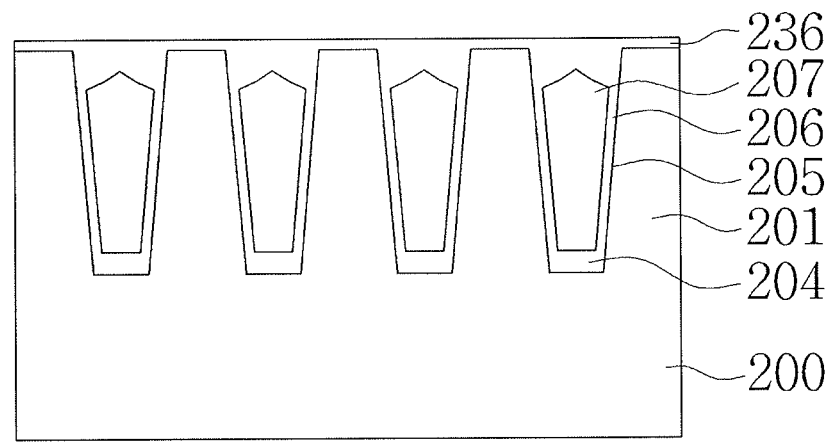

Referring to FIG. 14, a method of fabricating a semiconductor device according to a twenty-second exemplary embodiment may include forming a planarized lower insulating layer 236 using a planarization process after the processes described with reference to FIG. 12A. The method according to the twenty-second embodiment may further include annealing the planarized lower insulating layer 236. Afterwards, referring back to FIG. 2D, the method may include forming a trap insulating layer 240, a blocking insulating layer 250, a gate electrode 260, and a gate capping layer 270 on the planarized lower insulating layer 236.

Figure 15A:
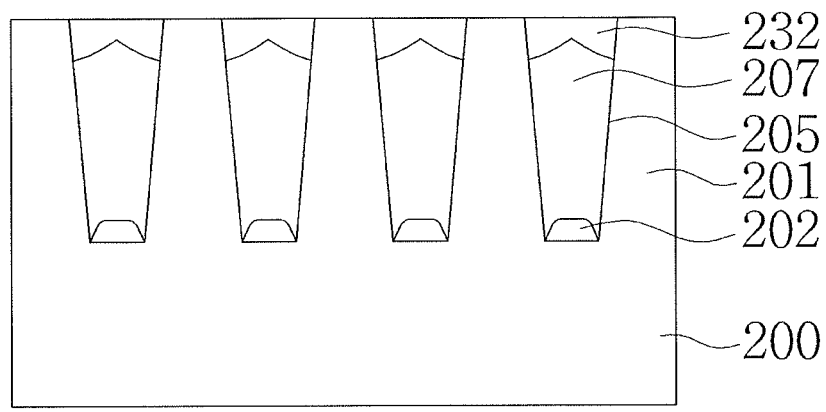

Referring to FIG. 15A, a method of fabricating a semiconductor device according to a twenty-third exemplary embodiment may include forming a leading insulating layer 232 by performing a planarization process until surfaces of active regions 201 are exposed, after the processes described with reference to FIG. 11B are performed.

Figure 15B:
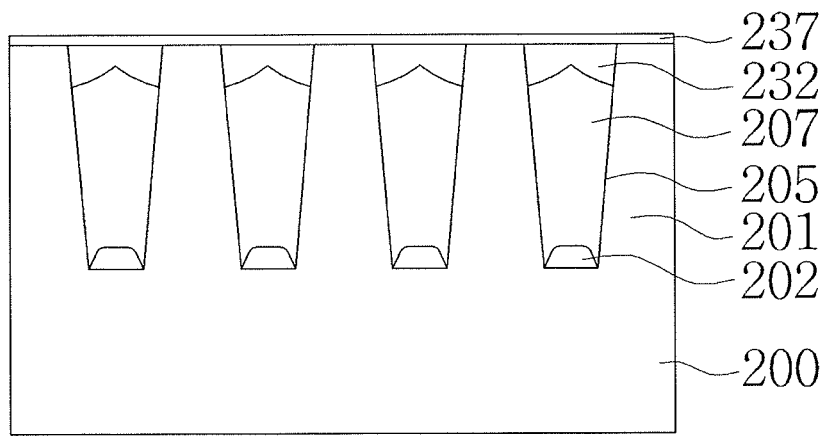

Referring to FIG. 15B, the method of fabricating the twenty-third exemplary embodiment may include forming a planarized lower insulating layer 237 on the leading insulating layer 232 and the active regions 201. Afterwards, referring to FIG. 2E, the method may include forming a trap insulating layer 240, a blocking insulating layer 250, a gate electrode 260, and a gate capping layer 270 on the lower insulating layer 237.

Figure 16A:
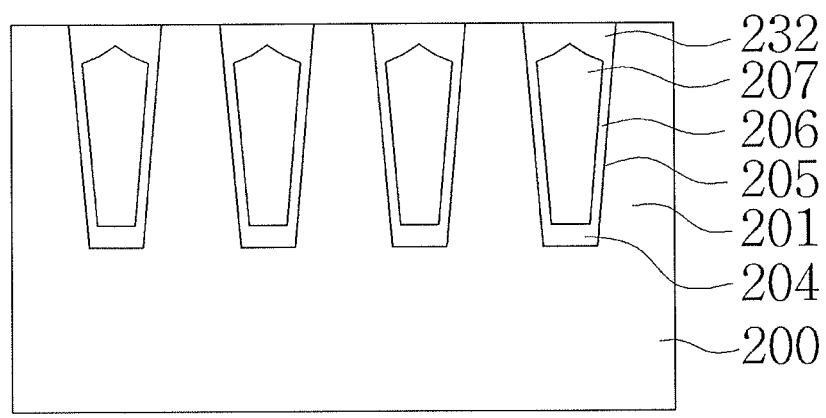

Referring to FIG. 16A, a method of fabricating a semiconductor device according to a twenty-fourth exemplary embodiment may include forming a leading insulating layer 232 by performing a planarization process until surfaces of active regions 201 are exposed, after the processes described with reference to FIG. 12B are performed.

Figure 16B:
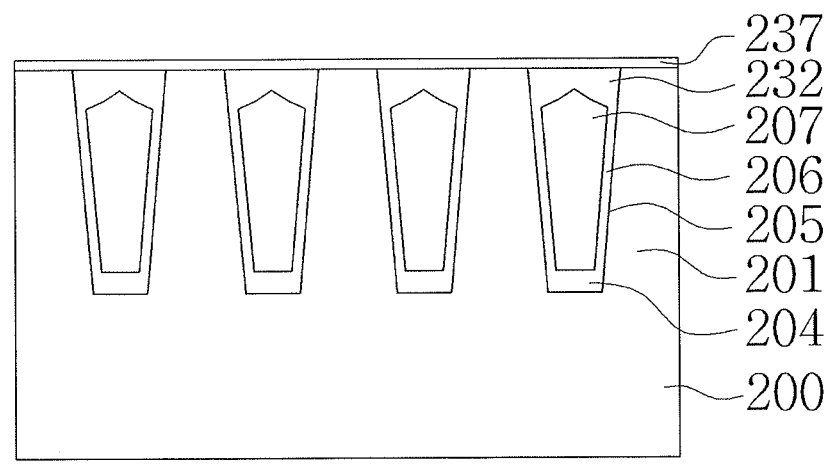

Referring to FIG. 16B, the method of fabricating the twenty-fourth exemplary embodiment may include forming a planarized lower insulating layer 237 on the leading insulating layer 232 and the active regions 201. Subsequently, referring to FIG. 2F, the method may include forming a trap insulating layer 240, a blocking insulating layer 250, a gate electrode 260, and a gate capping layer 270 on the lower insulating layer 237.

Figure 17A:
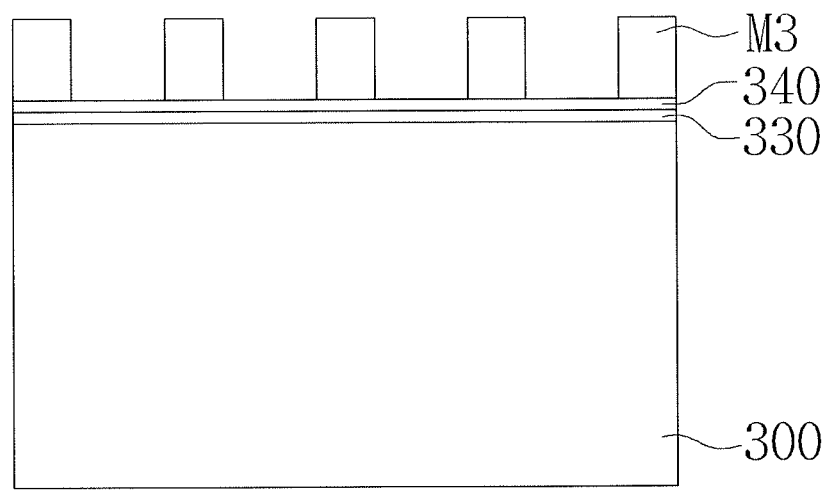

Referring to FIG. 17A, a method of fabricating a semiconductor device according to a twenty-fifth exemplary embodiment may include forming a tunneling insulating layer 330 and a trap insulating layer 340 on a substrate 300.

The tunneling insulating layer 330 may be, for example, a silicon oxide ($SiO_2$) layer obtained by thermally oxidizing a surface of the substrate 300. In exemplary embodiments, the tunneling insulating layer 330 may be formed of a metal oxide. In exemplary embodiments, the tunneling insulating layer 330 may be formed using a CVD process or an ALD process.

The trap insulating layer 340 may be formed of at least one of a silicon nitride layer, a silicon oxynitride layer, a Si-rich nitride layer, a nanocrystalline silicon layer, and a laminated trap layer using a CVD process or an ALD process.

Mask patterns M3 may be formed on the trap insulating layer 340. The mask patterns M3 may include a PR pattern or a hard mask having a silicon nitride layer or a stack structure of a silicon oxide layer and a silicon nitride layer. A hard mask and an anti-reflection layer (ARL) may be further formed on the trap insulating layer 340 and the mask patterns M3.

Figure 17B:
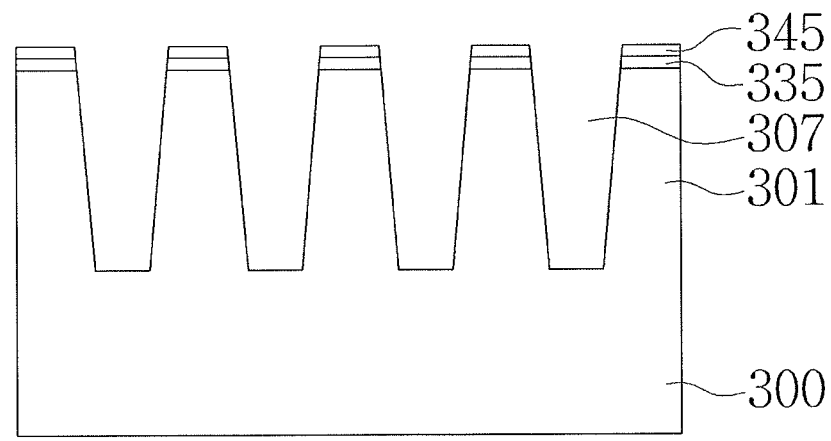

Referring to FIG. 17B, the method of fabricating a semiconductor device according to the twenty-fifth exemplary embodiment may include forming isolation trenches 305 defining active regions 301 within the substrate 300 using the mask patterns M3 as an etch mask. During the formation of the isolation trenches 305, the tunneling insulating layer 330 and the trap insulating layer 340 may be formed into patterned tunneling insulating layers 335 and patterned trap insulating layers 345, respectively. Subsequently, the mask patterns M3 may be removed.

Figure 17C:
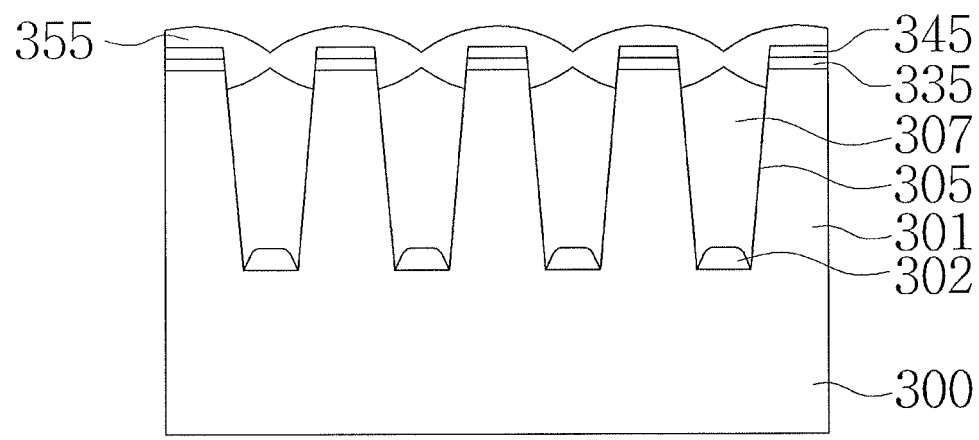

Referring to FIG. 17C, the method of fabricating a semiconductor device according to the twenty-fifth exemplary embodiment may include forming a blocking insulating layer 355. The blocking insulating layer 355 may laterally extend from top surfaces of tunnel insulating layer 335 and/or the trap insulating layer 345 into upper portions of the isolation trenches 305. Air gaps 307 may be defined by the blocking insulating layer 355 within the isolation trenches 305. The blocking insulating layer 355 may be formed to a relatively great thickness in corners of the tunneling insulating layer 335 or the trap insulating layer 345. Accordingly, the blocking insulating layer 355 may cover lateral surfaces of the tunneling insulating layer 335 and the trap insulating layer 345. The blocking insulating layer 355 may be formed also on sidewalls of the active regions 301, that is, on inner walls of the isolation trenches 305.

Bottom insulating materials 302 may be formed on bottom of the isolation trenches 305. The bottom insulating materials 302 may be a portion of, e.g., be formed of a same material as, the blocking insulating layer 355. Afterwards, referring back to FIG. 3A, the method according may include forming a gate electrode 360 and a gate capping layer 370 on the blocking insulating layer 355.

Figure 18A:
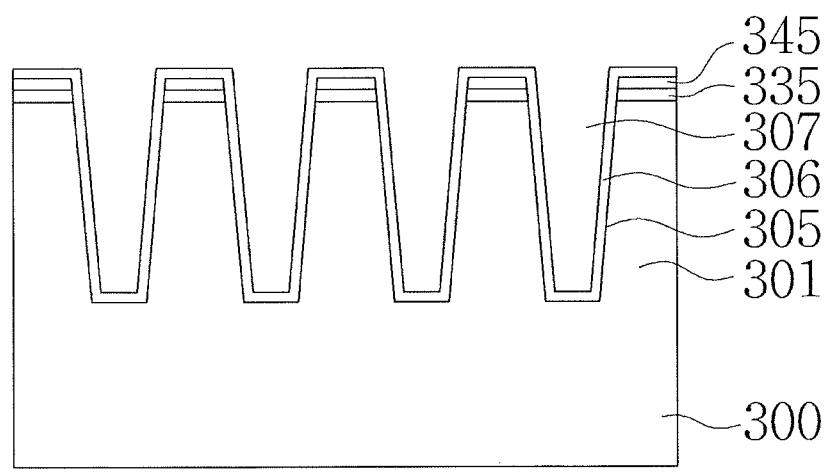

Referring to FIG. 18A, a method of fabricating a semiconductor device according to a twenty-sixth exemplary embodiment may include conformally forming a lining insulating layer 306 on inner walls of isolation trenches 305 after the processes described with reference to FIG. 17B. The lining insulating layer 306 may be formed also on a top surface of a trap insulating layer 345.

Figure 18B:
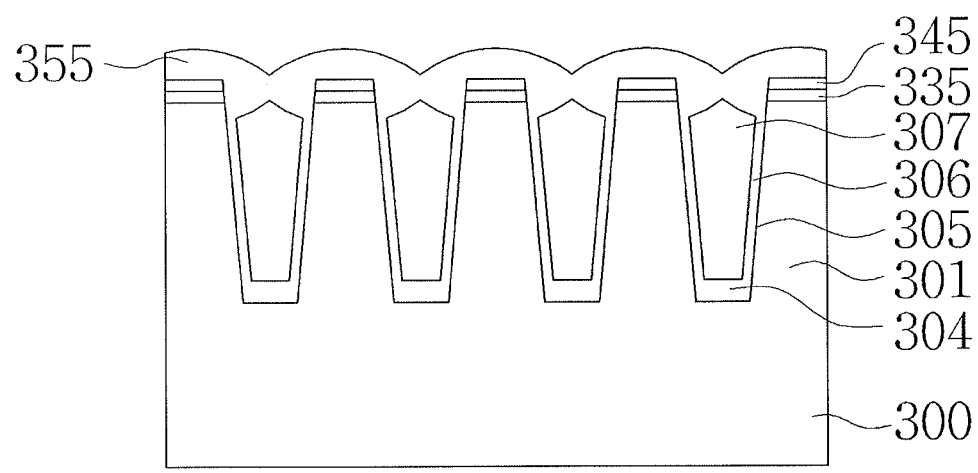

Referring to FIG. 18B, the method of fabricating a semiconductor device according to the twenty-sixth exemplary embodiment may include forming a blocking insulating layer 355. Further bottom insulating materials 304 may be formed in the isolation trenches 305. The bottom insulating materials 304 may have a greater thickness than the lining insulating layer 306. Air gaps 307 may be defined by the blocking insulating layer 355 within isolation trenches 305. Afterwards, referring back to FIG. 3B, the method may include forming a gate electrode 360 and a gate capping layer 370 on the blocking insulating layer 355.

Figure 19:
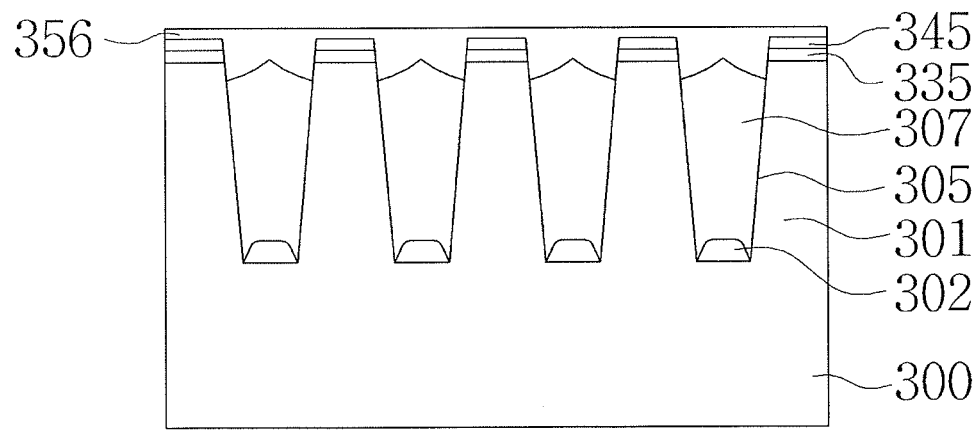

Referring to FIG. 19, a method of fabricating a twenty-seventh exemplary embodiment may include forming a blocking insulating layer 356 having a planarized top surface using a planarization process after the processes described with reference to FIG. 17C are performed. During the planarization process, a portion of the blocking insulating layer 356 may remain on the active regions 301. Afterwards, referring to FIG. 3C, the method according may include forming a gate electrode 360 and a gate capping layer 370 on the blocking insulating layer 356 having the planarized top surface.

Figure 20:
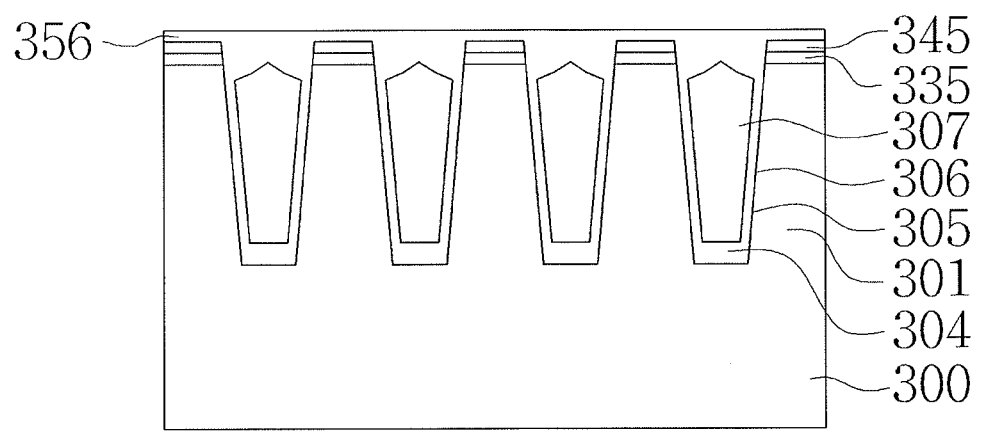

Referring to FIG. 20, a method of fabricating a semiconductor device according to a twenty-eighth exemplary embodiment may including a blocking insulating layer 356 having a planarized top surface using a planarization process after the processes described with reference to FIG. 18B. Afterwards, referring back to FIG. 3D, the method according to the twenty-eighth embodiment may include forming a gate electrode 360 and a gate capping layer 370 on the blocking insulating layer 356 having the planarized top surface.

Figure 21A:
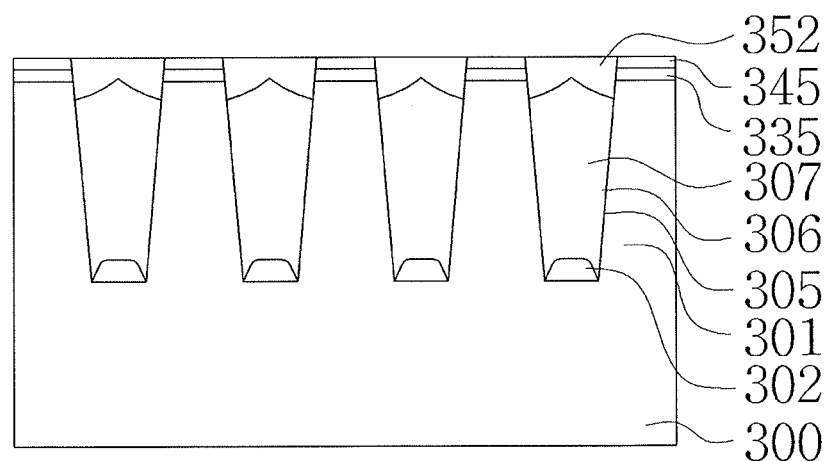

Referring to FIG. 21A, a method of fabricating a semiconductor device according to a twenty-ninth exemplary embodiment may include forming a leading insulating layer 352 defining air gaps 307 by performing a planarization process until a surface of a trap insulating layer 345 is exposed, after the processes described with reference to FIG. 17C are performed.

Figure 21B:
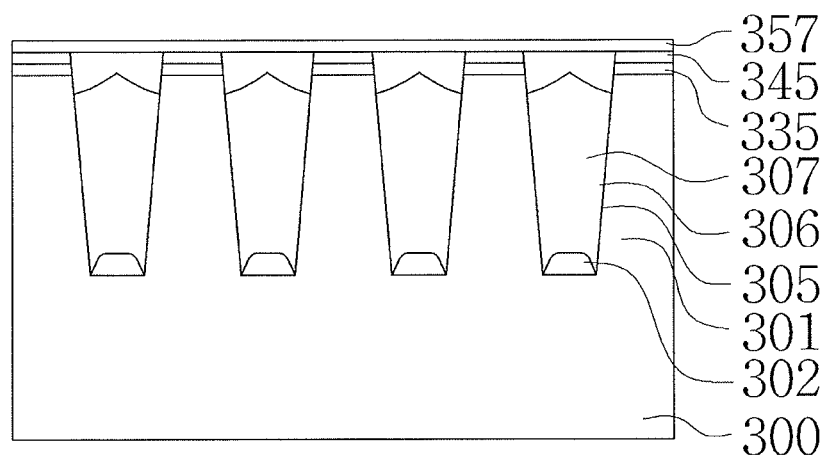

Referring to FIG. 21B, the method of fabricating a semiconductor device according to the twenty-ninth exemplary embodiment may include forming a blocking insulating layer 357 on the trap insulating layer 345 and the leading insulating layer 352. Afterwards, referring back to FIG. 3E, the method may include forming a gate electrode 360 and a gate capping layer 370 on the blocking insulating layer 357.

Figure 22A:
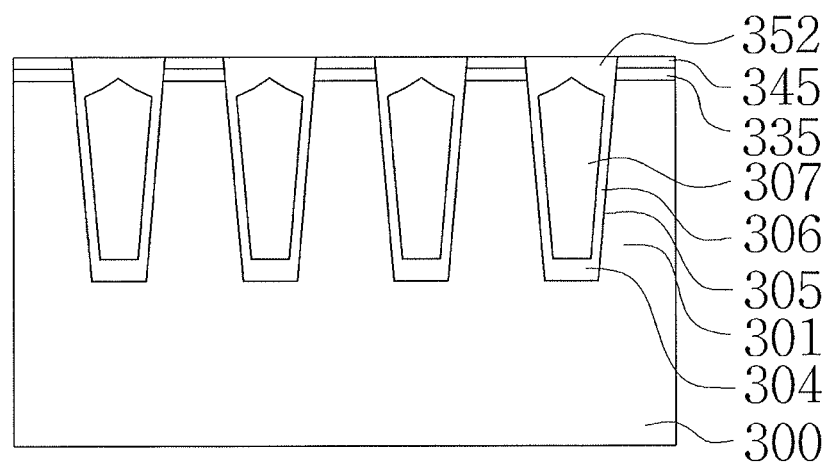

Referring to FIG. 22A, a method of fabricating a semiconductor device according to a thirtieth exemplary embodiment may include forming a leading insulating layer 352 defining air gaps 307 by performing a planarization process until a surface of a trap insulating layer 345 is exposed.

Figure 22B:
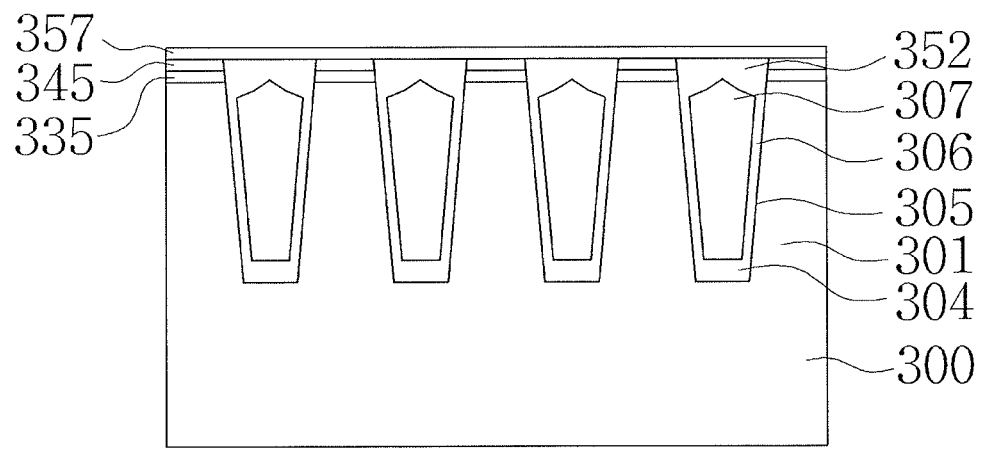

Referring to FIG. 22B, the method according to the thirtieth embodiment may include forming a blocking insulating layer 357 on the trap insulating layer 345 and the leading insulating layer 352. Subsequently, referring back to FIG. 3F, the method may include forming a gate electrode 360 and a gate capping layer 370 on the blocking insulating layer 357.

Figure 23A:
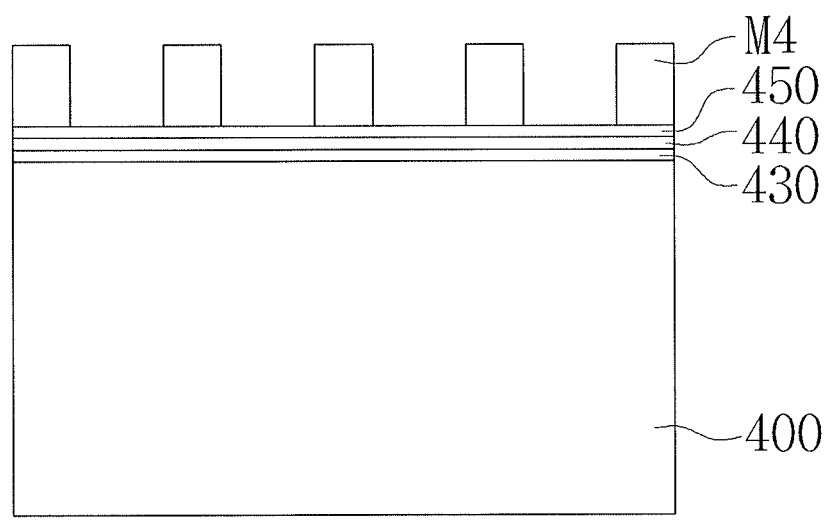

Referring to FIG. 23A, a method of fabricating a semiconductor device according to a thirty-first exemplary embodiment may include forming a tunneling insulating layer 430, a trap insulating layer 440, and a blocking insulating layer 450 on a substrate 400 required for fabricating a semiconductor device.

The tunneling insulating layer 430 may be, for example, a silicon oxide layer obtained by thermally oxidizing a surface of the substrate 400. In applied embodiments, the tunneling insulating layer 430 may be formed of a metal oxide. In applied embodiments, the tunneling insulating layer 430 may be formed using a CVD process or an ALD process.

The trap insulating layer 440 may be formed of at least one of a silicon nitride layer, a silicon oxynitride layer, a Si-rich nitride layer, a nanocrystalline silicon layer, and a laminated trap layer using a CVD process or an ALD process.

The blocking insulating layer 450 may be formed of a metal oxide.

Mask patterns M4 may be formed on the blocking insulating layer 450. Each of the mask patterns M4 may include a PR pattern or a hard mask having a silicon nitride layer or a stack structure of a silicon oxide layer and a silicon nitride layer. A hard mask and an anti-reflection layer (ARL) may be further formed on the blocking insulating layer 450 and the mask patterns M3.

Figure 23B:
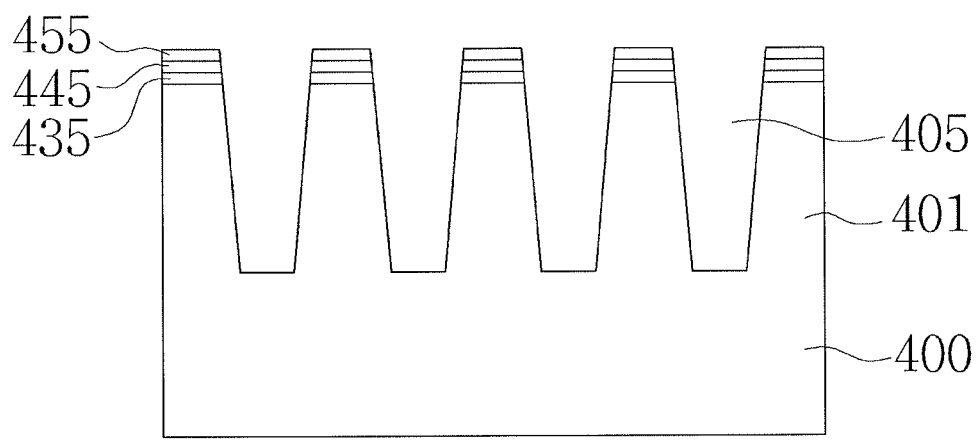

Referring to FIG. 23B, the method according to the thirty-first embodiment may include forming isolation trenches 405 defining active regions 401 within the substrate 400 using the mask patterns M4 as an etch mask. During the formation of the isolation trenches 405, the tunneling insulating layer 430, the trap insulating layer 440, and the blocking insulating layer 450 may be formed into patterned tunneling insulating layers 335, patterned trap insulating layers 445, and patterned blocking insulating layers 455, respectively. Subsequently, the mask patterns M4 may be removed.

Figure 23C:
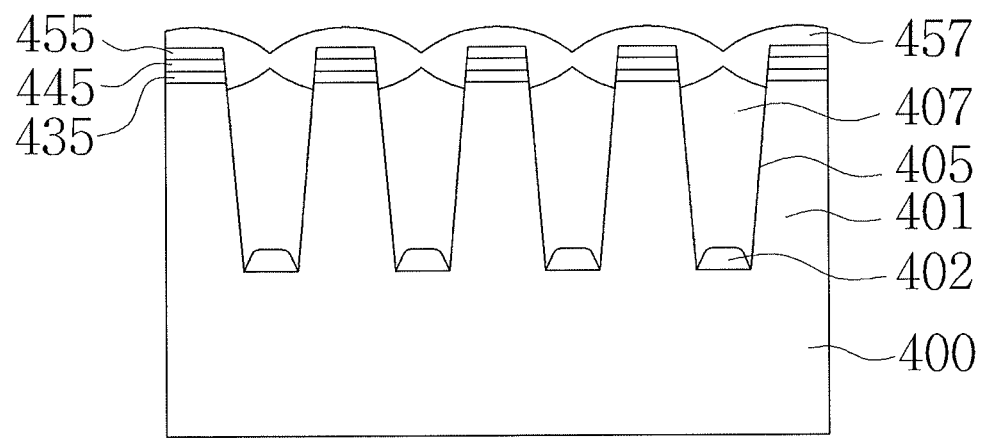

Referring to FIG. 23C, the method according to the thirty-first embodiment may include forming a buffer insulating layer 457. The buffer insulating layer 457 may be formed using an anisotropic deposition process. The buffer insulating layer 457 may include a silicon oxide, a silicon nitride, a silicon oxynitride, or a metal oxide. Bottom insulating materials 402 may be formed on bottom of the isolation trenches

405. Subsequently, referring to FIG. 4A, the method may include forming a gate electrode 460 and a gate capping layer 470 on the buffer insulating layer 457.

Figure 24A:
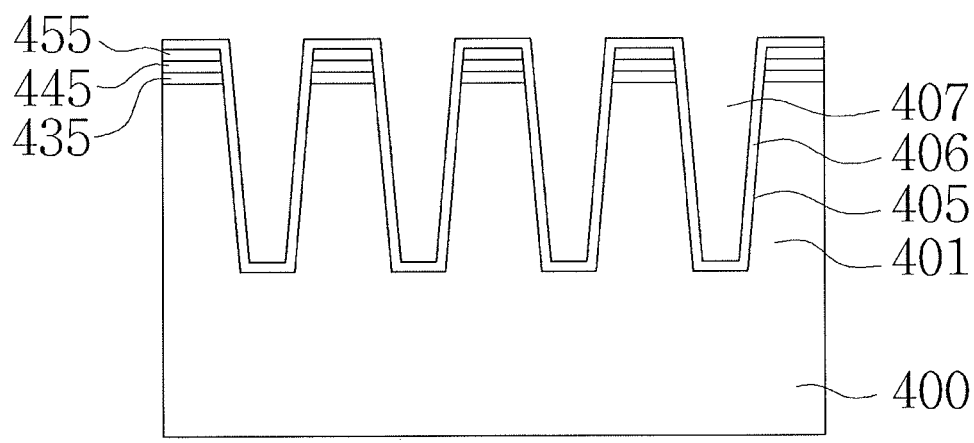

Referring to FIG. 24A, a method of fabricating a semiconductor device according to a thirty-second exemplary embodiment may include conformally forming a lining insulating layer 406 on inner walls of isolation trenches 405 after the processes described with reference to FIG. 23B. The lining insulating layer 406 may cover sidewalls and bottom of the isolation trenches 405, lateral surfaces of tunneling insulating layers 435, lateral surfaces of trap insulating layers 445, and lateral and top surfaces of blocking insulating layers 455.

Figure 24B:
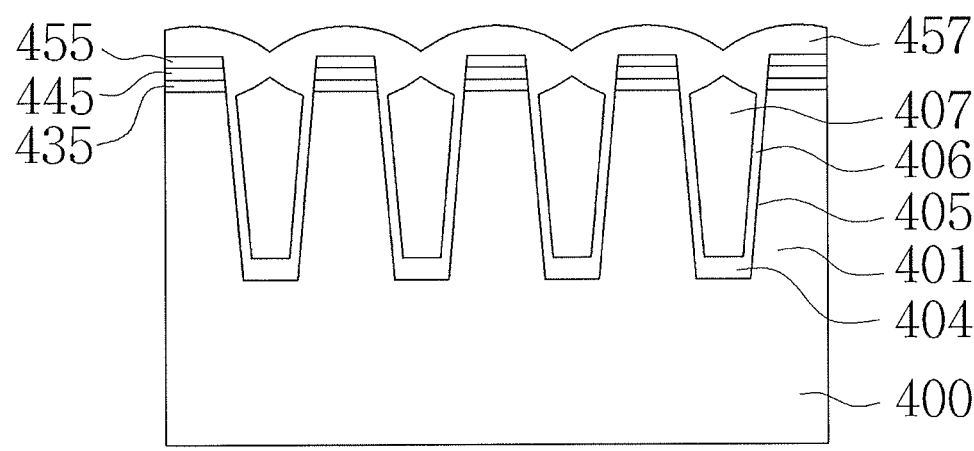

Referring to FIG. 24B, the method according to the thirty-second embodiment may include forming a buffer insulating layer 457. Air gaps 407 may be defined by the buffer insulating layer 457 within the isolation trenches 405. Subsequently, referring back to FIG. 4B, the method according to the thirty-second embodiment may include forming a gate electrode 460 and a gate capping layer 470 on the buffer insulating layer 457.

Figure 25:
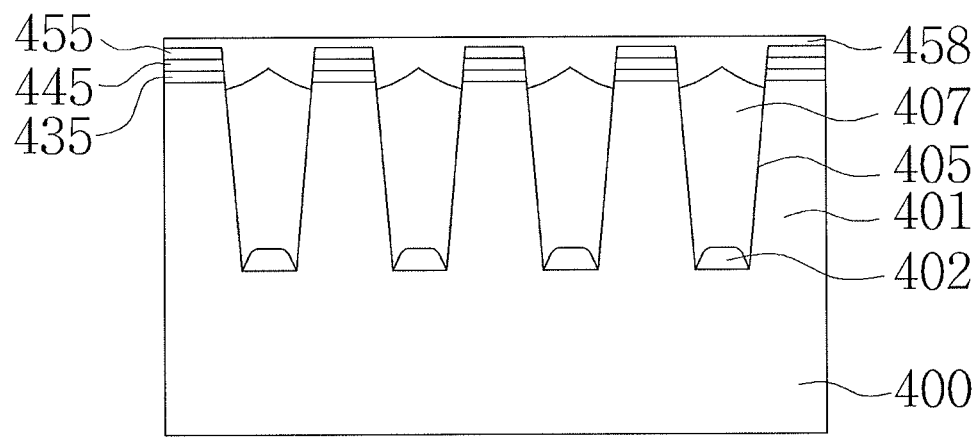

Referring to FIG. 25, a method of fabricating a semiconductor device according to a thirty-third exemplary embodiment may include forming a buffer insulating layer 458 having a planarized top surface using a planarization process after the processes described with reference to FIG. 23C. Subsequently, referring back to FIG. 4C, the method according to the thirty-third embodiment may include forming a gate electrode 460 and a gate capping layer 470 on the buffer insulating layer 458 having the planarized top surface.

Figure 26:
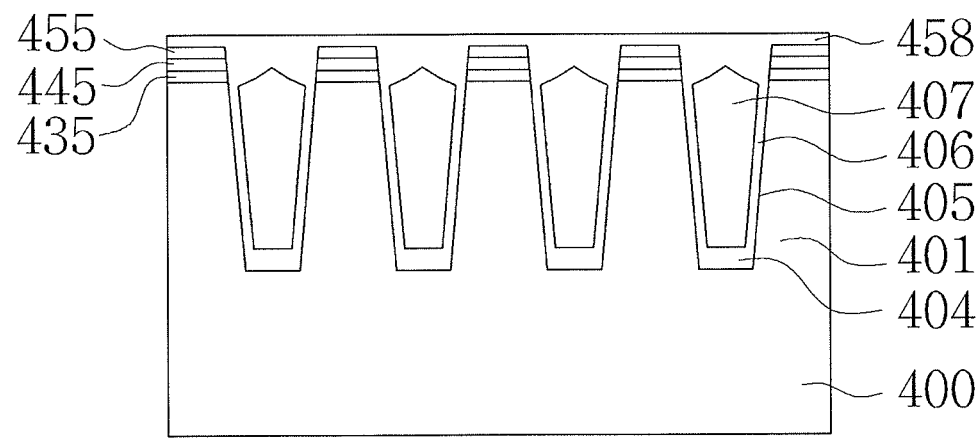

Referring to FIG. 26, a method of fabricating a semiconductor device according to a thirty-fourth exemplary embodiment may include forming a buffer insulating layer 458 having a planarized top surface using a planarization process after the processes described with reference to FIG. 24B. Subsequently, referring back to FIG. 4D, the method may include forming a gate electrode 460 and a gate capping layer 470 on the buffer insulating layer 458 having the planarized top surface.

Figure 27:
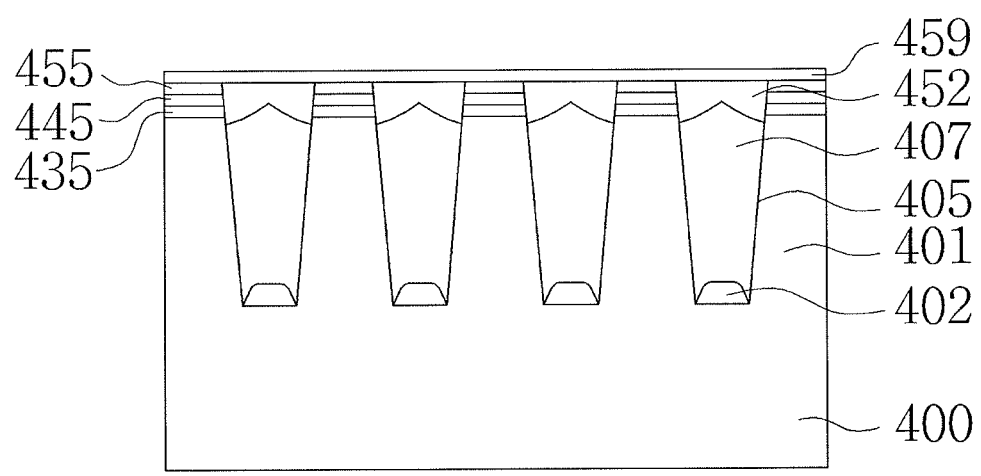

Referring to FIG. 27, a method of fabricating a semiconductor device according to a thirty-fifth exemplary embodiment may include forming a leading insulating layer 452 using a planarization process to expose a top surface of the blocking insulating layer 455 and define air gaps 407 after the processes described with reference to FIG. 23B. The method may also include forming a buffer insulating layer 459 on a leading insulating layer 452 after the processes described with reference to FIG. 23B. Afterwards, referring back to FIG. 4E, the method may include forming a gate electrode 460 and a gate capping layer 470 on the buffer insulating layer 459.

Figure 28:
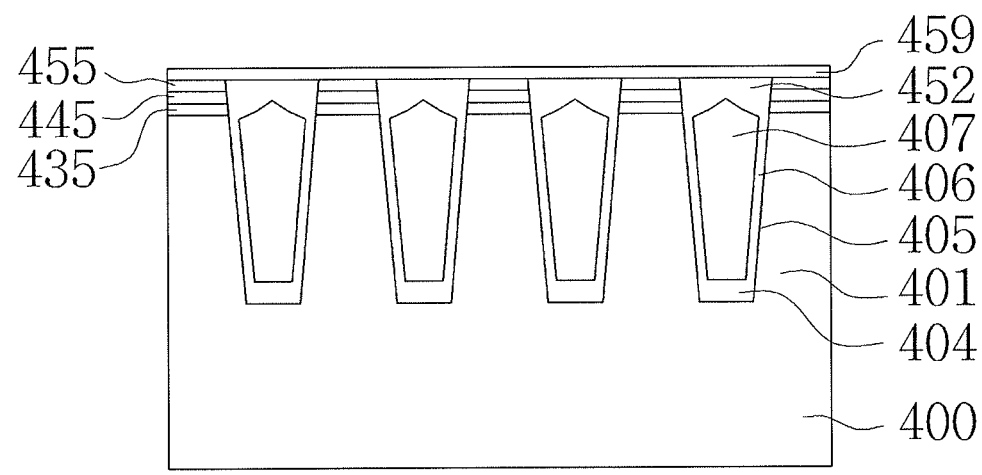

Referring to FIG. 28, a method of fabricating a semiconductor device according to a thirty-sixth exemplary embodiment may include forming a leading insulating layer 452 using a planarization process to expose a top surface of a blocking insulating layer 455 and define air gaps 407 and forming a buffer insulating layer 459 on the leading insulating layer 452 after the processes described with reference to FIG. 24B. Subsequently, referring back to FIG. 4F, the method may include forming a gate electrode 460 and a gate capping layer 470 on the buffer insulating layer 459.

Figure 29:
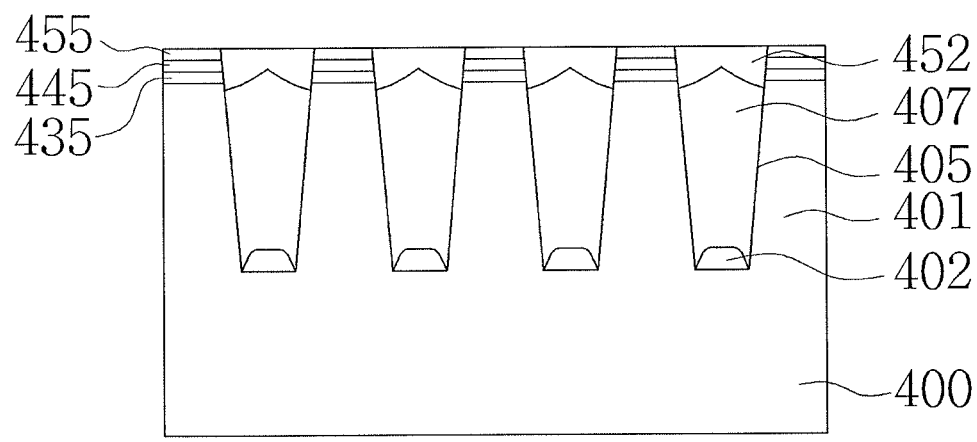

Referring to FIG. 29, a method of fabricating a semiconductor device according to a thirty-seventh exemplary embodiment may include forming a leading insulating layer 452 using a planarization process to expose a top surface of a blocking insulating layer 455 and define air gaps 407 and forming a buffer insulating layer 459 on the leading insulating layer 452 and the blocking insulating layer 455 after the processes described with reference to FIG. 23C. Subsequently, referring back to FIG. 4G, the method may include forming a gate electrode 460 and a gate capping layer 470 on the leading insulating layer 452 and the blocking insulating layer 455.

Figure 30:
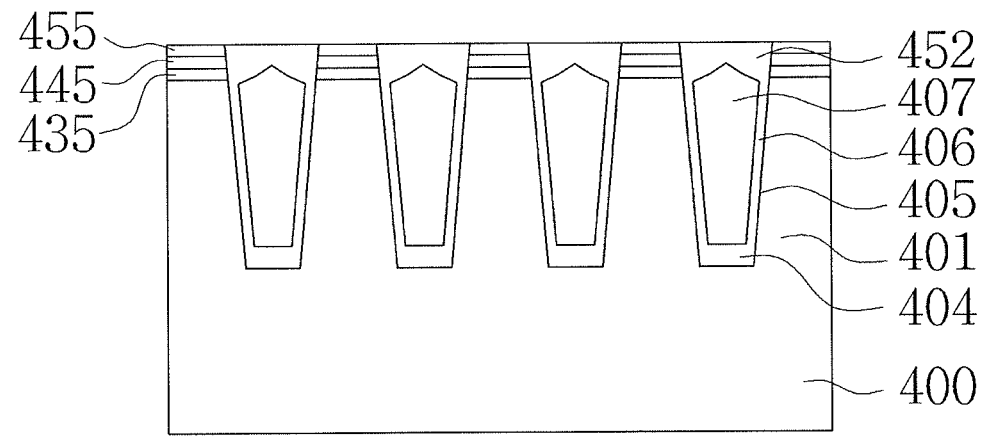

Referring to FIG. 30, a method of fabricating a semiconductor device according to a thirty-eighth exemplary embodiment may include forming a leading insulating layer 452 using a planarization process to expose a top surface of a blocking insulating layer 455 and define air gaps 407 and forming a buffer insulating layer 459 on the leading insulating layer 452 and the blocking insulating layer 455 after the processes described with reference to FIG. 24B. Subsequently, referring back to FIG. 4H, the method may include forming a gate electrode 460 and a gate capping layer 470 on the leading insulating layer 452 and the blocking insulating layer 455.

Figure 31A:
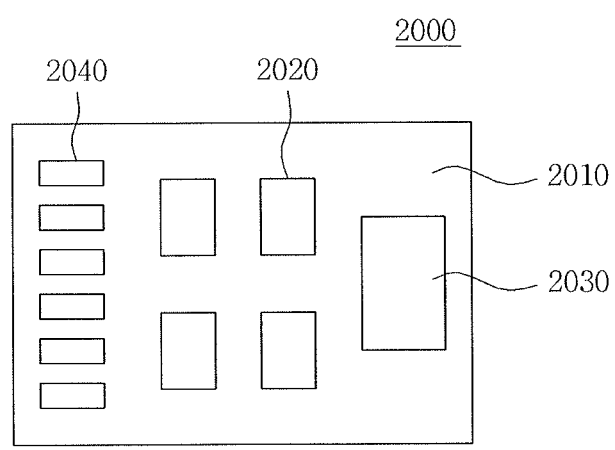
FIG. 31A illustrates a block diagram of a semiconductor module according to applied exemplary embodiments.

FIG. 31A illustrates a block diagram of a semiconductor module according to an applied exemplary embodiment. The semiconductor module may include semiconductor devices according to one or more exemplary embodiments.

Referring to FIG. 31A, a semiconductor module 2000 according to an exemplary embodiment may include a control unit 2020, a storage unit 2030, and an input/output (I/O) unit 2040 disposed on a module substrate 2010. The module substrate 2010 may be, e.g., a printed circuit board (PCB). The control unit 2020 may include, e.g., a logic device, such as a controller. The storage unit 2030 may include, e.g., a memory device, such as a dynamic random access memory (DRAM), a magnetic random access memory (MRAM), or a NAND flash memory. Each of the I/O units 2040 may include, e.g., a conductive terminal. Any one of the control unit 2020 and the storage unit 2030 may include semiconductor devices or fabricated semiconductor devices according to various exemplary embodiments. The semiconductor module 2000 may be a memory card, such as a solid-state disk (SSD).

Figure 31B:
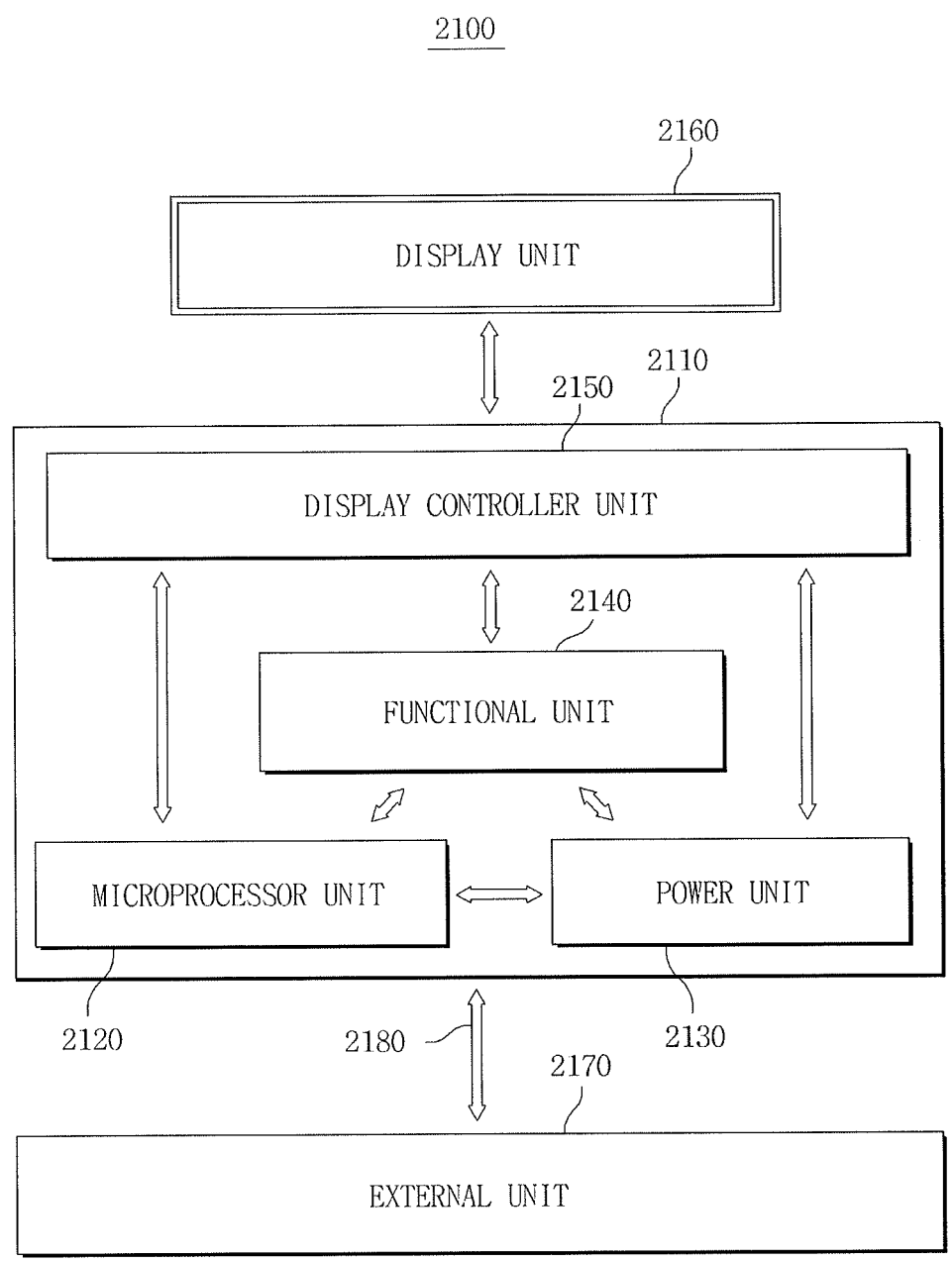
FIG. 31B illustrates a block diagram of an electronic system according to applied exemplary embodiments.

FIG. 31B illustrates a block diagram of an electronic system according to an applied exemplary embodiment. The electronic system may include semiconductor devices according to one or more exemplary embodiments.

Referring to FIG. 31B, various stacked packages according to exemplary embodiments may be applied to an electronic system 2100. The electronic system 2100 may include a body 2110, a microprocessor (MP) unit 2120, a power unit 2130, a functional unit 2140, and/or a display controller unit 2150. The body 2110 may be a system board or mother board having a PCB. The MP unit 2120, the power unit 2130, the functional unit 2140, and the display controller unit 2150 may be installed or mounted on the body 2110. A display unit 2160 may be disposed on a top surface of the body 2110 or outside the body 2110. For example, the display unit 2160 may be disposed on a surface of the body 2110 and display an image processed by the display controller unit 2150.

The power unit 2130 may receive a predetermined voltage from an external power source, divide the predetermined voltage into voltages having various voltage levels, and transmit the divided voltages to the MP unit 2120, the functional unit 2140, and the display controller unit 2150. The MP unit 2120 may receive a voltage from the power unit 2130 and control the functional unit 2140 and the display unit 2160. For instance, when the electronic system 2100 is a mobile electronic product, such as a portable phone, the functional unit 2140 may include several components capable of wireless communication functions, such as the output of an image to the display unit 2160 or the output of voices to a speaker, by dialing or communication with an external unit 2170. When the functional unit 2140 includes a camera, the functional unit 2140 may serve as an image processor.

In other exemplary embodiments, when the electronic system 2100 is connected to a memory card to increase the capacity of the electronic system 2100, the functional unit 2140 may be a memory card controller. The functional unit 2140 may transmit and receive signals to and from the external unit 2170 through a wired or wireless communication unit 2180. In addition, when the electronic system 2100 needs a universal serial bus (USB) to expand functions thereof, the functional unit 2140 may serve as an interface controller.

At least one of the MP unit 2120 and the functional unit 2140 may include semiconductor devices or fabricated semiconductor devices according to various embodiments.

Semiconductor devices according to various embodiments may have air gaps having a low dielectric constant. Thus, electrical interference, such as a parasitic capacitance, leakage of charges, and/or coupling, between conductors and active regions may be reduced. The semiconductor devices may reduce power consumption and/or may have an improved data retention characteristic. The semiconductor devices may have excellent and stable performance and long lifespans.

Fabrication methods according to various exemplary embodiments may provide various methods of fabricating high performance semiconductor devices in stable and simple manners. In addition, various semiconductor devices, fabrication methods, and/or electronic systems may expect various other unmentioned effects.

By way of summation and review, in view of the shrinkage of semiconductor devices, the influence of a resistance R of a conductor and a capacitance C of an insulator on the performance of semiconductor devices has increased. For example, as the capacitance C of the insulator increases, insertion loss, a current leakage, and/or power consumption may also increase, and an operating speed may decrease. In this regard, a dielectric constant of an insulating material may be lowered.

Further, in flash memory devices, reducing capacitances between charge regions, such as floating gates, charge trap layers, and/or active regions, may be desirable. An insulating material having the lowest dielectric constant is known as a vacuum or air. A material having the lowest dielectric constant out of insulating materials used for semiconductor devices is generally referred to as a silicon oxide. The silicon oxide may have a dielectric constant of about 2.2 or more. However, since the air has a dielectric constant of about 1.1 or lower, the air may be regarded as an optimum insulating material for reducing a capacitance between conductive regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    tunneling insulating layers on upper surfaces of active regions of a substrate;
    floating gate electrodes on the tunneling insulating layers;
    an isolation trench having an air gap in the substrate, the isolation trench defining the active regions, spacing the tunneling insulating layers, and isolating the floating gate electrodes;
    a lower insulating layer on the floating gate electrodes, the lower insulating layer being configured to hermetically seal a top portion of the isolation trench to define the air gap in the isolation trench; and
    a middle insulating layer, an upper insulating layer, and a control gate electrode stacked on the lower insulating layer.

2. The device as claimed in claim 1, wherein the lower insulating layer includes a silicon oxide, the middle insulating layer includes a silicon nitride, and the upper insulating layer includes a metal oxide.

3. The device as claimed in claim 1, wherein a dielectric constant of the middle insulating layer is greater than a dielectric constant of the lower insulating layer, and an energy bandgap of the upper insulating layer is greater than an energy bandgap of the middle insulating layer.

4. The device as claimed in claim 1, wherein the lower insulating layer has a first top surface at a first level in a position vertically aligned with the active region and a second top surface at a second level in a position vertically aligned with the isolation trench, the first level being higher than the second level.

5. The device as claimed in claim 4, wherein the first top surface of the lower insulating layer is rounded.

6. The device as claimed in claim 5, wherein top surfaces of the middle insulating layer and the upper insulating layer are rounded in accordance with the top surface of the lower insulating layer.

7. The device as claimed in claim 4, wherein the second top surface of the lower insulating layer includes a dent.

8. The device as claimed in claim 4, wherein the lower insulating layer has a shape symmetrical to the second top surface in the position vertically aligned with the isolation trench.

9. The device as claimed in claim 1, wherein the lower insulating layer is on a lateral surface of the active region.

10. The device as claimed in claim 1, further comprising a bottom insulating material on the bottom of the isolation trench, the bottom insulating material having a protruding shape.

11. The device as claimed in claim 10, further comprising a lining insulating layer on sidewalls of the active regions in the isolation trench.

12. The device as claimed in claim 11, wherein vertical thickness of the bottom insulating material is thicker than horizontal thickness of the lining insulating layer.

13. The device as claimed in claim 1, wherein the tunneling insulating layer does not cover a lateral surface of the floating gate electrode.

14. The device as claimed in claim 13, wherein the lower insulating layer is partially formed on an upper portion of the lateral surface of the floating gate electrode.

15. A semiconductor device, comprising:
    tunneling insulating layers on upper surfaces of active regions of a substrate;
    floating gate electrodes on the tunneling insulating layers;
    an isolation trench formed in the substrate to define the active regions, space the tunneling insulating layers, and isolate the floating gate electrodes, the isolation trench having an air gap disposed therein;

a first insulating layer on lateral surfaces of the floating gate electrodes, the first insulating layer hermetically sealing a top portion of the isolation trench to define the air gap; and a second insulating layer, a third insulating layer, and a control gate electrode stacked on the floating gate electrodes and the first insulating layer.

16. The device as claimed in claim 15, wherein the first insulating layer has a first thickness in a position adjacent to a sidewall of the isolation trench and has a second thickness in a position vertically aligned with a center of the isolation trench, the first thickness being greater than the second thickness.

17. A semiconductor device, comprising:
tunneling insulating layers on active regions of a substrate;
floating gate electrodes on the tunneling insulating layers;
an isolation trench within the substrate, the isolation trench defining the active regions;
a lower insulating layer on the floating gate electrodes, at least a portion of the lower insulating layer being within the isolation trench and the portion of the lower insulating layer having varying thicknesses within the isolation trench, and the lower insulating layer being configured to hermetically seal the isolation trench to define an air gap under the lower insulating layer within the isolation trench; and
a middle insulating layer, an upper insulating layer, a control gate electrode, and a gate capping layer stacked on the lower insulating layer.

18. The device as claimed in claim 17, wherein a first thickness of the portion of the lower insulating layer adjacent to sidewalls of the isolation trench is greater than a second thickness of the portion of the lower insulating layer near a center of the isolation trench.

19. The device as claimed in claim 18, wherein the lower insulating layer is adjacent to opposing lateral sides of the floating gate electrodes.

20. The device as claimed in claim 19, further comprising a bottom insulating material on the bottom of the isolation trench, the air gap being directly between the bottom insulating material and the lower insulating layer.

* * * * *